(12) United States Patent
Lee et al.

(10) Patent No.: US 12,069,937 B2
(45) Date of Patent: Aug. 20, 2024

(54) METHOD OF PURIFYING LIGHT-EMITTING DEVICE MATERIAL AND LIGHT-EMITTING DEVICE INCLUDING LIGHT-EMITTING DEVICE MATERIAL

(71) Applicant: Samsung Display Co., Ltd., Yongin-si (KR)

(72) Inventors: Eunyoung Lee, Yongin-si (KR); Hyunjung Lee, Yongin-si (KR); Soobyung Ko, Yongin-si (KR); Haejin Kim, Yongin-si (KR); Eunsoo Ahn, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 798 days.

(21) Appl. No.: 17/144,208

(22) Filed: Jan. 8, 2021

(65) Prior Publication Data
US 2022/0013727 A1   Jan. 13, 2022

(30) Foreign Application Priority Data

Jul. 10, 2020 (KR) .................. 10-2020-0085678

(51) Int. Cl.
*H10K 71/30* (2023.01)
*H10K 71/00* (2023.01)
(Continued)

(52) U.S. Cl.
CPC ......... *H10K 71/311* (2023.02); *H10K 85/324* (2023.02); *H10K 85/342* (2023.02); *H10K 85/346* (2023.02); *H10K 85/348* (2023.02); *H10K 85/351* (2023.02); *H10K 85/40* (2023.02); *H10K 85/622* (2023.02); *H10K 85/624* (2023.02); *H10K 85/633* (2023.02); *H10K 85/654* (2023.02); *H10K 85/6572* (2023.02); *H10K 85/6574* (2023.02); *H10K 50/15* (2023.02); *H10K 50/16* (2023.02);
(Continued)

(58) Field of Classification Search
CPC .......................... C07F 15/0033; H10K 71/311
See application file for complete search history.

(56) References Cited

U.S. PATENT DOCUMENTS

| 7,534,505 | B2 * | 5/2009 | Lin ........................ C09K 11/06 |
| | | | 313/506 |
| 8,383,249 | B2 * | 2/2013 | Walters ................. C07F 15/002 |
| | | | 428/917 |

(Continued)

FOREIGN PATENT DOCUMENTS

| JP | 4542607 B2 | 9/2010 |
| JP | 5647737 B2 | 11/2014 |

(Continued)

OTHER PUBLICATIONS

Gibrard et al, Silver(I)Oxide, Synlett, 25, 2375-2376, 2014. (Year: 2014).*

(Continued)

*Primary Examiner* — Amanda C. Walke
(74) *Attorney, Agent, or Firm* — CANTOR COLBURN LLP

(57) ABSTRACT

Provided is a method of purifying a phosphorescent dopant, the method including reacting the phosphorescent dopant with $Ag_2O$.

20 Claims, 3 Drawing Sheets

(51) Int. Cl.
  *H10K 85/30* (2023.01)
  *H10K 85/40* (2023.01)
  *H10K 85/60* (2023.01)
  *H10K 50/15* (2023.01)
  *H10K 50/16* (2023.01)
  *H10K 50/18* (2023.01)
  *H10K 50/818* (2023.01)

(52) U.S. Cl.
  CPC ........... *H10K 50/18* (2023.02); *H10K 50/818* (2023.02); *H10K 71/00* (2023.02)

(56) References Cited

U.S. PATENT DOCUMENTS

| | | | |
|---|---|---|---|
| 8,436,172 B2 | 5/2013 | Watanabe et al. | |
| 8,895,154 B2 | 11/2014 | Iwakuma et al. | |
| 9,108,996 B2* | 8/2015 | Plenio | C07C 211/54 |
| 9,159,936 B2 | 10/2015 | Zhou et al. | |
| 9,862,739 B2* | 1/2018 | Metz | H10K 85/342 |
| 10,056,567 B2* | 8/2018 | Li | H10K 85/346 |
| 10,121,969 B2 | 11/2018 | Yamazaki et al. | |
| 2005/0260448 A1* | 11/2005 | Lin | H05B 33/14 |
| | | | 428/917 |
| 2012/0228583 A1* | 9/2012 | Wu | C07F 15/0033 |
| | | | 546/4 |
| 2014/0151662 A1* | 6/2014 | Inoue | H10K 85/342 |
| | | | 548/103 |
| 2018/0083206 A1* | 3/2018 | Kurihara | H10K 85/654 |
| 2019/0036044 A1* | 1/2019 | Jeon | C07F 15/0086 |
| 2020/0317706 A1* | 10/2020 | Nagayama | H10K 50/00 |

FOREIGN PATENT DOCUMENTS

| | | | | |
|---|---|---|---|---|
| KR | 101120393 B1 | | 5/2012 | |
| KR | 2018035156 A | * | 4/2018 | .......... C07F 15/0033 |
| WO | WO-2005113704 A2 | * | 12/2005 | .......... C07F 15/0033 |
| WO | WO-2011021385 A1 | * | 2/2011 | .......... C07F 15/0033 |
| WO | WO-2013042626 A1 | * | 3/2013 | .......... C07F 15/0033 |

OTHER PUBLICATIONS

Khum Gurung, et al., Separation and Purification Technology 215 (2019) 317-328.

* cited by examiner

METHOD OF PURIFYING LIGHT-EMITTING DEVICE MATERIAL AND LIGHT-EMITTING DEVICE INCLUDING LIGHT-EMITTING DEVICE MATERIAL

CROSS-REFERENCE TO RELATED APPLICATION

This application claims priority under 35 U.S.C. § 119 to Korean Patent Application No. 10-2020-0085678, filed on Jul. 10, 2020, in the Korean Intellectual Property Office, the content of which is incorporated by reference herein in its entirety.

BACKGROUND

1. Field

One or more embodiments relate to a method of purifying a light-emitting device material and a light-emitting device including the light-emitting device material purified according to the method.

2. Description of Related Art

Light-emitting devices are self-emission devices that, as compared with conventional devices, have wide viewing angles, high contrast ratios, short response times, and excellent characteristics in terms of brightness, driving voltage, and response speed.

Light-emitting devices may include a first electrode on a substrate, and a hole transport region, an emission layer, an electron transport region, and a second electrode sequentially stacked on the first electrode. Holes provided from the first electrode may move toward the emission layer through the hole transport region, and electrons provided from the second electrode may move toward the emission layer through the electron transport region. Carriers, such as holes and electrons, recombine in the emission layer to generate light.

Materials used in light-emitting devices are materials of high purity, and for example, a phosphorescent dopant used in an emission layer is used after the final product is purified by column chromatography separation and sublimation.

SUMMARY

One or more embodiments include a method of purifying a phosphorescent dopant, which significantly lowers a halide content in the phosphorescent dopant containing halides as impurities, and a light-emitting device including the phosphorescent dopant purified according to the method.

Additional aspects will be set forth in part in the description which follows and, in part, will be apparent from the description, or may be learned by practice of the presented embodiments of the disclosure.

According to one or more embodiments,

A method of purifying a phosphorescent dopant includes: reacting the phosphorescent dopant with $Ag_2O$.

According to an aspect of another embodiment, a light-emitting device may include the phosphorescent dopant purified according to the method.

According to an aspect of still another embodiment, an electronic apparatus may include the light-emitting device.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
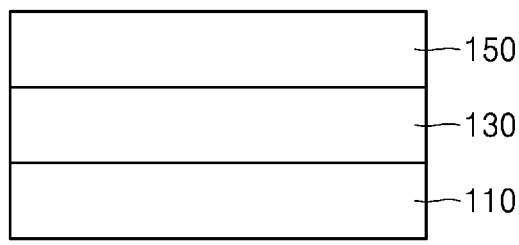
FIG. 1 is a schematic view of a light-emitting device according to an exemplary embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

It will be understood that when an element is referred to as being "on" another element, it can be directly on the other element or intervening elements may be present therebetween In contrast, when an element is referred to as being "directly on" another element, there are no intervening elements present It will be understood that, although the terms "first," "second," "third" etc. may be used herein to describe various elements, components, regions, layers and/or sections, these elements, components, regions, layers and/or sections should not be limited by these terms These terms are only used to distinguish one element, component, region, layer or section from another element, component, region, layer or section Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a," "an," "the," and "at least one" do not denote a limitation of quantity, and are intended to cover both the singular and plural, unless the context clearly indicates otherwise. For example, "an element" has the same meaning as "at least one element," unless the context clearly indicates otherwise.

"Or" means "and/or." As used herein, the term "and/or" includes any and all combinations of one or more of the associated listed items It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures It will be understood that relative terms are intended to encompass different orientations of the device in addition to the orientation depicted in the Figures For example, if the device in one of the figures is turned over, elements described as being on the "lower" side of other elements would then be oriented on "upper" sides of the other elements The exemplary term "lower," can therefore, encompasses both an orientation of "lower" and "upper," depending on the particular orientation of the figure Similarly, if the device in one of the figures is turned over, elements described as "below" or "beneath" other elements would then be oriented "above" the other elements The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments As such, variations from the shapes of the illustrations as a result, for example, of manufacturing techniques and/or tolerances, are to be expected Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features Moreover, sharp angles that are illustrated may be rounded Thus, the regions illustrated in the figures are schematic in nature and their shapes are not intended to illustrate the precise shape of a region and are not intended to limit the scope of the present claims.

Materials used in light-emitting devices are pure materials of high purity, and for example, a phosphorescent dopant used in an emission layer is used after the final product is purified by column chromatography, recrystallization, sublimation, or a combination thereof.

The finally synthesized product of a phosphorescent dopant, which underwent column chromatography purification, recrystallization, and/or sublimation, includes halide impurities of 40 parts per million (ppm) or greater in the phosphorescent dopant.

According to a method of preparing a phosphorescent dopant, the method may include reacting the phosphorescent dopant with $Ag_2O$.

In some embodiments, the method may include: the reacting of a phosphorescent dopant with $Ag_2O$; and separating the phosphorescent dopant through column chromatography, prior to the reacting. This process is separating the phosphorescent dopant, which is the final product synthesized from starting materials, using column chromatography. Column chromatography is a general purification method, and thus, the descriptions of column chromatography is omitted herein.

In some embodiments, the method may include: the reacting of a phosphorescent dopant with $Ag_2O$; and purifying the phosphorescent dopant by sublimation, after the reacting. The separating of the phosphorescent dopant by sublimation is a process of purification of the desired product, i.e., a phosphorescent dopant, by sublimation, after reacting the phosphorescent dopant separated by using column chromatography with $Ag_2O$. Purification by sublimation is a general purification method, and thus, the descriptions of purification by sublimation is omitted herein.

In some embodiments, the method of preparing a phosphorescent dopant according to one or more embodiments may include:
  purifying a phosphorescent dopant through column chromatography;
  reacting the separated phosphorescent dopant with $Ag_2O$; and
  purifying the phosphorescent dopant by sublimation.

In some embodiments, in the method of preparing the phosphorescent dopant, the phosphorescent dopant may be a compound including a transition metal and a ligand, and the ligand may be an organic ligand. In some embodiments, the ligand may be a monodentate ligand, a bidentate ligand, or a tetradentate ligand, but the ligand may not be an inorganic ligand. The inorganic ligand may be a ligand compound not including carbon, for example, halide or water.

In some embodiments, the transition metal in the phosphorescent dopant may be iridium (Ir), platinum (Pt), palladium (Pd), osmium (Os), titanium (Ti), gold (Au), hafnium (Hf), europium (Eu), terbium (Tb), rhodium (Rh), rhenium (Re), or thulium (Tm).

The phosphorescent dopant will be described in detail in the following description.

In some embodiments, in the method of preparing the phosphorescent dopant, the phosphorescent dopant to be purified may include halides as impurities of about 40 ppm or greater. The phosphorescent dopant, which is the final product synthesized from starting materials, may be subjected to purification and include halides as impurities of about 40 ppm or greater in the phosphorescent dopant. In some embodiments, the phosphorescent dopant may include halides as impurities in a range of about 40 ppm to about 400 ppm.

In some embodiments, the halides as impurities may be $F^-$, $Cl^-$, $Br^-$, and/or $I^-$. In some embodiments, the halides as impurities may be $F^-$, $Cl^-$, and/or $Br^-$.

In some embodiments, a halide remaining in the phosphorescent dopant as an impurity may be reduced to less than about 40 ppm, for example, less than 10 ppm, by the reacting of the phosphorescent dopant with $Ag_2O$.

In some embodiments, when the phosphorescent dopant including halides as impurities in a range of about 40 ppm to about 400 ppm is subjected to a method of purifying including:
  purifying a phosphorescent dopant by column chromatography;
  reacting the phosphorescent dopant purified by column chromatography with $Ag_2O$; and
  purifying the phosphorescent dopant by sublimation, by which the halide remaining in the phosphorescent dopant as an impurity may be reduced to less than about 40 ppm, for example, less than about 10 ppm.

In some embodiments, a halide remaining in the phosphorescent dopant as an impurity may be reduced to from about 1 part per billion (ppb) to about 10 ppm by the reacting of the phosphorescent dopant with $Ag_2O$.

In some embodiments, in the method of purifying the phosphorescent dopant, the reacting of a phosphorescent dopant with $Ag_2O$ is in the presence of a solvent.

In some embodiments, the solvent may include an alcohol. The alcohol may be alkanol. Examples of alcohols may include methanol, ethanol, propanol, butanol, hexanol, heptanol, octanol, propanediol, and glycerol (when isomers are present, isomers are also included).

In some embodiments, the solvent may further include an aromatic hydrocarbon derivative, ether, a halogenated alkane, or any combination thereof.

The aromatic hydrocarbon derivatives may be hydrocarbon compounds having aromaticity. Examples of the aromatic hydrocarbon derivatives include benzene, toluene, xylene, pentalene, naphthalene, azulene, indacene, acenaphthylene, phenalene, phenanthrene, anthracene, fluoranthene, triphenylene, pyrene, chrysene, pyrrole, thiophene, furan, indole, benzoindole, naphthoindole, isoindole, benzoisoindole, naphthoisoindole, benzosilole, benzothiophene, benzofuran, and carbazole.

The ether may be a compound in which alkyl groups are bound to both sides of an oxygen atom and include linear and cyclic forms. In some embodiments, the ether may be diethyl ether, tetrahydrofuran (THF), or a combination thereof.

The halogenated alkane may be a compound in which halogen atoms are bound to alkene. In some embodiments, the halogenated alkane may be dichloroethane (DCE).

In some embodiments, the solvent may include: a mixed solvent of an alcohol and an aromatic hydrocarbon derivative; a mixed solvent of an alcohol and ether; a mixed solvent of an alcohol and a halogenated alkane; or any combination thereof.

In some embodiments, the solvent may be a mixture of ethanol and dichloroethane, a mixture of ethanol and tetrahydrofuran, a mixture of ethanol and toluene, or any combination thereof.

In some embodiments, in the method of preparing the phosphorescent dopant, the reacting of a phosphorescent dopant with $Ag_2O$ may be performed at a temperature range of about 0° C. to about 90° C. In some embodiments, the reacting of the phosphorescent dopant with $Ag_2O$ may be performed at a temperature of about 10° C. to about 40° C.

When the reaction is performed at a temperature lower than 0° C., the reaction may barely occur or may occur too slowly, and when the reaction is performed at a temperature higher than 90° C., side reactions may occur.

In some embodiments, in the method of preparing the phosphorescent dopant, the reacting of a phosphorescent dopant with $Ag_2O$ may be performed for about 10 minutes to about 48 hours.

When the reaction is performed less than 10 minutes, the reaction may be too short to sufficiently reduce impurities, and when the reaction is performed longer than 48 hours, the amount of impurities to be reduced may barely change.

In some embodiments, in the method of preparing the phosphorescent dopant, the phosphorescent dopant may be prepared by using a transition metal compound including at least one halide ligand.

In general, a phosphorescent dopant, i.e., a metal complex, may include a transition metal and a ligand.

The ligand included in the phosphorescent dopant of the final compound may be designed and synthesized separately, and then, the synthesized ligand may be combined with the transition metal to synthesize the phosphorescent dopant of the final compound.

In the transition metal in the process (also called as 'metallation') of combining the synthesized ligand with the transition metal, a transition metal compound (e.g., Pt(COD)$Cl_2$) may already have another ligand bound thereto, and the transition metal compound may include at least one halide ligand. In some embodiments, Pt(COD)$Cl_2$ includes two $Cl^-$(s). Other ligands (e.g., cyclooctadiene (COD) or Cl) that already bound to the transition metal may be exchanged with the ligand synthesized by designing separately.

Accordingly, other ligands already bound to the transition metal must be separated from the transition metal and separated in the process of separating the phosphorescent dopant through column chromatography, but the other ligands may not be completely separated and remain as impurities in the phosphorescent dopant. In particular, remaining halide may be problematic.

All phosphorescent dopants prepared using a transition metal compound containing at least one halide ligand have a problem of such residual halide impurities.

The halide remaining with the phosphorescent dopant may be removed by reacting with $Ag_2O$.

In some embodiments, a molar ratio of a phosphorescent dopant to $Ag_2O$ may be in a range of about 1:9 to about 9:1 in the reacting of a phosphorescent dopant with $Ag_2O$. In some embodiments, a molar ratio of a phosphorescent dopant to $Ag_2O$ may be in a range of about 1:5 to about 5:1. In some embodiments, a molar ratio of a phosphorescent dopant to $Ag_2O$ may be in a range of about 1:2.5 to about 2.5:1. In some embodiments, a molar ratio of a phosphorescent dopant to $Ag_2O$ may be in a range of about 1:1.5 to about 1.5:1.

In some embodiments, the amount of the solvent may be determined such that a molar concentration is in a range of about 0.001 molar (M) to about 0.5 M. In some embodiments, the amount of the solvent may be determined such that a molar concentration is in a range of about 0.05 M to about 0.2 M. In some embodiments, the amount of the solvent may be determined such that a molar concentration is in a range of about 0.01 M to about 0.1 M.

The term "interlayer" as used herein refers to a single layer and/or a plurality of all layers located between a first electrode and a second electrode in a light-emitting device.

Description of FIG. 1

FIG. 1 is a schematic view of a light-emitting device 10 according to an embodiment. The light-emitting device 10 may include a first electrode 110, an interlayer 130, and a second electrode 150.

Hereinafter, the structure of the light-emitting device 10 according to an embodiment and a method of manufacturing the light-emitting device 10 according to an embodiment will be described in connection with FIG. 1.

First Electrode 110

In FIG. 1, a substrate may be additionally located under the first electrode 110 or above the second electrode 150. The substrate may be a glass substrate or a plastic substrate. The substrate may be a flexible substrate including plastic having excellent heat resistance and durability, for example, polyimide, polyethylene terephthalate (PET), polycarbonate, polyethylene napthalate, polyarylate (PAR), polyetherimide, or any combination thereof.

The first electrode 110 may be formed by depositing or sputtering, onto the substrate, a material for forming the first electrode 110. When the first electrode 110 is an anode, a high work function material that may easily inject holes may be used as a material for a first electrode.

The first electrode 110 may be a reflective electrode, a semi-transmissive electrode, or a transmissive electrode. When the first electrode 110 is a transmissive electrode, a material for forming the first electrode 110 may be indium tin oxide (ITO), indium zinc oxide (IZO), tin oxide ($SnO_2$), zinc oxide (ZnO), or any combination thereof. In some embodiments, when the first electrode 110 is a semi-transmissive electrode or a reflective electrode, magnesium (Mg), silver (Ag), aluminum (Al), aluminum-lithium (Al—Li), calcium (Ca), magnesium-indium (Mg—In), magnesium-silver (Mg—Ag), or any combination thereof may be used as a material for forming the first electrode 110.

The first electrode 110 may have a single-layered structure consisting of a single layer or a multi-layered structure including two or more layers. In some embodiments, the first electrode 110 may have a triple-layered structure of ITO/Ag/ITO.

Interlayer 130

The interlayer 130 may be disposed on the first electrode 110. The interlayer 130 may include an emission layer.

The interlayer 130 may further include a hole transport region between the first electrode 110 and the emission layer and an electron transport region between the emission layer and the second electrode 150.

The interlayer 130 may further include metal-containing compounds such as organometallic compounds, inorganic materials such as quantum dots, and the like, in addition to various organic materials.

The interlayer 130 may include: i) at least two emitting units sequentially stacked between the first electrode 110 and the second electrode 150; and ii) a charge-generation layer located between the at least two emitting units. When the interlayer 130 includes the at least two emitting units and the charge generation layer, the light-emitting device 10 may be a tandem light-emitting device.

Hole Transport Region in Interlayer 130

The hole transport region may have i) a single-layered structure consisting of a single layer consisting of a single material, ii) a single-layered structure consisting of a single layer including a plurality of different materials, or iii) a multi-layered structure having a plurality of layers including a plurality of different materials.

The hole transport region may include a hole injection layer (HIL), a hole transport layer (HTL), an emission auxiliary layer, an electron blocking layer (EBL), or a combination thereof.

For example, the hole transport region may have a multi-layered structure, e.g., a hole injection layer/hole transport layer structure, a hole injection layer/hole transport layer/emission auxiliary layer structure, a hole injection layer/emission auxiliary layer structure, a hole transport layer/emission auxiliary layer structure, or a hole injection layer/hole transport layer/electron blocking layer structure, wherein layers of each structure are sequentially stacked on the first electrode 110 in each stated order.

The hole transport region may include the compound represented by Formula 201, the compound represented by Formula 202, or any combination thereof:

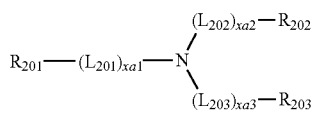

Formula 201

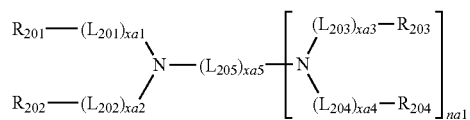

Formula 202 wherein, in Formulae 201 and 202, $L_{201}$ to $L_{204}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $L_{205}$ may be *—O—*', *—S—*', *—N($Q_{201}$)-*', a $C_1$-$C_{20}$ alkylene group unsubstituted or substituted with at least one $R_{10a}$, a $C_2$-$C_{20}$ alkenylene group unsubstituted or substituted with at least one $R_{10a}$, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, xa1 to xa4 may each independently be an integer from 0 to 5, xa5 may be an integer from 1 to 10, $R_{201}$ to $R_{204}$ and $Q_{201}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $R_{201}$ and $R_{202}$ may optionally be bound to each other via a single bond, a $C_1$-$C_5$ alkylene group unsubstituted or substituted with at least one $R_{10a}$, or a $C_2$-$C_5$ alkenylene group unsubstituted or substituted with at least one $R_{10a}$ to form a $C_6$-$C_{60}$ polycyclic group (e.g., a carbazole group or the like) unsubstituted or substituted with at least one $R_{10a}$ (e.g., Compound HT16 described herein), $R_{203}$ and $R_{204}$ may optionally be bound to each other via a single bond, a $C_1$-$C_5$ alkylene group unsubstituted or substituted with at least one $R_{10a}$, or a $C_2$-$C_5$ alkenylene group unsubstituted or substituted with at least one $R_{10a}$ to form a $C_6$-$C_{60}$ polycyclic group unsubstituted or substituted with at least one $R_{10a}$, and na1 may be an integer from 1 to 4.

In some embodiments, Formulae 201 and 202 may each include at least one group represented by Formulae CY201 to CY217:

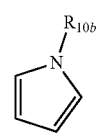

CY201

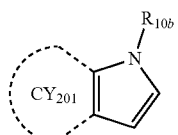

CY202

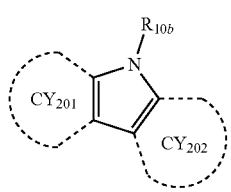

CY203

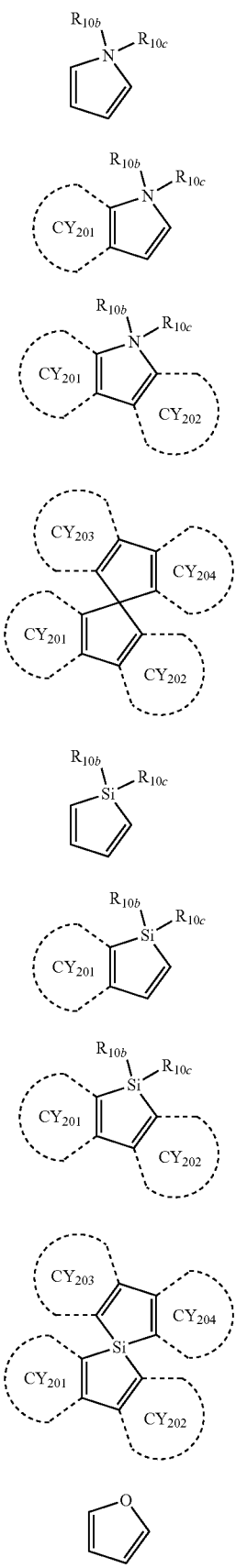

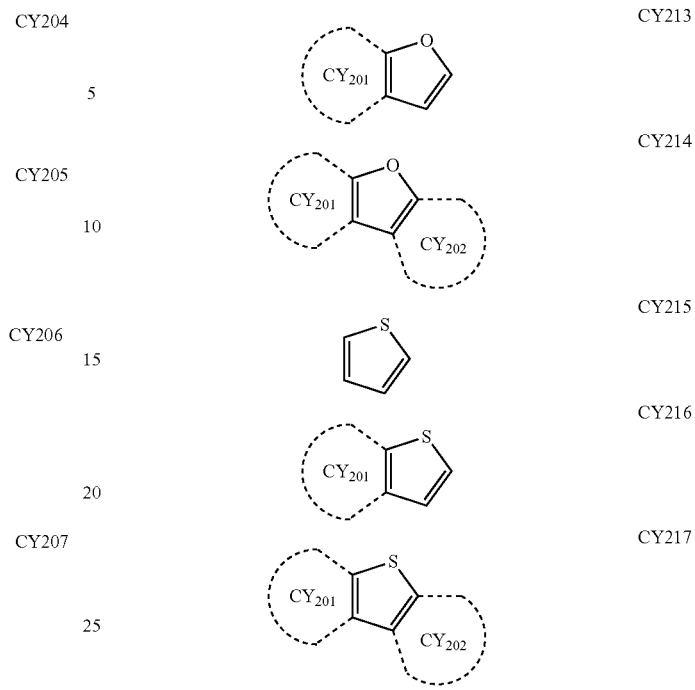

wherein, in Formulae CY201 to CY217, $R_{10b}$ and $R_{10c}$ may each be understood by referring to the descriptions of $R_{10a}$, ring $CY_{201}$ to ring $CY_{204}$ may each independently be a $C_3$-$C_{20}$ carbocyclic group or a $C_1$-$C_{20}$ heterocyclic group, and at least one hydrogen in Formulae CY201 to CY217 may be unsubstituted or substituted with $R_{10a}$.

In some embodiments, in Formulae CY201 to CY217, ring $CY_{201}$ to ring $CY_{204}$ may each independently be a benzene group, a naphthalene group, a phenanthrene group, or an anthracene group.

In one or more embodiments, Formulae 201 and 202 may each include at least one group represented by Formula CY201 to CY203.

In one or more embodiments, Formula 201 may include at least one group represented by Formulae CY201 to CY203 and at least one group represented by Formulae CY204 to CY217.

In one or more embodiments, in Formula 201, xa1 may be 1, $R_{201}$ may be a group represented by any one of Formulae CY201 to CY203, xa2 may be 0, and $R_{202}$ may be a group represented by Formulae CY204 to CY207.

In one or more embodiments, Formula 201 and 202 may each not include a group represented by Formulae CY201 to CY203.

In one or more embodiments, Formula 201 and 202 may each not include a group represented by Formulae CY201 to CY203, and include at least one group represented by Formulae CY204 to CY217.

In one or more embodiments, Formula 201 and 202 may each not include a group represented by Formulae CY201 to CY217.

In some embodiments, the hole transport region may include one of Compounds HT1 to HT44 and m-MTDATA, TDATA, 2-TNATA, NPB (NPD), β-NPB, TPD, spiro-TPD, spiro-NPB, methylated-NPB, TAPC, HMTPD, 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphorsulfonic acid (PANI/CSA), polyaniline/poly(4-styrenesulfonate (PANI/PSS), or any combination thereof:

HT1
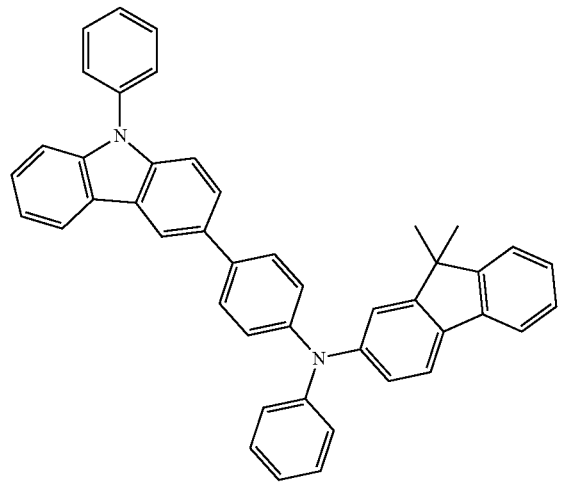
HT2
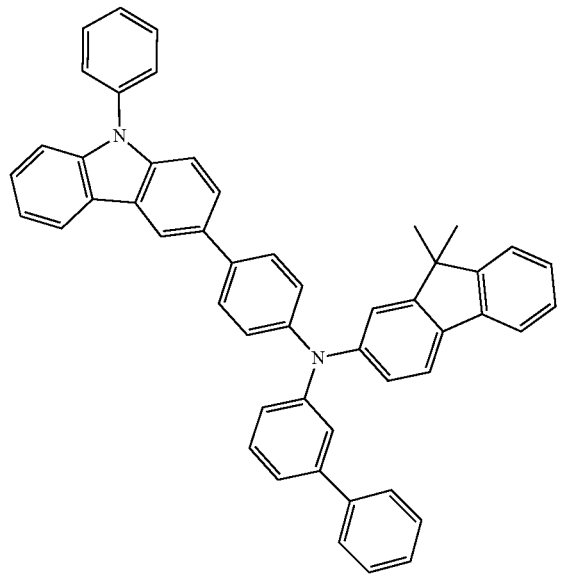
HT3
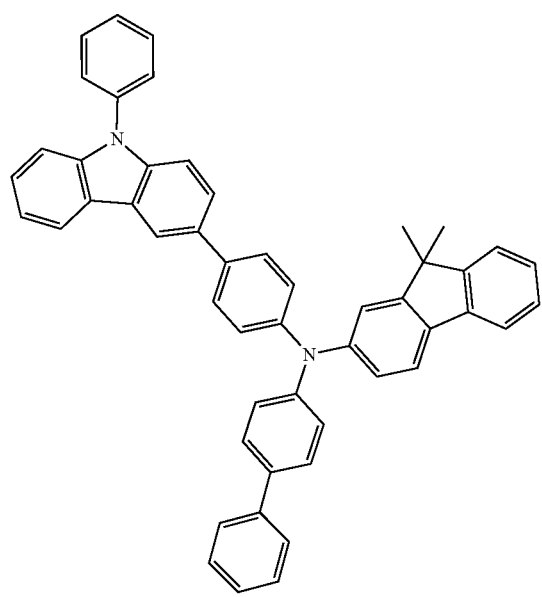
HT4
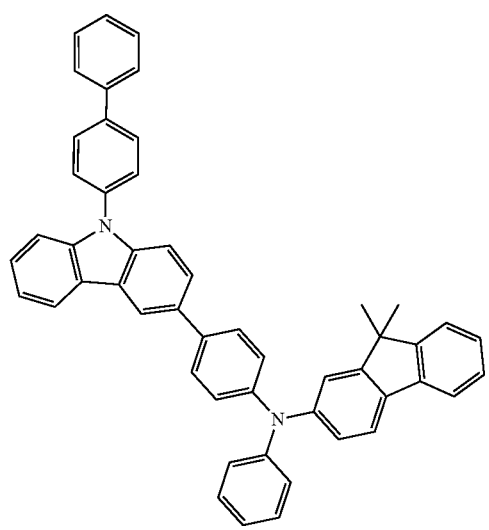

-continued
HT5
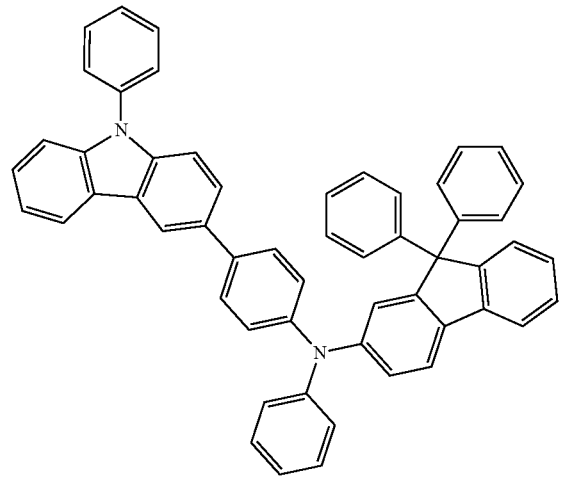
HT6
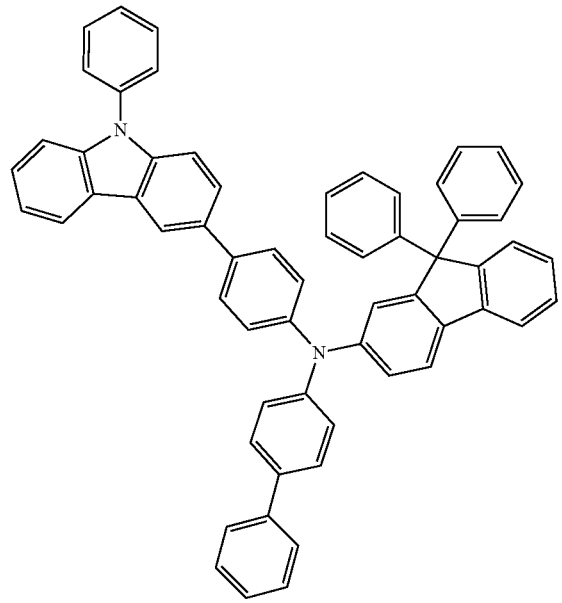
HT7
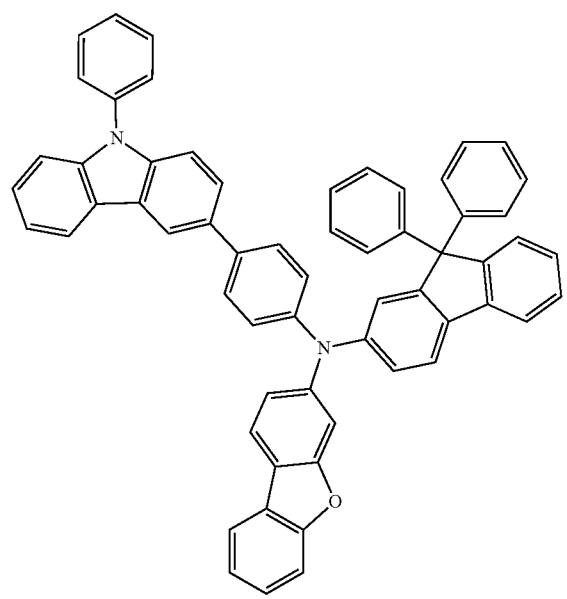
HT8
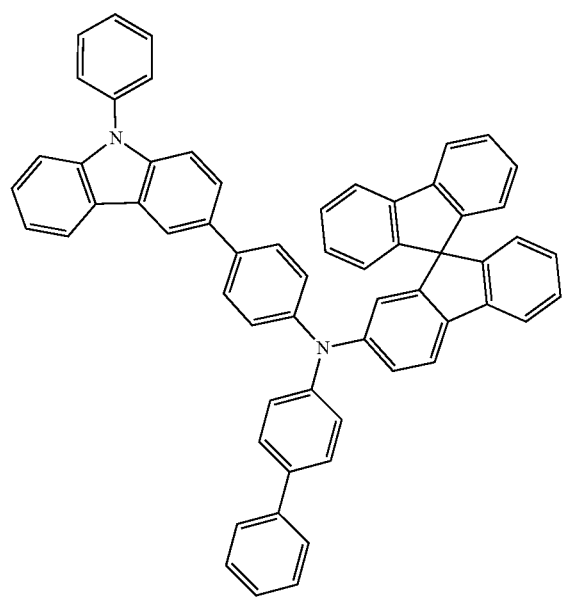

-continued
HT9
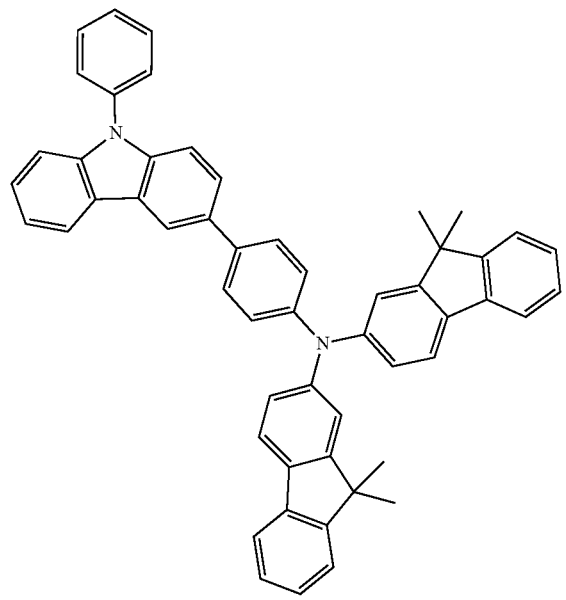
HT10
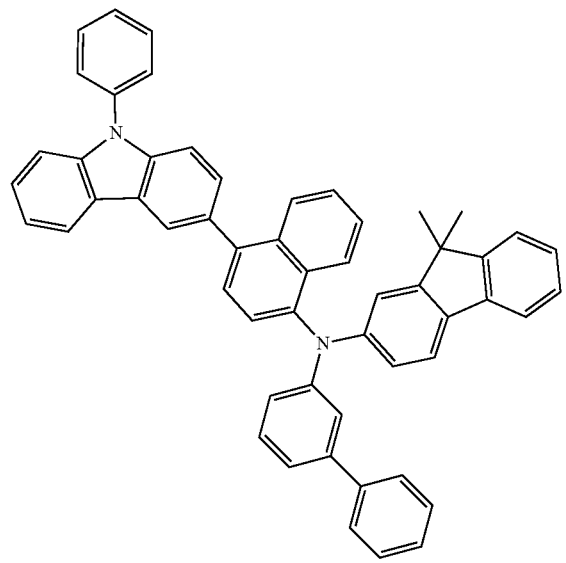
HT11
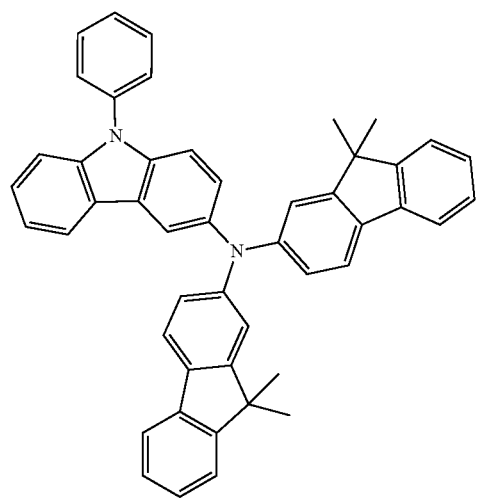
HT12
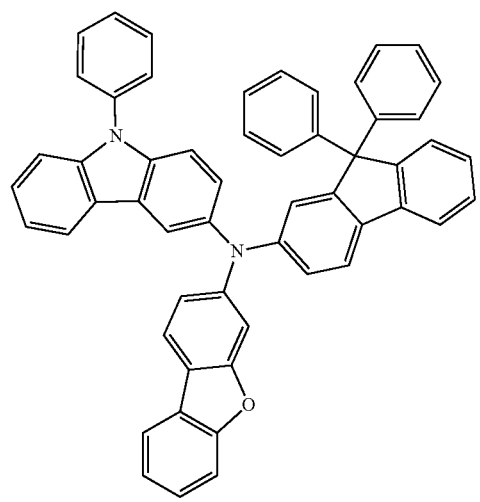

-continued
HT13
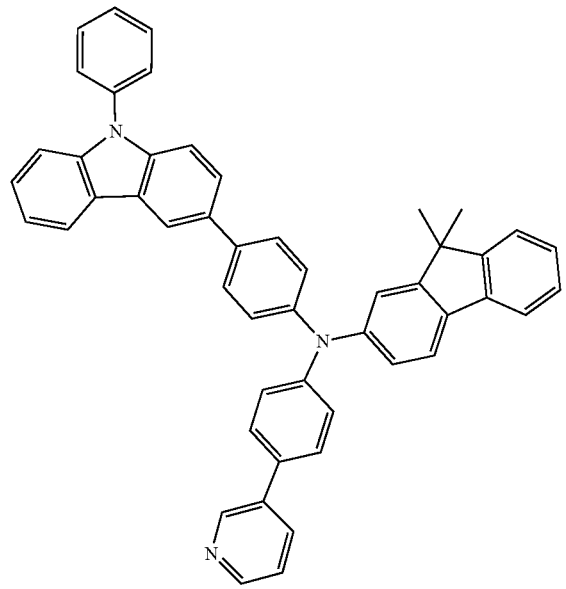
HT14
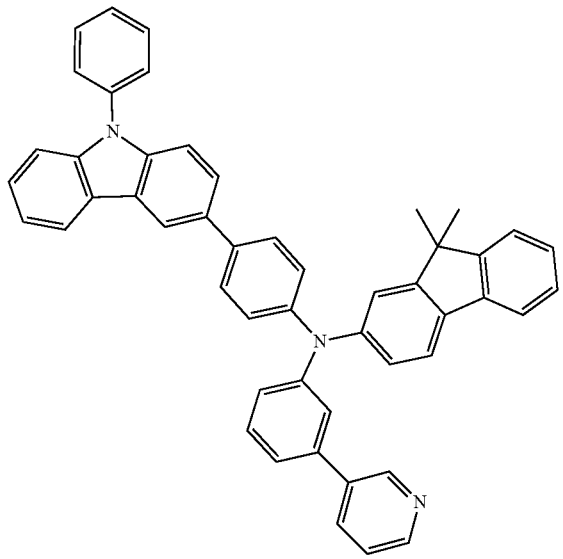
HT15
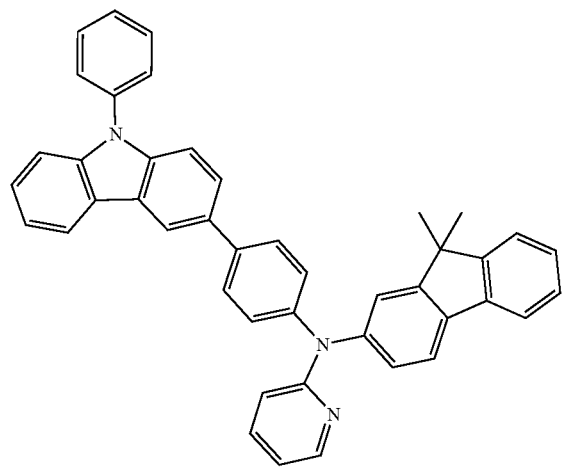
HT16
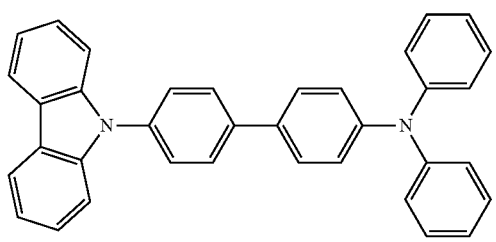
HT17
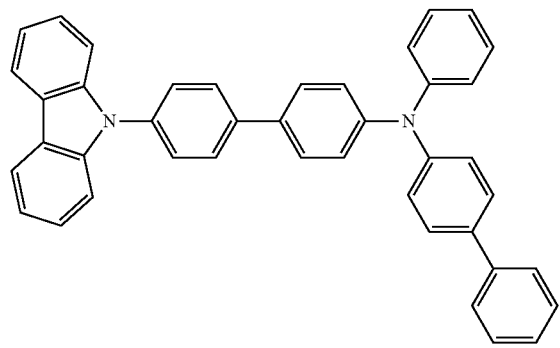
HT18
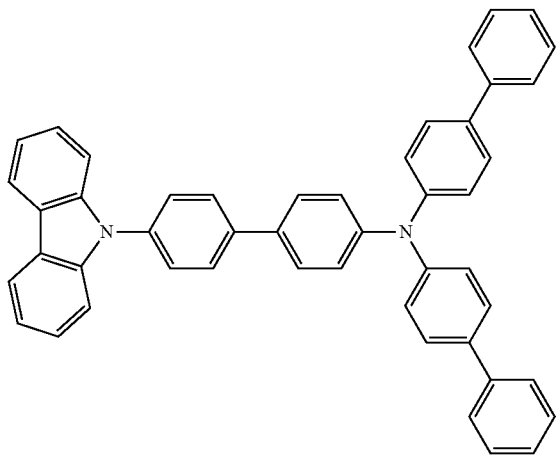

HT19
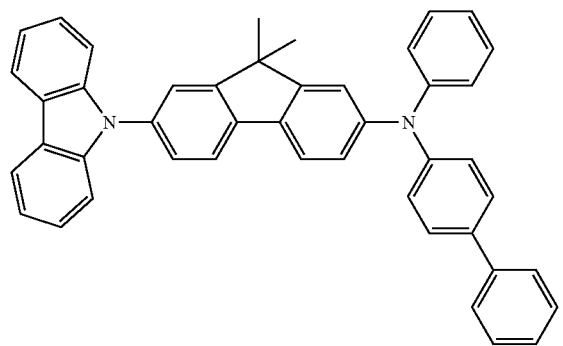
HT20
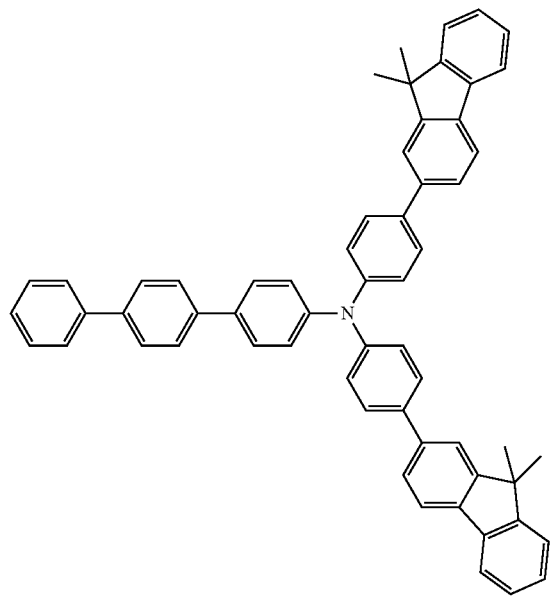
HT21
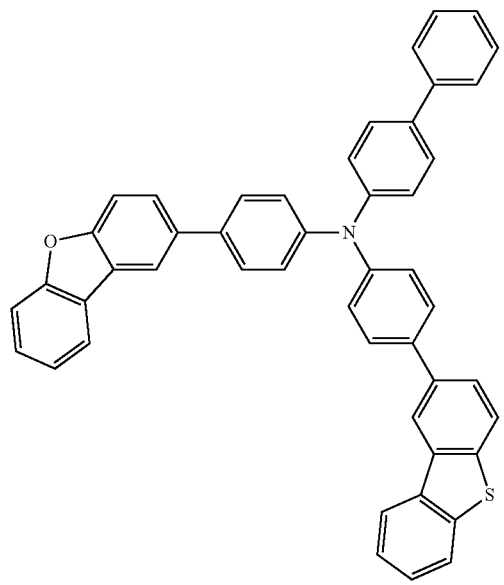
HT22
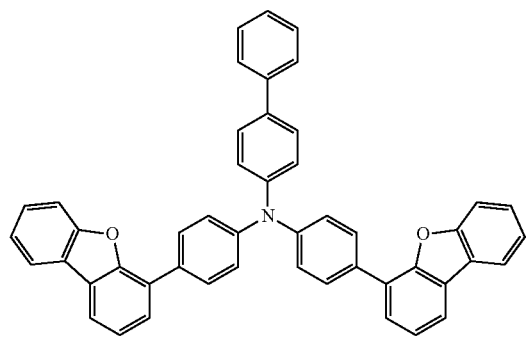

-continued
HT23
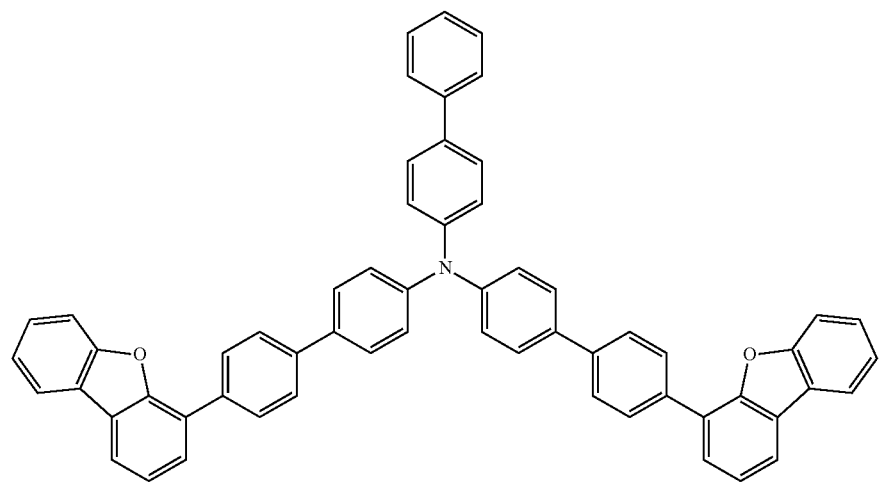
HT24
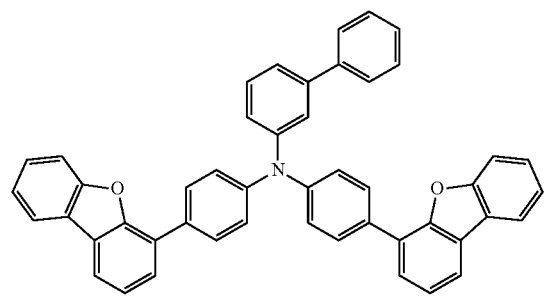
HT25
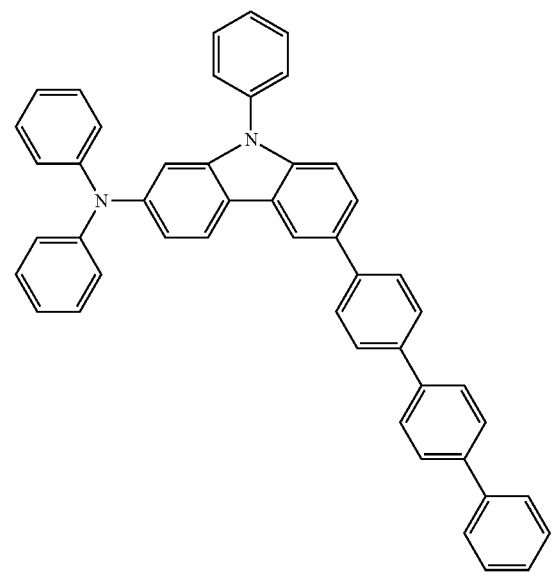
HT26
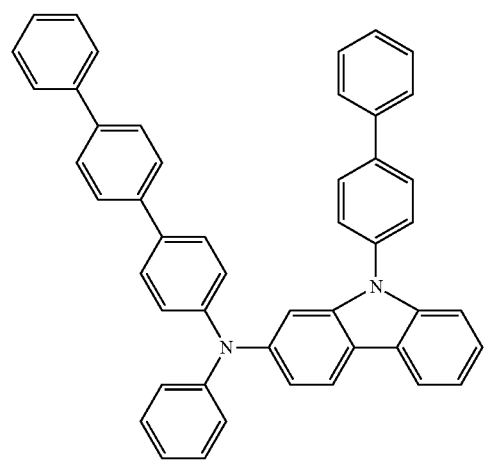
HT27
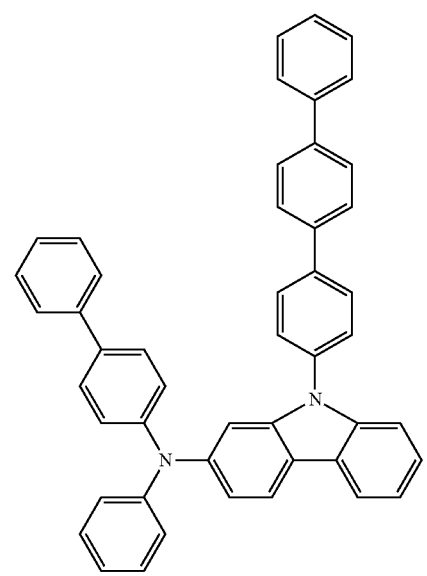

-continued
HT28
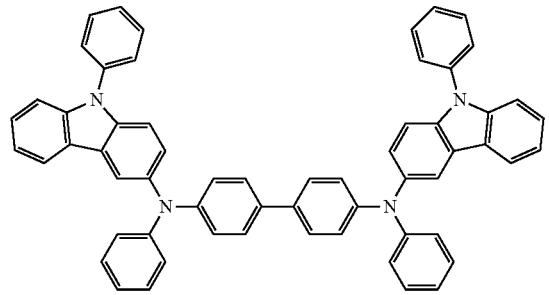
HT29
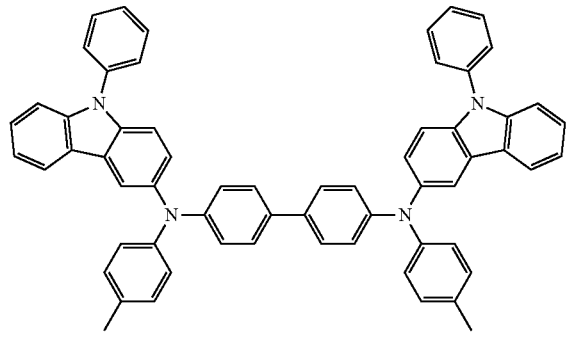
HT30
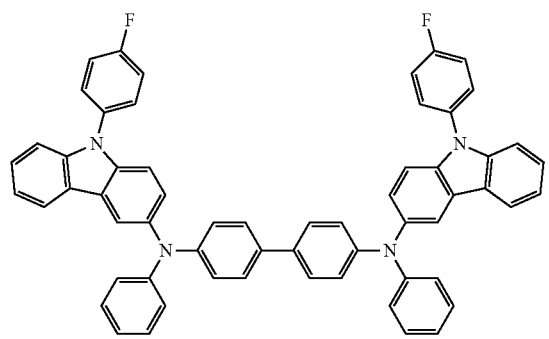
HT31
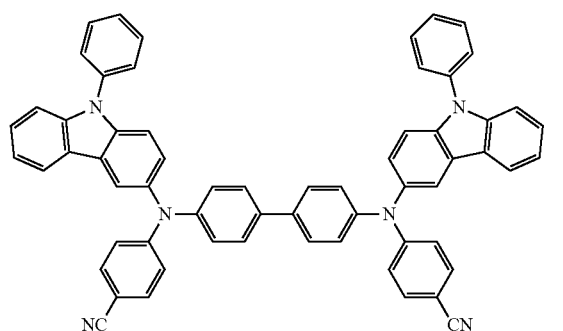
HT32
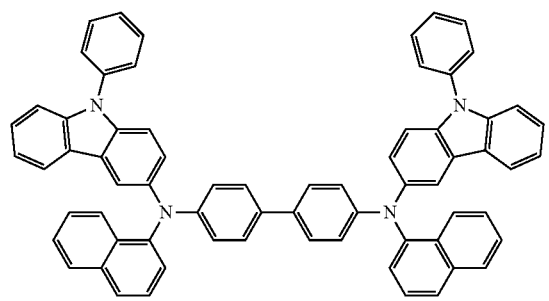
HT33
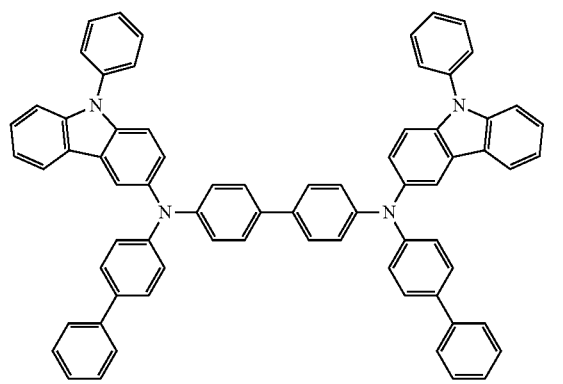
HT34
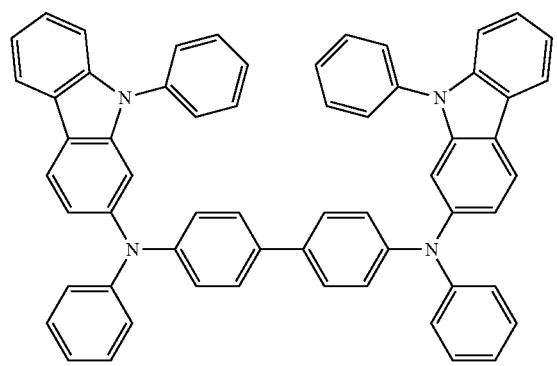
HT35
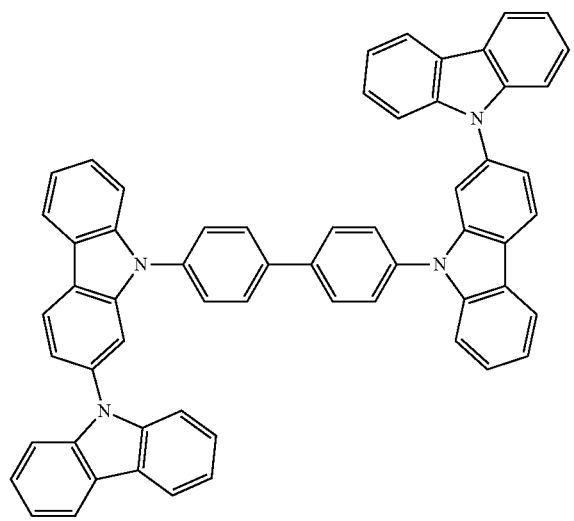

-continued
HT36
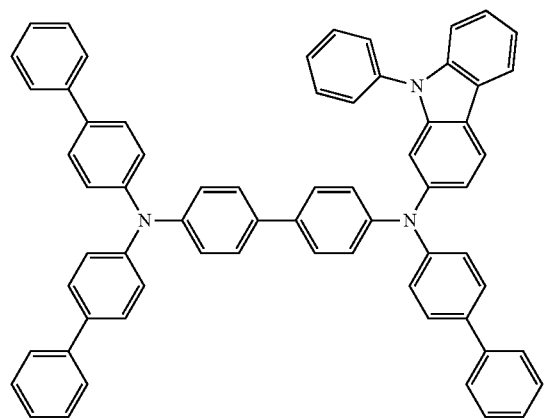
HT37
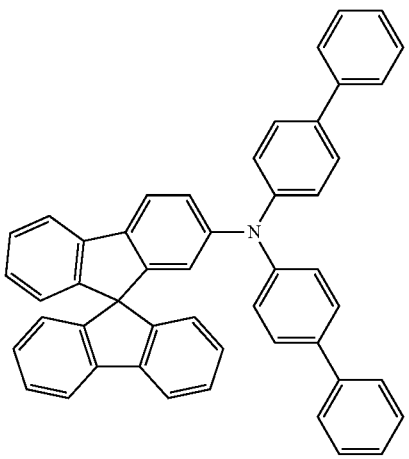
HT38
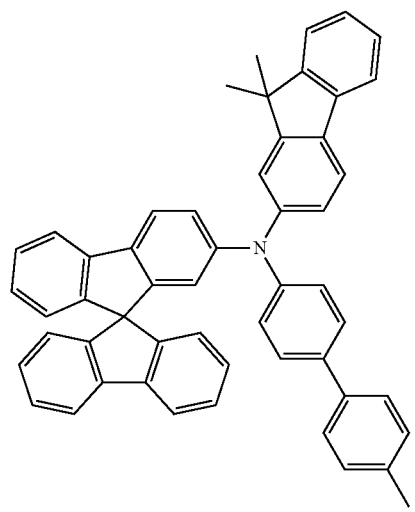
HT39
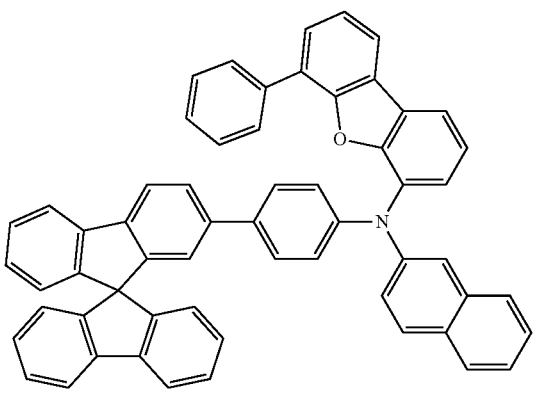
HT40
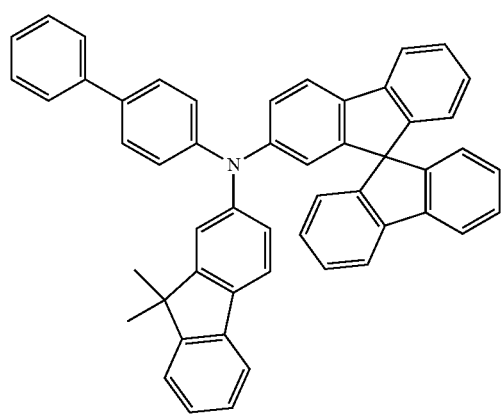
HT41
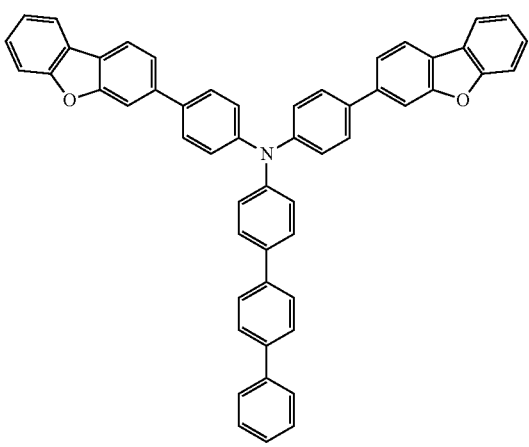

-continued
HT42
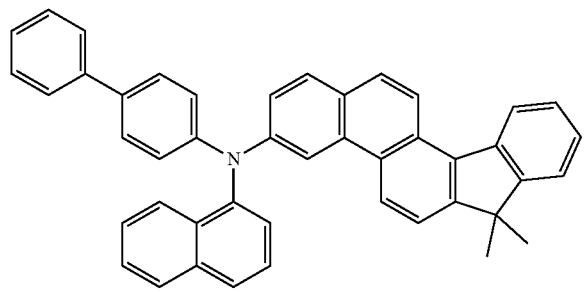
HT43
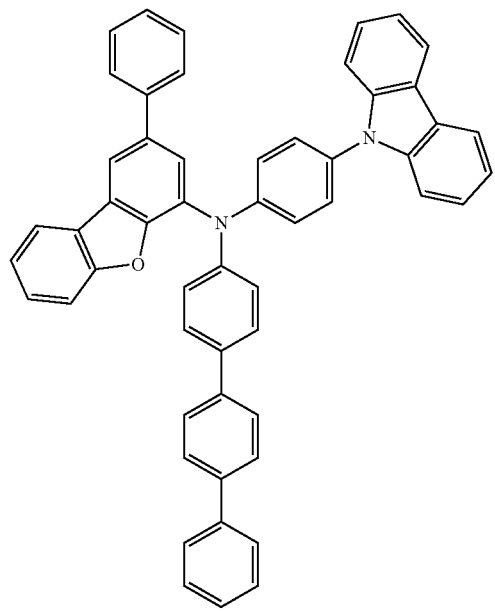
HT44
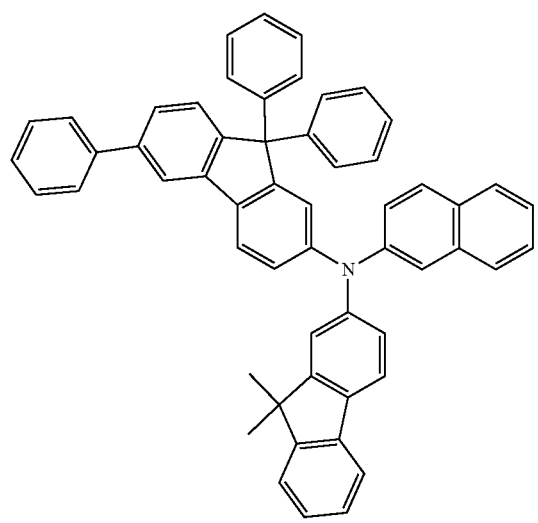
m-MTDATA
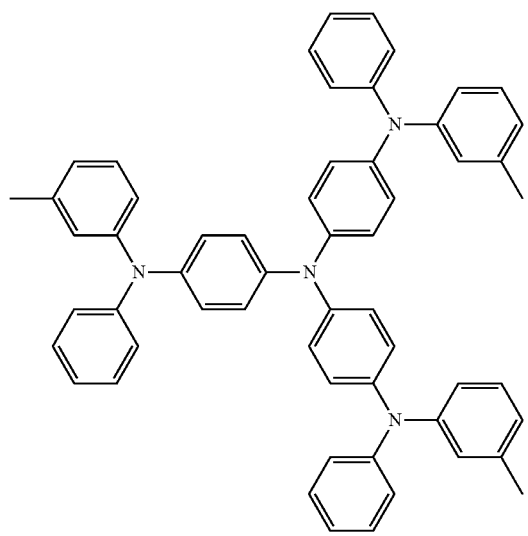

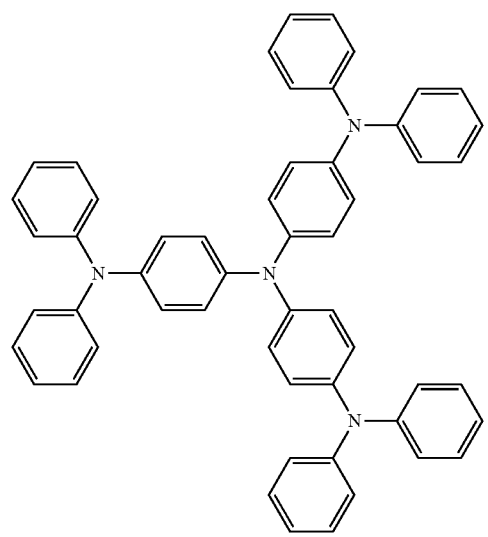
TDATA
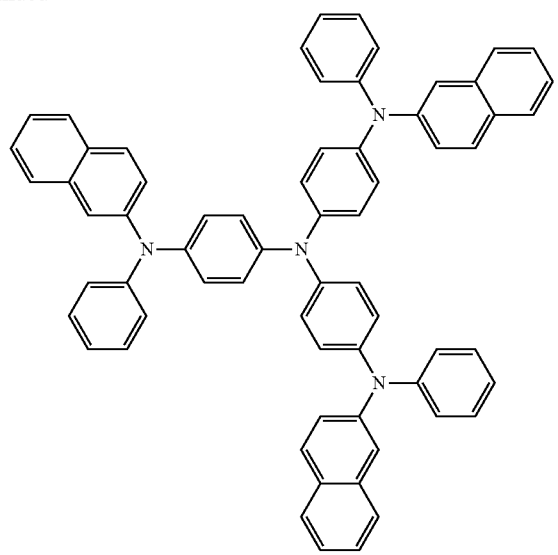
2-TNATA
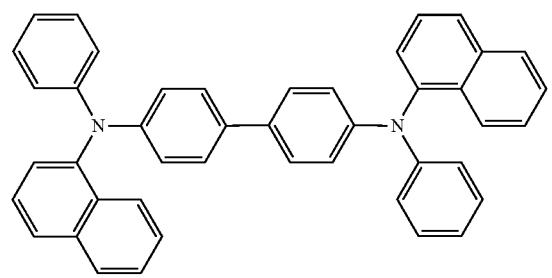
NPB
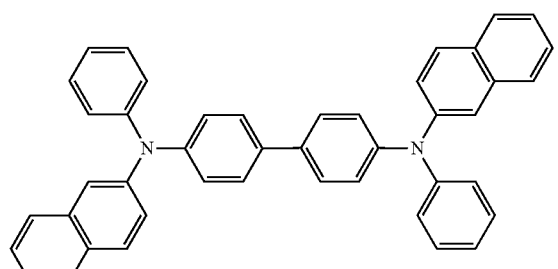
β-NPB
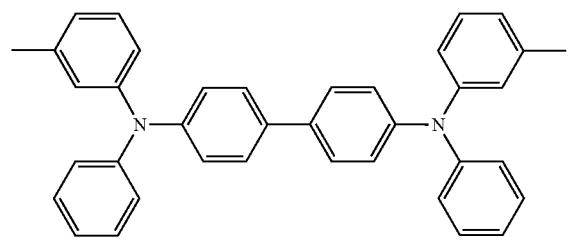
TPD
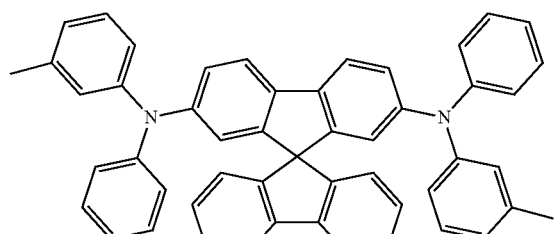
Spiro-TPD
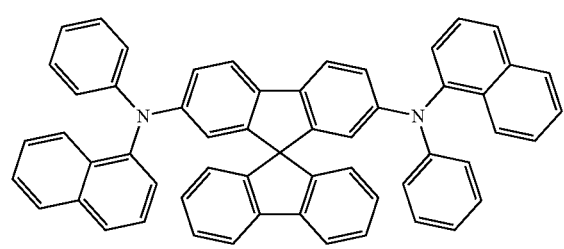
Spiro-NPB
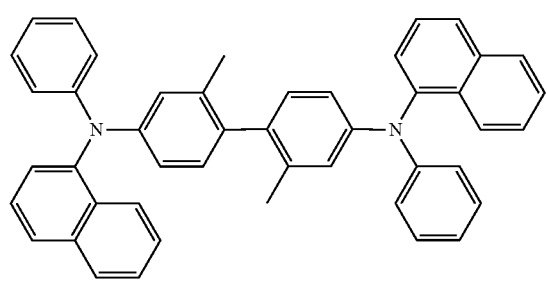
methylated-NPB

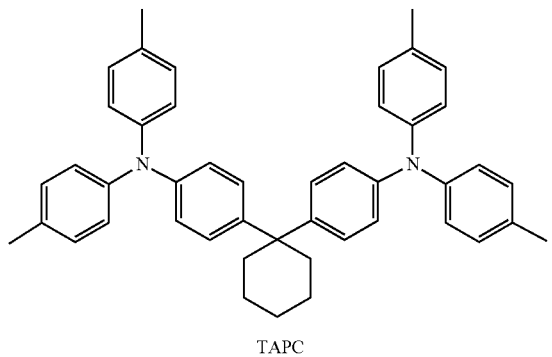

TAPC

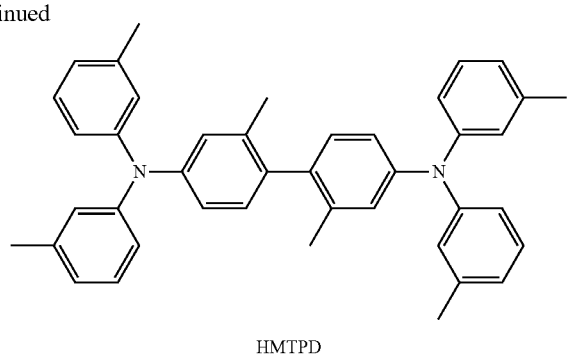

HMTPD

The thickness of the hole transport region may be in a range of about 50 (Angstroms) Å to about 10,000 Å, and in some embodiments, about 100 Å to about 4,000 Å. When the hole transport region includes a hole injection layer, a hole transport layer, or any combination thereof, the thickness of the hole injection layer may be in a range of about 100 Å to about 9,000 Å, and in some embodiments, about 100 Å to about 1,000 Å, and the thickness of the hole transport layer may be in a range of about 50 Å to about 2,000 Å, and in some embodiments, about 100 Å to about 1,500 Å. When the thicknesses of the hole transport region, the hole injection layer, and the hole transport layer are within any of these ranges, excellent hole transport characteristics may be obtained without a substantial increase in driving voltage.

The emission auxiliary layer may increase light emission efficiency by compensating for an optical resonance distance according to the wavelength of light emitted by an emission layer. The electron blocking layer may reduce or eliminate the flow of electrons from an electron transport region. The emission auxiliary layer and the electron blocking layer may include the aforementioned materials.

p-Dopant

The hole transport region may include a charge generating material as well as the aforementioned materials to improve conductive properties of the hole transport region. The charge generating material may be substantially homogeneously or non-homogeneously dispersed (for example, as a single layer consisting of charge generating material) in the hole transport region.

The charge generating material may include, for example, a p-dopant.

In some embodiments, a lowest unoccupied molecular orbital (LUMO) energy level of the p-dopant may be −3.5 eV or less.

In some embodiments, the p-dopant may include a quinone derivative, a cyano group-containing compound, element EL1 and element EL2-containing compound, or any combination thereof.

Examples of the quinone derivative may include TCNQ, F4-TCNQ, and the like.

Examples of the cyano group-containing compound include HAT-CN, a compound represented by Formula 221, and the like:

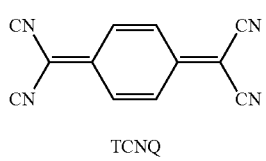

TCNQ

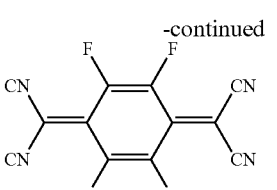

F4-TCNQ

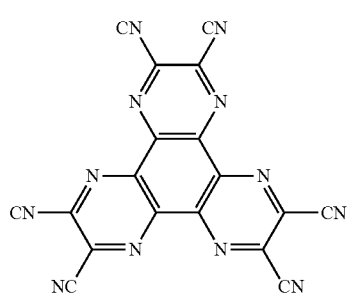

HAT-CN

Formula 221

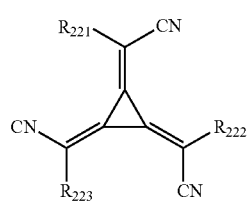

Formula 221 wherein, in Formula 221,
R$_{221}$ to R$_{223}$ may each independently be a C$_3$-C$_{60}$ carbocyclic group unsubstituted or substituted with at least one R$_{10a}$ or a C$_1$-C$_{60}$ heterocyclic group unsubstituted or substituted with at least one R$_{10a}$, and
at least one of R$_{221}$ to R$_{223}$ may be: a C$_3$-C$_{60}$ carbocyclic group or a C$_1$-C$_{60}$ heterocyclic group, each substituted with a cyano group; —F; —Cl; —Br; —I, or any combination thereof; a C$_1$-C$_{20}$ alkyl group substituted with a cyano group, —F, —Cl, —Br, —I, or any combination thereof; or any combination thereof.

In the element EL1 and element EL2-containing compounds, element EL1 may be metal, metalloid, or a combination thereof, and element EL2 may be non-metal, metalloid, or a combination thereof.

Examples of the metal may include: an alkali metal (e.g., lithium (Li), sodium (Na), potassium (K), rubidium (Rb), cesium (Cs), or the like); an alkaline earth metal (e.g., beryllium (Be), magnesium (Mg), calcium (Ca), strontium (Sr), barium (Ba), or the like); a transition metal (e.g., titanium (Ti), zirconium (Zr), hafnium (Hf), vanadium (V), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), or the like); post-transition metal (e.g., zinc (Zn), indium (In), tin (Sn), or the like); a lanthanide metal (e.g., lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), ruthenium (Lu), or the like); and the like.

Examples of the metalloid may include silicon (Si), antimony (Sb), tellurium (Te), and the like.

Examples of the non-metal may include oxygen (O), halogen (e.g., F, Cl, Br, I, and the like), and the like.

For example, the element EL1 and element EL2-containing compound may include a metal oxide, a metal halide (e.g., metal fluoride, metal chloride, metal bromide, metal iodide, and the like), a metalloid halide (e.g., a metalloid fluoride, a metalloid chloride, a metalloid bromide, a metalloid iodide, and the like), a metal telluride, or any combination thereof.

Examples of the metal oxide may include tungsten oxide (e.g., WO, $W_2O_3$, $WO_2$, $WO_3$, $W_2O_5$, and the like), vanadium oxide (e.g., VO, $V_2O_3$, $VO_2$, $V_2O_5$, and the like), molybdenum oxide (MoO, $Mo_2O_3$, $MoO_2$, $MoO_3$, $Mo_2O_5$, and the like), rhenium oxide (e.g., $ReO_3$, and the like), and the like.

Examples of the metal halide may include alkali metal halide, alkaline earth metal halide, transition metal halide, post-transition metal halide, lanthanide metal halide, and the like.

Examples of the alkali metal halide may include LiF, NaF, KF, RbF, CsF, LiCl, NaCl, KCl, RbCl, CsCl, LiBr, NaBr, KBr, RbBr, CsBr, LiI, NaI, KI, RbI, CsI, and the like.

Examples of the alkaline earth metal halide may include $BeF_2$, $MgF_2$, $CaF_2$, $SrF_2$, $BaF_2$, $BeCl_2$, $MgCl_2$, $CaCl_2$, $SrCl_2$, $BaCl_2$, $BeBr_2$, $MgBr_2$, $CaBr_2$, $SrBr_2$, $BaBr_2$, $BeI_2$, $MgI_2$, $CaI_2$, $SrI_2$, $BaI_2$, and the like.

Examples of the transition metal halide may include titanium halide (e.g., $TiF_4$, $TiCl_4$, $TiBr_4$, $TiI_4$, and the like), zirconium halide (e.g., $ZrF_4$, $ZrCl_4$, $ZrBr_4$, $ZrI_4$, and the like), hafnium halide (e.g., $HfF_4$, $HfCl_4$, $HfBr_4$, $HfI_4$, and the like), vanadium halide (e.g., $VF_3$, $VCl_3$, $VBr_3$, $VI_3$, and the like), niobium halide (e.g., $NbF_3$, $NbCl_3$, $NbBr_3$, $NbI_3$, and the like), tantalum halide (e.g., $TaF_3$, $TaCl_3$, $TaBr_3$, $TaI_3$, and the like), chromium halide (e.g., $CrF_3$, $CrCl_3$, $CrBr_3$, $CrI_3$, and the like), molybdenum halide (e.g., $MoF_3$, $MoCl_3$, $MoBr_3$, $MoI_3$, and the like), tungsten halide (e.g., $WF_3$, $WCl_3$, $WBr_3$, $WI_3$, and the like), manganese halide (e.g., $MnF_2$, $MnCl_2$, $MnBr_2$, $MnI_2$, and the like), technetium halide (e.g., $TcF_2$, $TcCl_2$, $TcBr_2$, $TcI_2$, and the like), rhenium halide (e.g., $ReF_2$, $ReCl_2$, $ReBr_2$, $ReI_2$, and the like), iron halide (e.g., $FeF_2$, $FeCl_2$, $FeBr_2$, $FeI_2$, and the like), ruthenium halide (e.g., $RuF_2$, $RuCl_2$, $RuBr_2$, $RuI_2$, and the like), osmium halide (e.g., $OsF_2$, $OsCl_2$, $OsBr_2$, $OsI_2$, and the like), cobalt halide (e.g., $CoF_2$, $CoCl_2$, $CoBr_2$, $CoI_2$, and the like), rhodium halide (e.g., $RhF_2$, $RhCl_2$, $RhBr_2$, $RhI_2$, and the like), iridium halide (e.g., $IrF_2$, $IrCl_2$, $IrBr_2$, $IrI_2$, and the like), nickel halide (e.g., $NiF_2$, $NiCl_2$, $NiBr_2$, $NiI_2$, and the like), palladium halide (e.g., $PdF_2$, $PdCl_2$, $PdBr_2$, $PdI_2$, and the like), platinum halide (e.g., $PtF_2$, $PtCl_2$, $PtBr_2$, $PtI_2$, and the like), copper halide (e.g., CuF, CuCl, CuBr, CuI, and the like), silver halide (e.g., AgF, AgCl, AgBr, AgI, and the like), gold halide (e.g., AuF, AuCl, AuBr, AuI, and the like), and the like.

Examples of the post-transition metal halide may include zinc halide (e.g., $ZnF_2$, $ZnCl_2$, $ZnBr_2$, $ZnI_2$, and the like), indium halide (e.g., $InI_3$ and the like), tin halide (e.g., $SnI_2$ and the like), and the like.

Examples of the lanthanide metal halide may include YbF, $YbF_2$, $YbF_3$, $SmF_3$, YbCl, $YbCl_2$, $YbCl_3$, $SmCl_3$, YbBr, $YbBr_2$, $YbBr_3$, $SmBr_3$, YbI, $YbI_2$, $YbI_3$, $SmI_3$, and the like.

Examples of the metalloid halide may include antimony halide (e.g., $SbCl_5$ and the like) and the like.

Examples of the metal telluride may include alkali metal telluride (e.g., $Li_2Te$, $Na_2Te$, $K_2Te$, $Rb_2Te$, $Cs_2Te$, and the like), alkaline earth metal telluride (e.g., BeTe, MgTe, CaTe, SrTe, BaTe, and the like), transition metal telluride (e.g., $TiTe_2$, $ZrTe_2$, $HfTe_2$, $V_2Te_3$, $Nb_2Te_3$, $Ta_2Te_3$, $Cr_2Te_3$, $Mo_2Te_3$, $W_2Te_3$, MnTe, TcTe, ReTe, FeTe, RuTe, OsTe, CoTe, RhTe, IrTe, NiTe, PdTe, PtTe, $Cu_2Te$, CuTe, $Ag_2Te$, AgTe, $Au_2Te$, and the like), post-transition metal telluride (e.g., ZnTe and the like), lanthanide metal telluride (e.g., LaTe, CeTe, PrTe, NdTe, PmTe, EuTe, GdTe, TbTe, DyTe, HoTe, ErTe, TmTe, YbTe, LuTe, and the like), and the like.

Emission Layer in Interlayer 130

When the light-emitting device 10 is a full color light-emitting device, the emission layer may be patterned into a red emission layer, a green emission layer, and/or a blue emission layer, according to a sub-pixel. In one or more embodiments, the emission layer may have a stacked structure. The stacked structure may include two or more layers selected from a red emission layer, a green emission layer, and a blue emission layer. The two or more layers may be in direct contact with each other. In some embodiments, the two or more layers may be separated from each other. In one or more embodiments, the emission layer may include two or more materials. The two or more materials may include a red light-emitting material, a green light-emitting material, or a blue light-emitting material. The two or more materials may be mixed with each other in a single layer. The two or more materials mixed with each other in the single layer may emit white light.

The emission layer may include a host and a dopant. The dopant may be a phosphorescent dopant, a fluorescent dopant, or any combination thereof.

The amount of the dopant in the emission layer may be in a range of about 0.01 parts to about 15 parts by weight based on 100 parts by weight of the host.

The emission layer may include a delayed fluorescence material. The delayed fluorescence material may serve as a host or a dopant in the emission layer.

The thickness of the emission layer may be in a range of about 100 Å to about 1,000 Å, and in some embodiments, about 200 Å to about 600 Å. When the thickness of the emission layer is within any of these ranges, improved luminescence characteristics may be obtained without a substantial increase in driving voltage.

Host

The host may include a compound represented by Formula 301 or Formula 302.

To improve device stability, a host structure represented by Formula 301 or Formula 302 may be provided, and an exciplex is formed through a combination thereof, thereby providing an organic light-emitting device with high efficiency and improved lifespan.

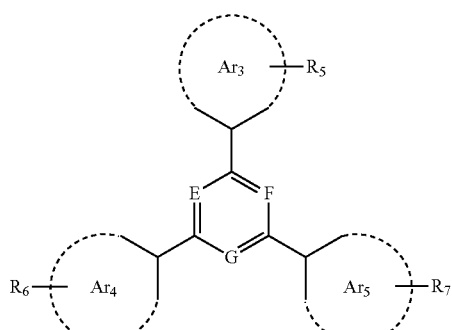

Formula 301 wherein, in Formula 301,

E, F, and G may each independently be CH or N, $Ar_3$, $Ar_4$, and $Ar_5$ may each independently be a substituted or unsubstituted non-aromatic condensed polycyclic group or a substituted or unsubstituted non-aromatic condensed heteropolycyclic group, which may be pentagonal or hexagonal, $R_5$, $R_6$, and $R_7$ may each independently be hydrogen, deuterium, halogen, nitrogen, oxygen, boron, silicon, sulfur, sulfur dioxide, phosphorus, phosphorus oxide, a $C_1$-$C_{10}$ alkyl group unsubstituted or substituted with at least one $R_{10a}$, a $C_3$-$C_{10}$ cycloalkyl group unsubstituted or substituted with at least one $R_{10a}$, a $C_3$-$C_{10}$ heterocycloalkyl group unsubstituted or substituted with at least one $R_{10a}$, a $C_3$-$C_{10}$ cycloalkenyl group unsubstituted or substituted with at least one $R_{10a}$, a $C_3$-$C_{10}$ heterocycloalkenyl group unsubstituted or substituted with at least one $R_{10a}$, a $C_6$-$C_{60}$ aryl group unsubstituted or substituted with at least one $R_{10a}$, a $C_2$-$C_{60}$ heteroaryl group unsubstituted or substituted with at least one $R_{10a}$, a non-aromatic condensed polycyclic group unsubstituted or substituted with at least one $R_{10a}$, or a non-aromatic condensed heteropolycyclic group unsubstituted or substituted with at least one $R_{10a}$.

In one or more embodiments, the compound represented by Formula 301 may be represented by one of the following compounds:

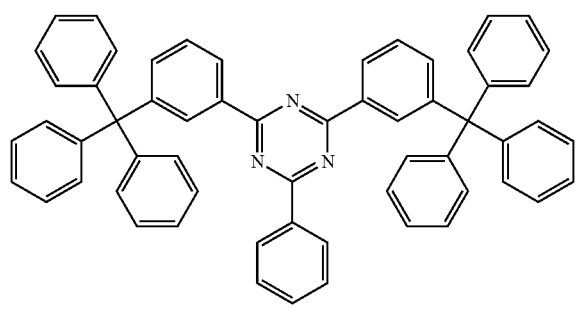

ETH1

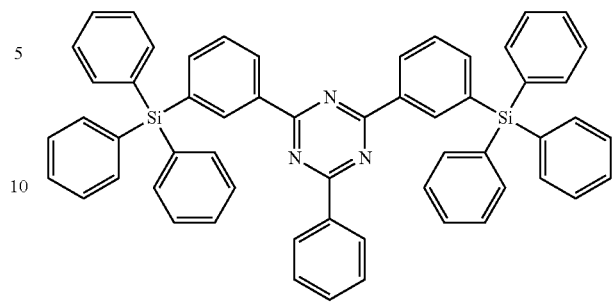

ETH2

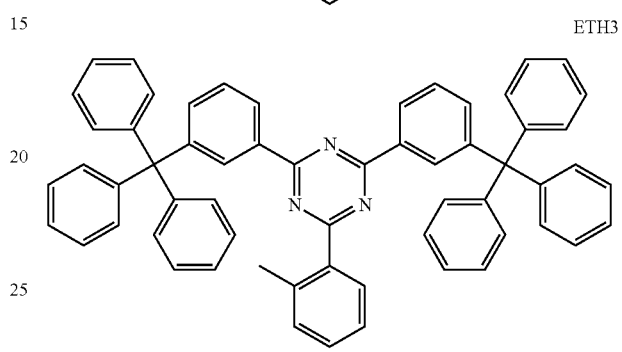

ETH3

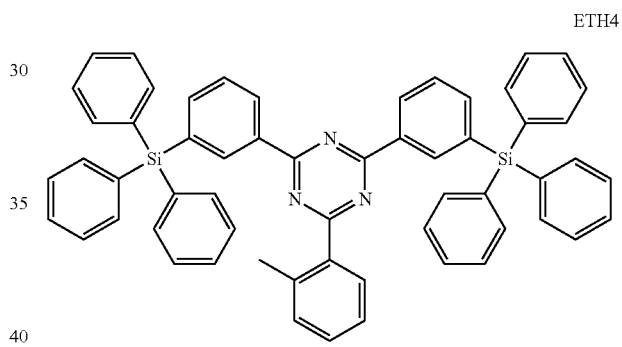

ETH4

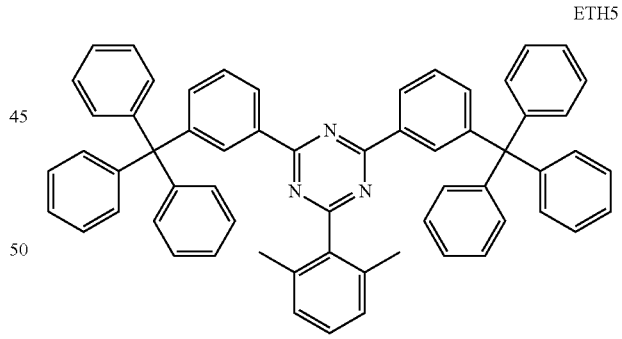

ETH5

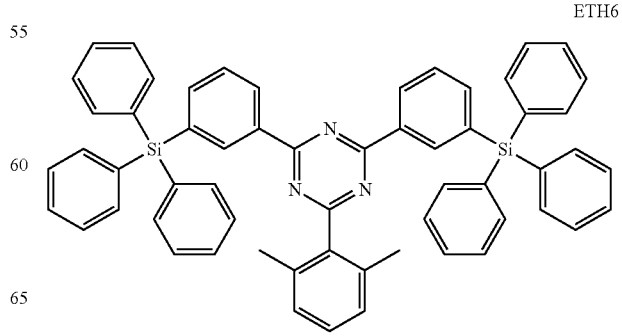

ETH6

ETH7
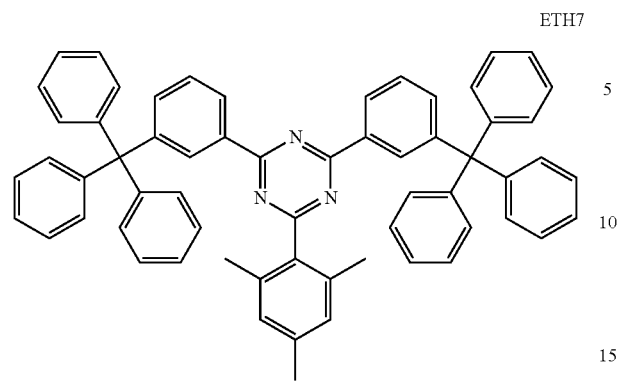
ETH8
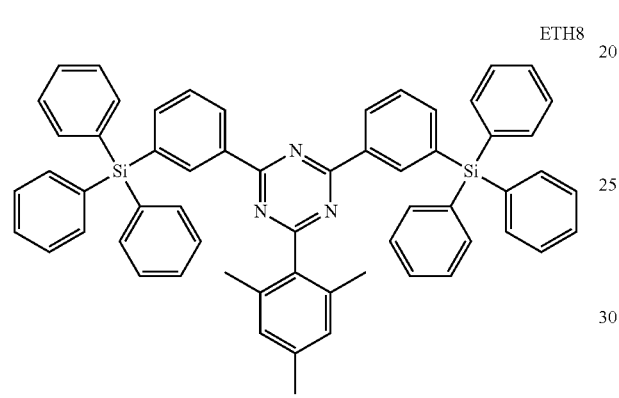
ETH9
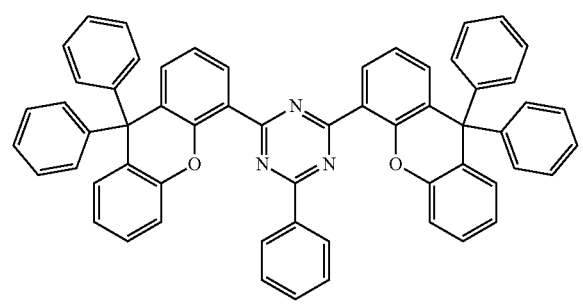
ETH10
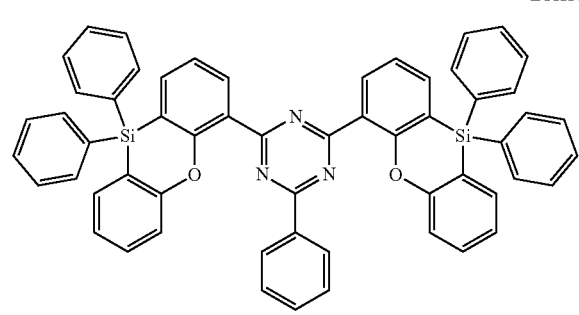
ETH11
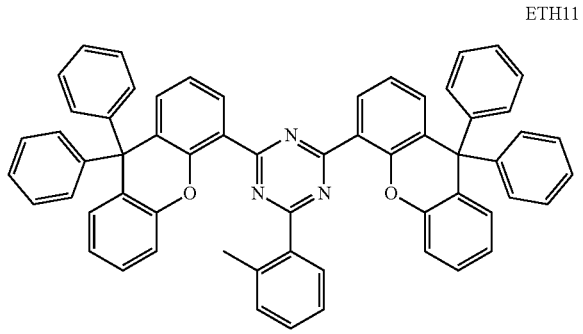
ETH12
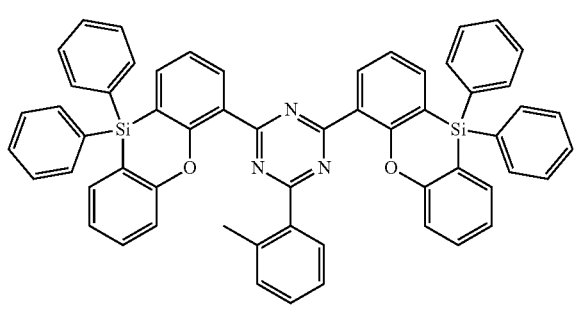
ETH13
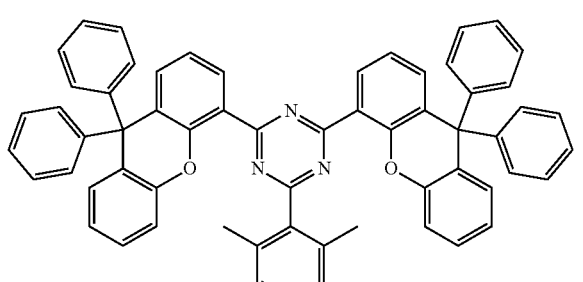
ETH14
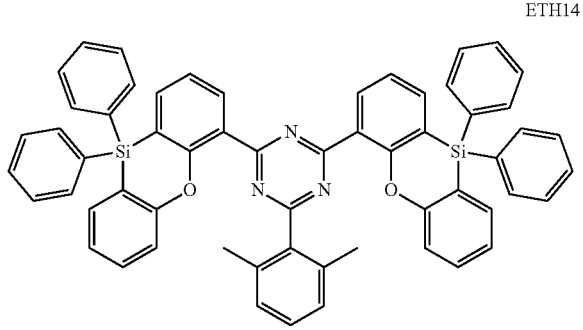
ETH15
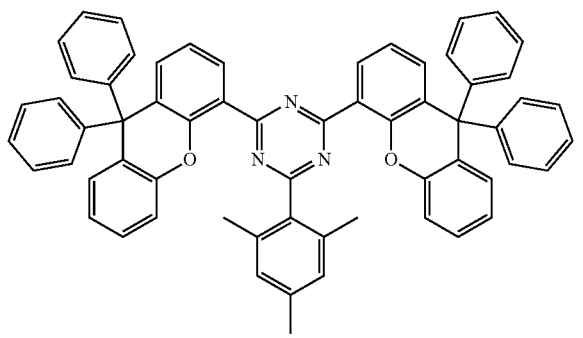

ETH16
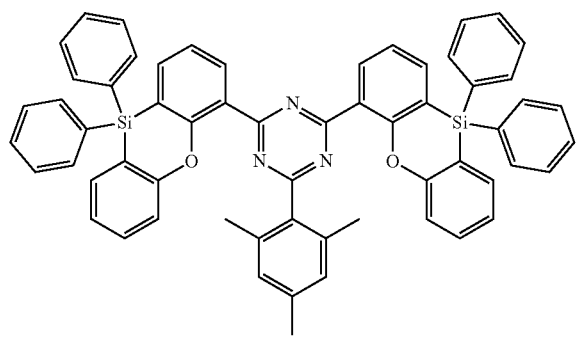
ETH17
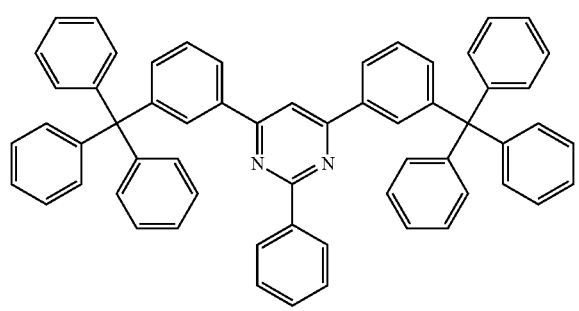
ETH18
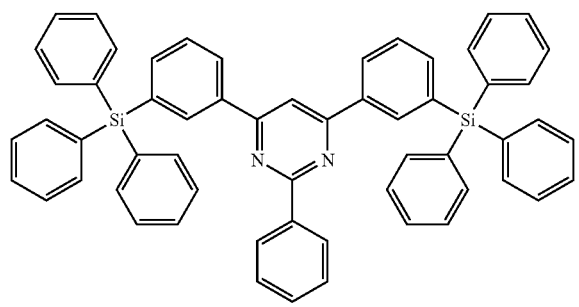
ETH19
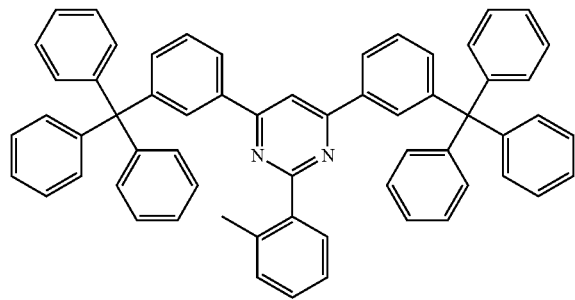
ETH20
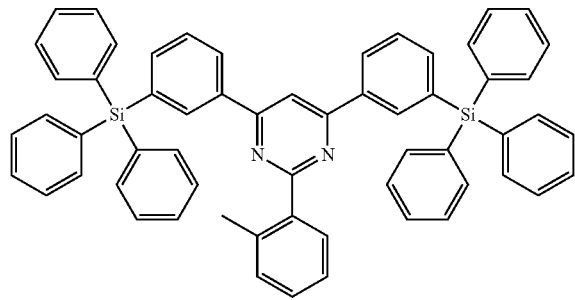
ETH21
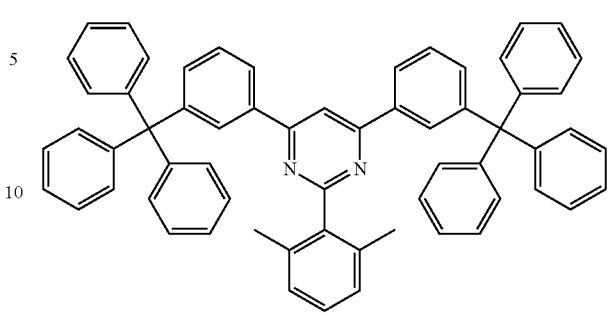
ETH22
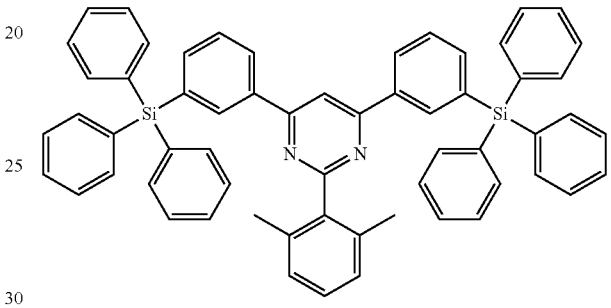
ETH23
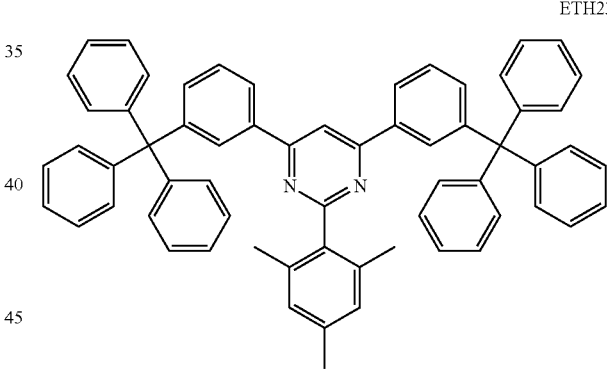
ETH24
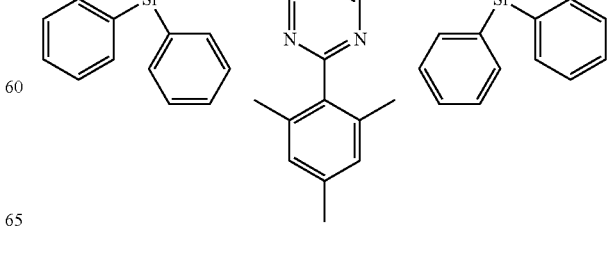

ETH25
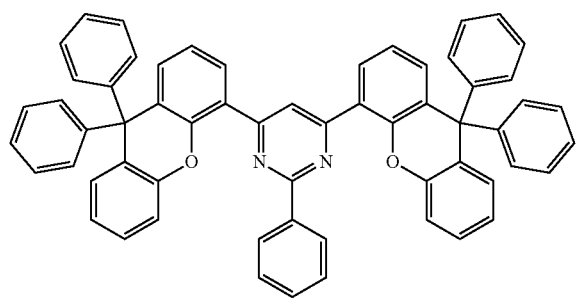
ETH26
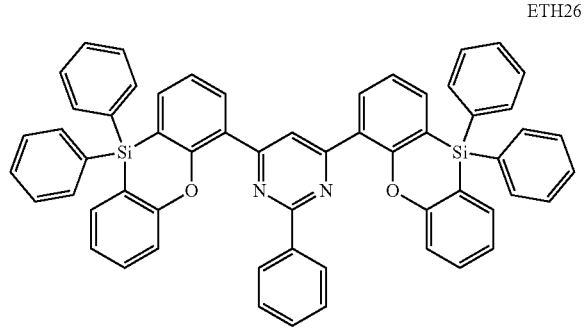
ETH27
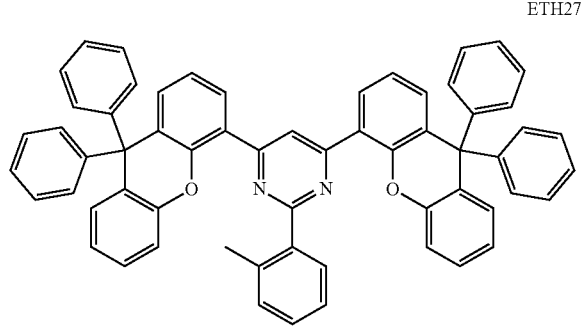
ETH28
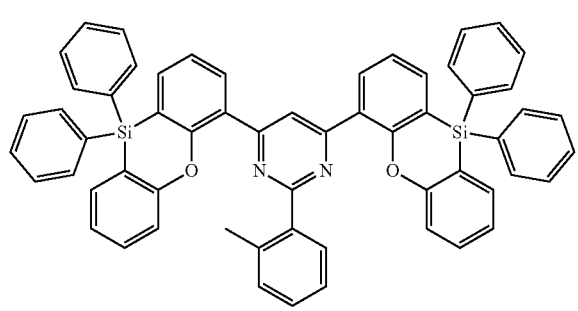
ETH29
ETH30
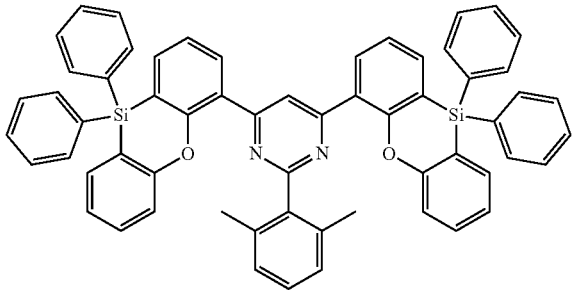
ETH31
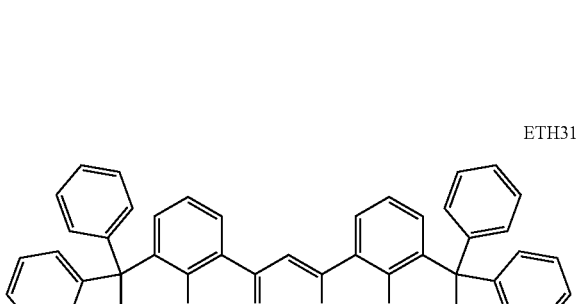
ETH32
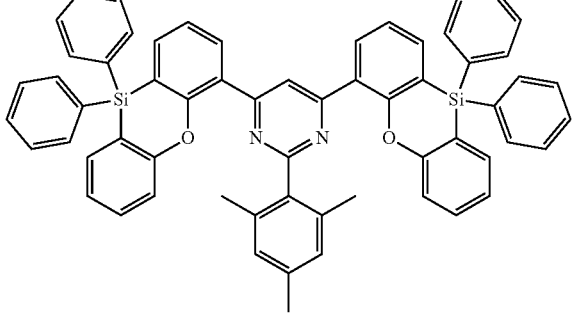
ETH33
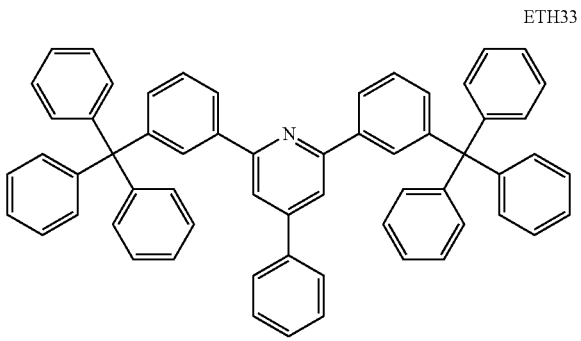

-continued
ETH34
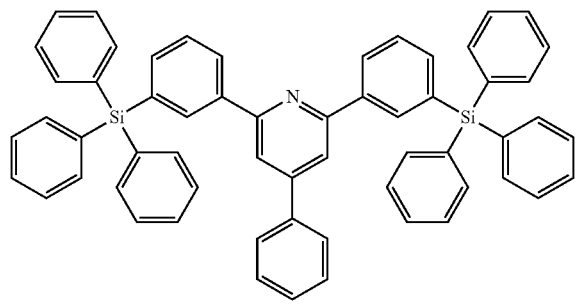
ETH35
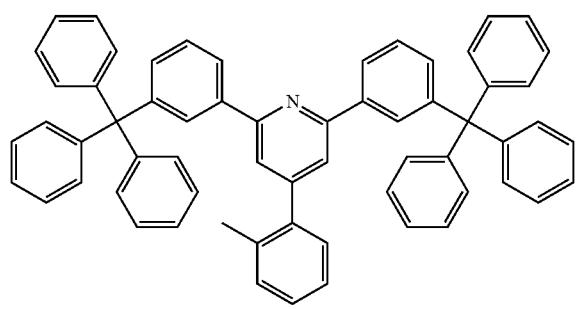
ETH36
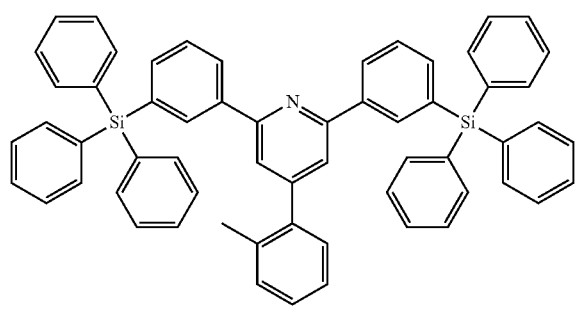
ETH37
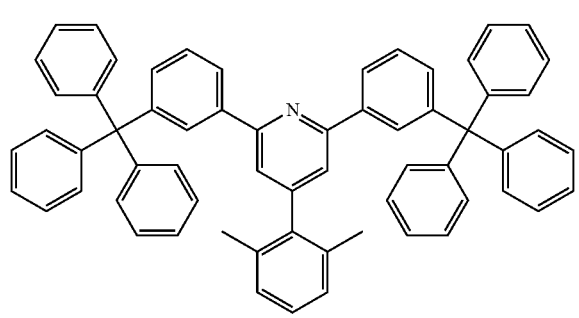
ETH38
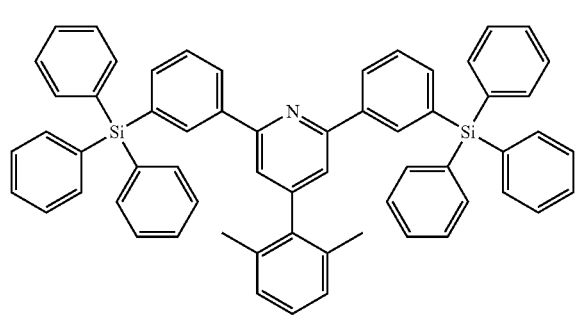
-continued
ETH39
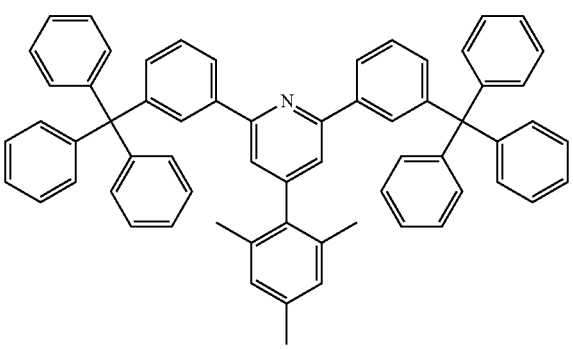
ETH40
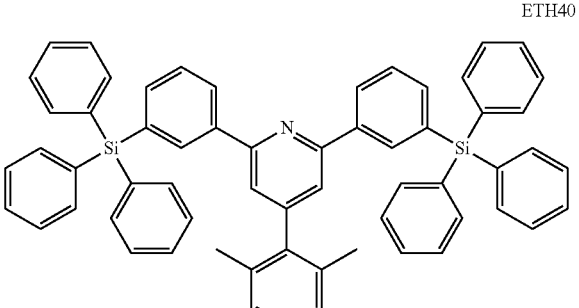
ETH41
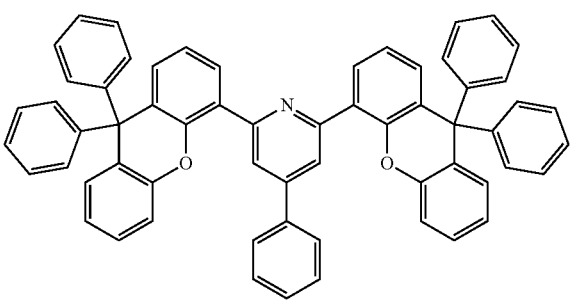
ETH42
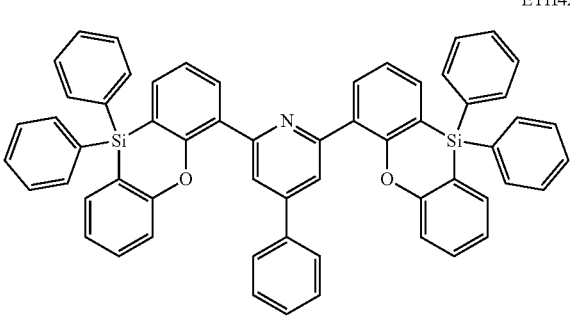

ETH43
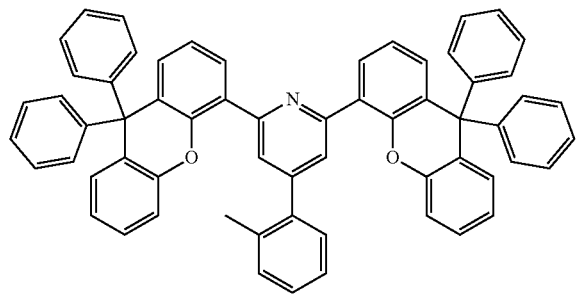
ETH44
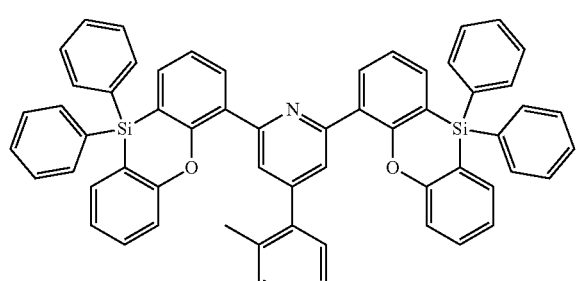
ETH45
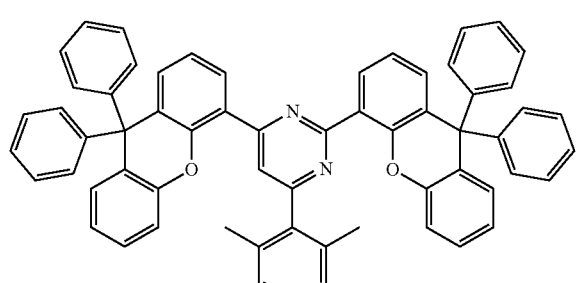
ETH46
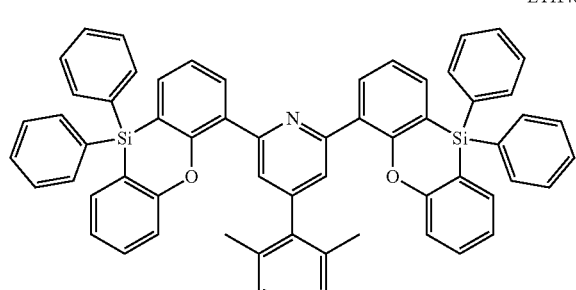
ETH47
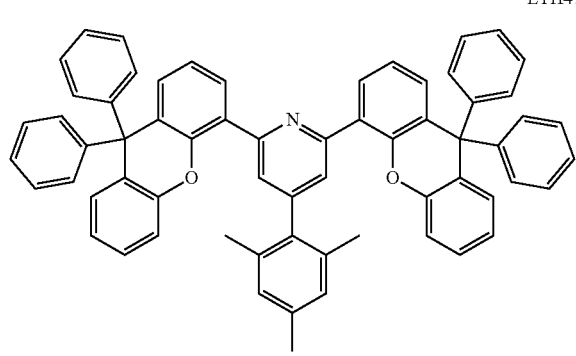
ETH48
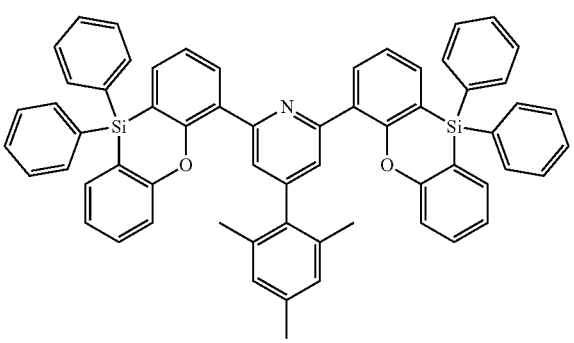
ETH49
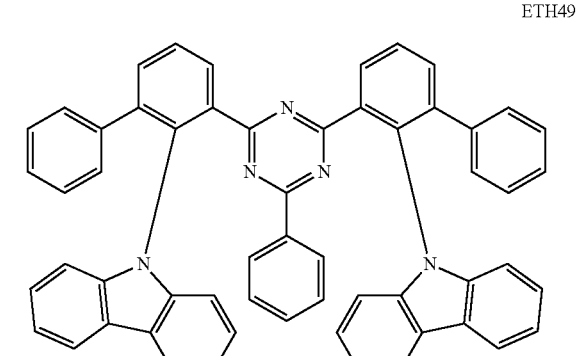
ETH50
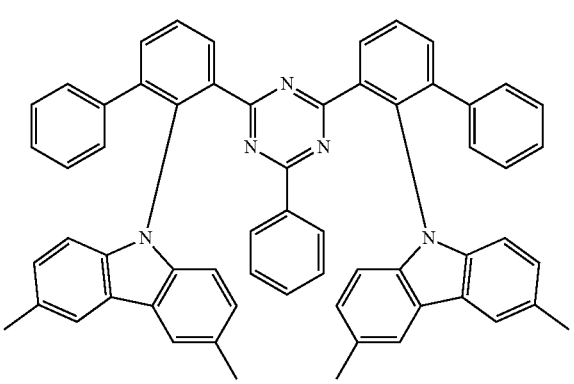
ETH51
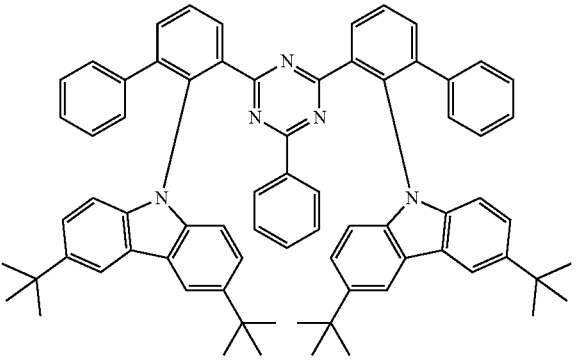

ETH52
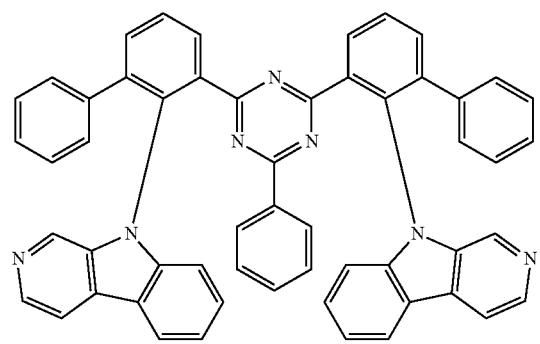
ETH56
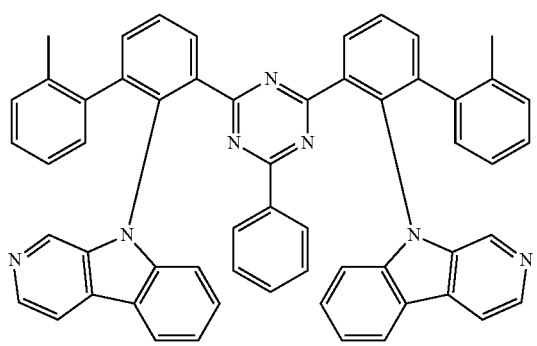
ETH53
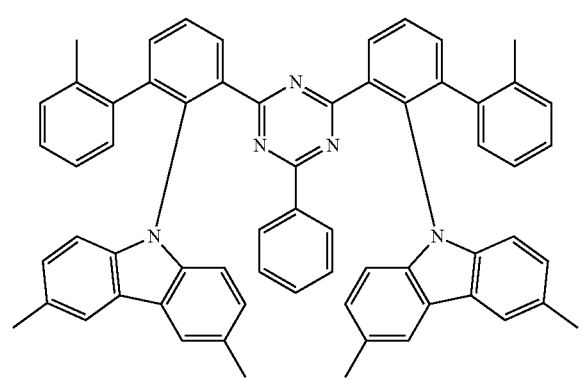
ETH57
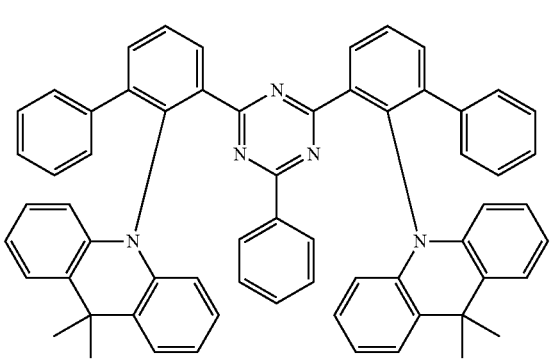
ETH54
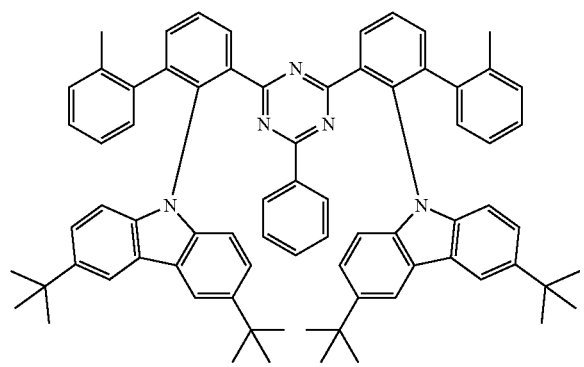
ETH58
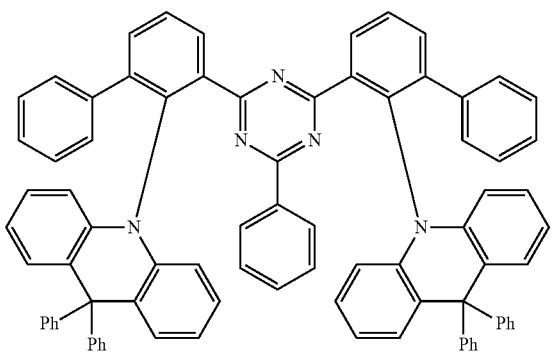
ETH55
ETH59
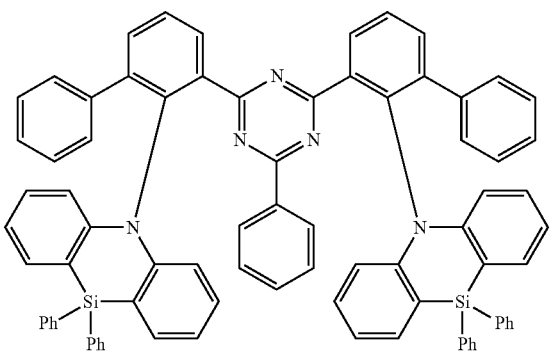

ETH60
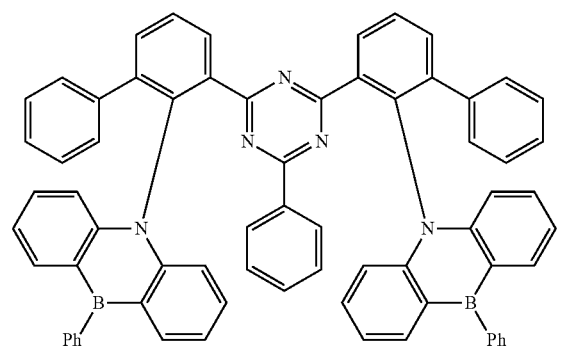
ETH64
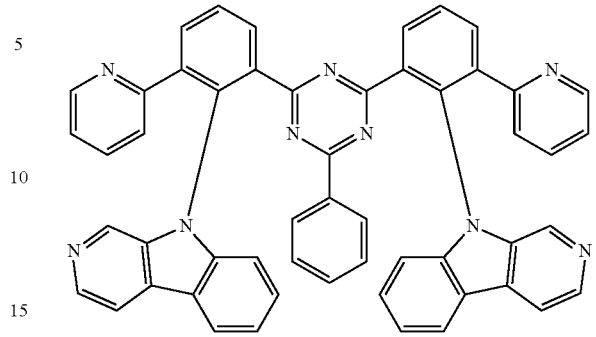
ETH61
ETH65
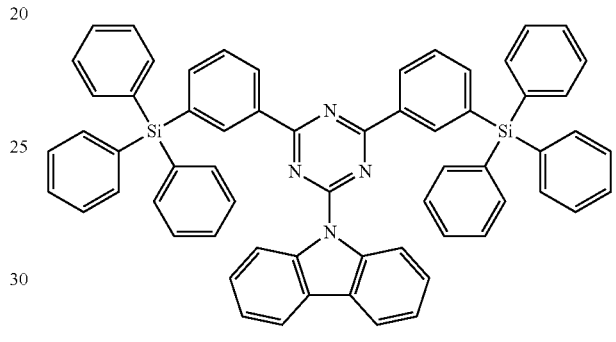
ETH62
ETH66
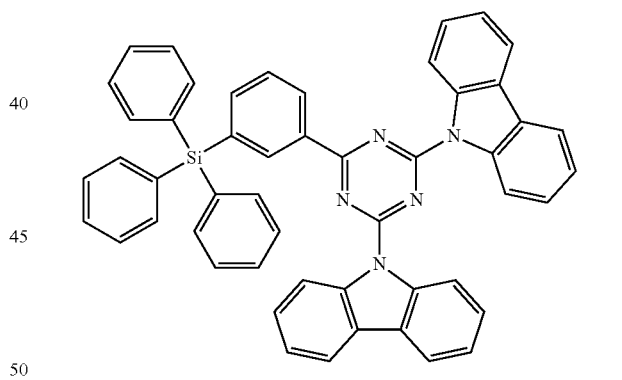
ETH63
ETH67
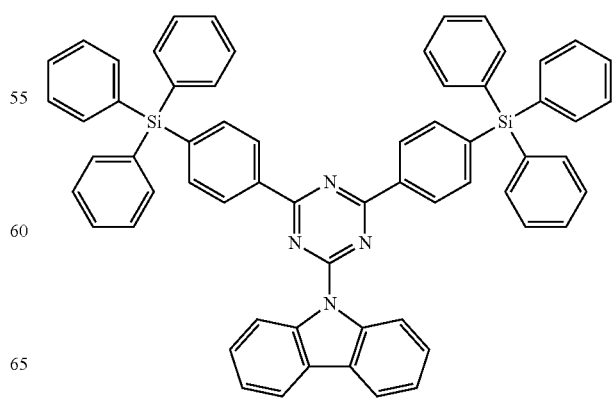

-continued
ETH68
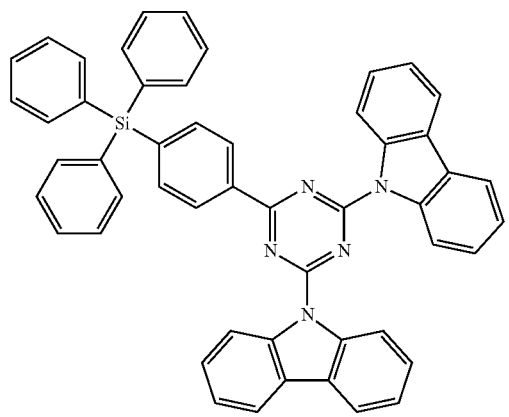
ETH69
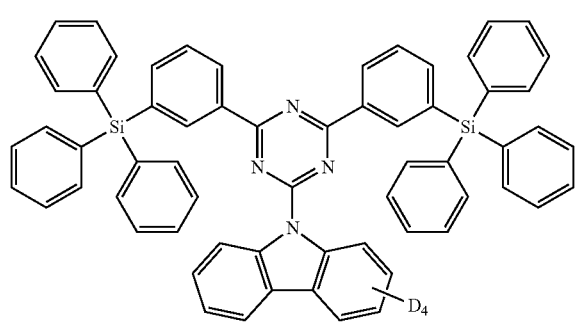
ETH70
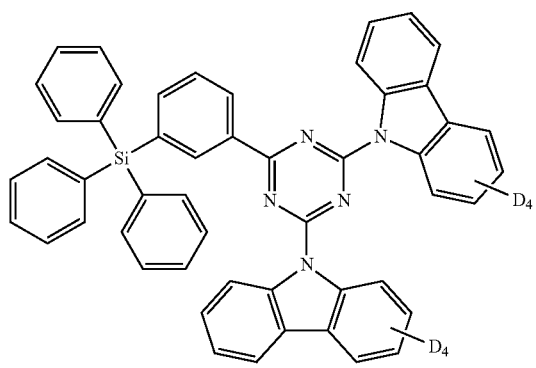
ETH71
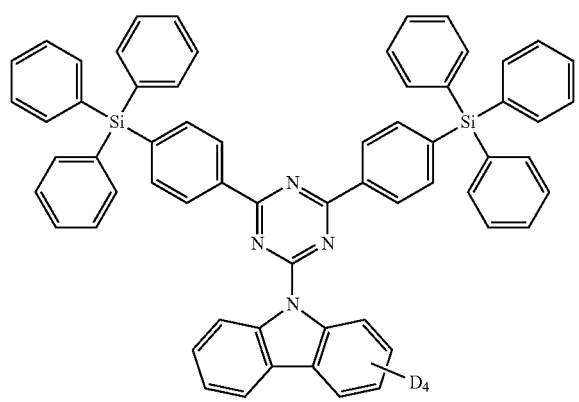
-continued
ETH72
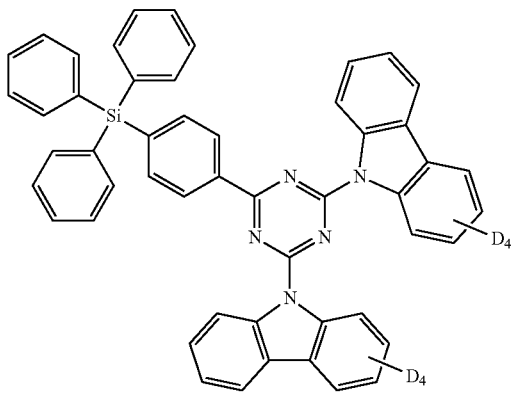
ETH73
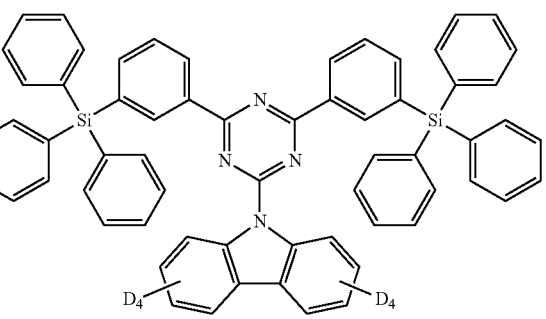
ETH74
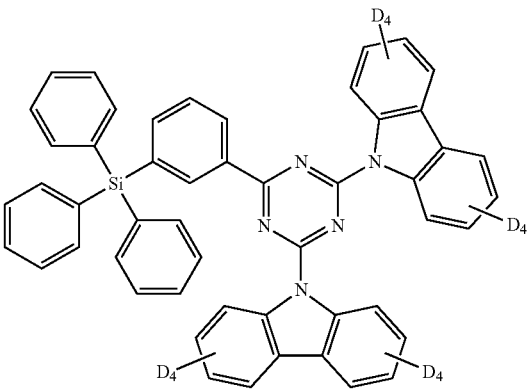
ETH75
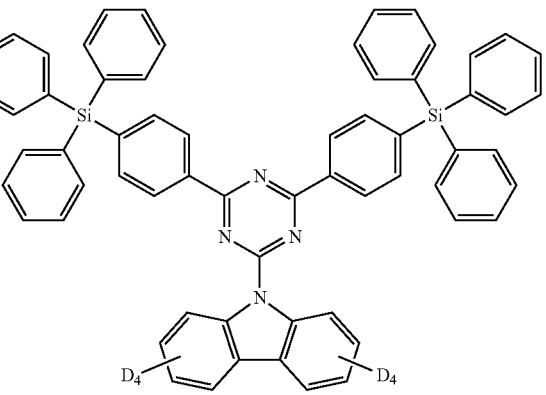

ETH76
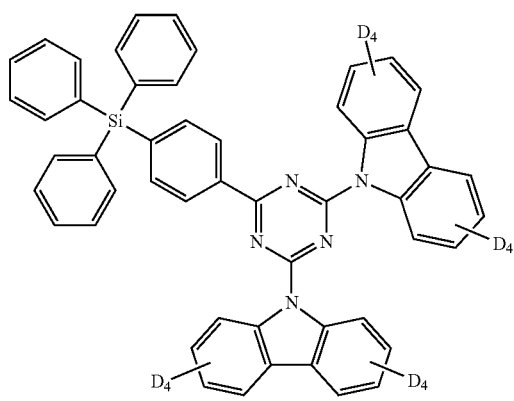
ETH79
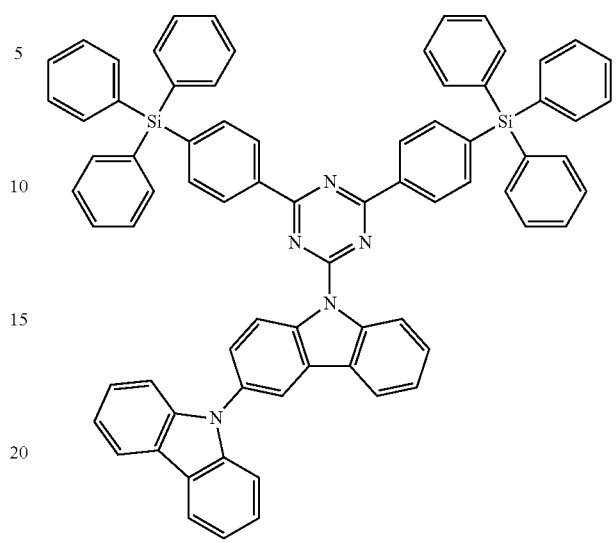
ETH77
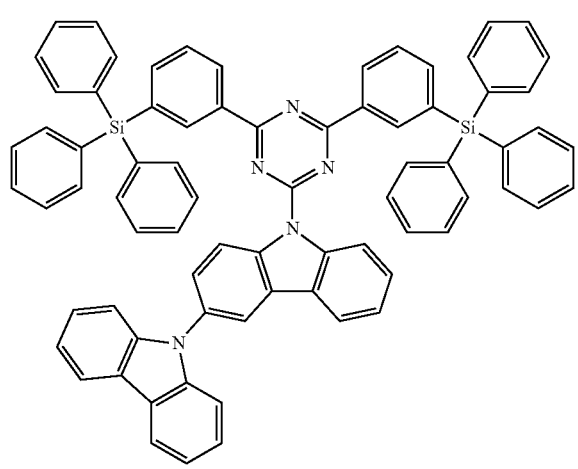
ETH80
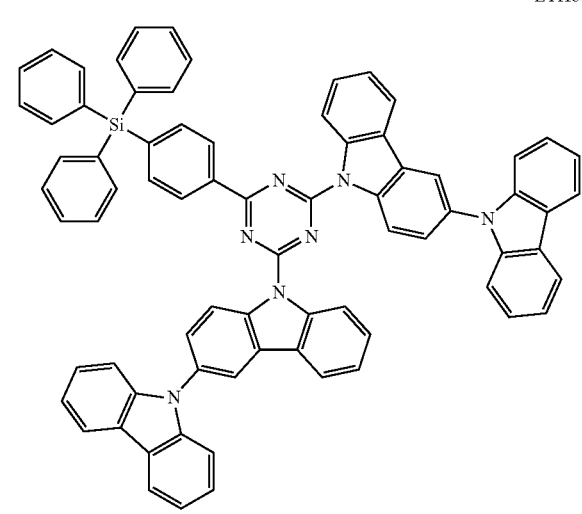
ETH78
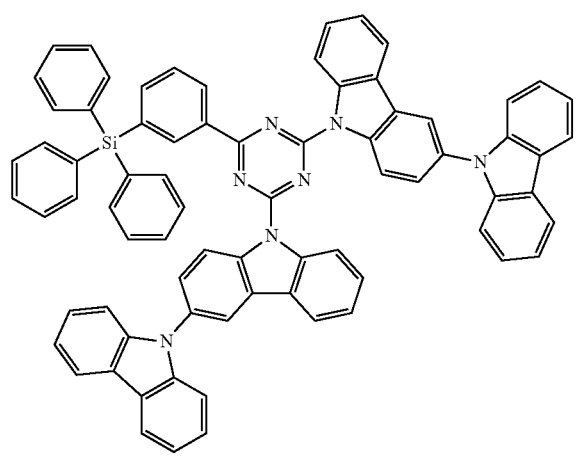
ETH81
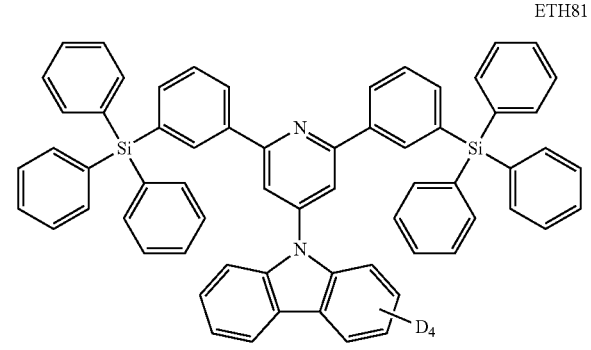

ETH82

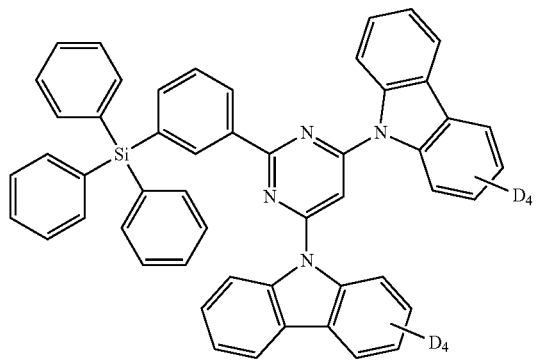

ETH83

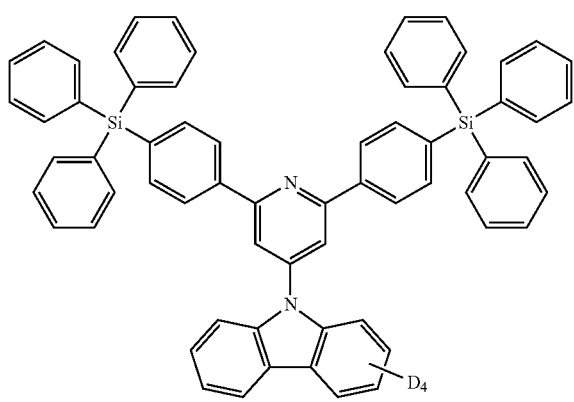

ETH84

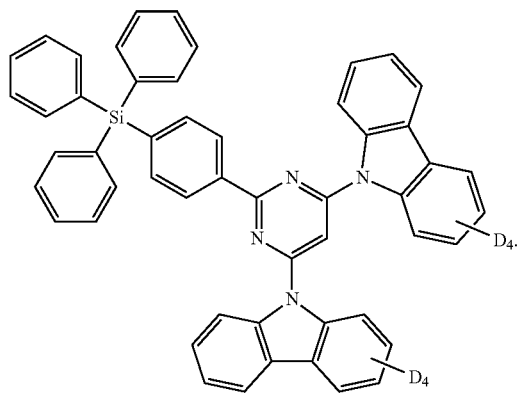

Formula 302

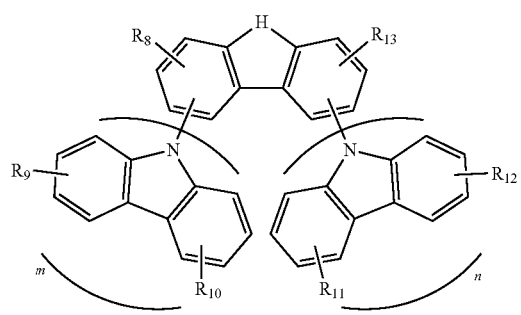

wherein, in Formula 302,
H may be O, S, substituted $NR_{14}$, or $CR_{15}R_{16}$,
m and n may each be an integer from 0 to 4, $R_8$, $R_9$, $R_{10}$, $R_{11}$, $R_{12}$, $R_{13}$, $R_{14}$, $R_{15}$, and $R_{16}$ may each independently be hydrogen, deuterium, halogen, nitrogen, oxygen, boron, silicon, sulfur, sulfur dioxide, phosphorus, phosphorus oxide, a $C_1$-$C_{10}$ alkyl group unsubstituted or substituted with at least one $R_{10a}$, a $C_3$-$C_{10}$ cycloalkyl group unsubstituted or substituted with at least one $R_{10a}$, a $C_3$-$C_{10}$ heterocycloalkyl group unsubstituted or substituted with at least one $R_{10a}$, a $C_3$-$C_{10}$ cycloalkenyl group unsubstituted or substituted with at least one $R_{10a}$, a $C_3$-$C_{10}$ heterocycloalkenyl group unsubstituted or substituted with at least one $R_{10a}$, a $C_6$-$C_{60}$ aryl group unsubstituted or substituted with at least one $R_{10a}$, a $C_2$-$C_{60}$ heteroaryl group unsubstituted or substituted with at least one $R_{10a}$, a non-aromatic condensed polycyclic group unsubstituted or substituted with at least one $R_{10a}$, or a non-aromatic condensed heteropolycyclic group unsubstituted or substituted with at least one $R_{10a}$. $R_{10a}$ is described in the following description.

In one or more embodiments, the compound represented by Formula 302 may be represented by one of the following compounds:

HTH1

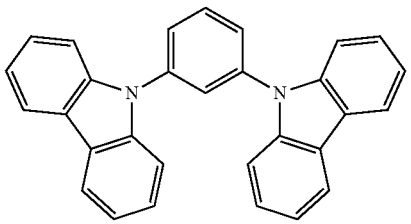

HTH2

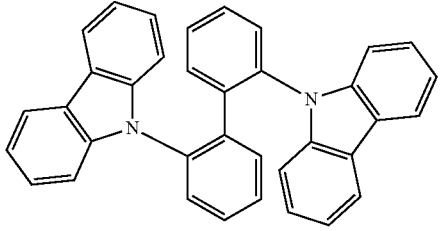

HTH3

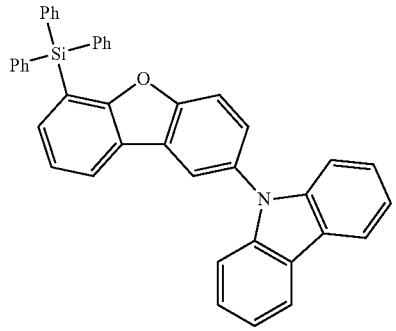

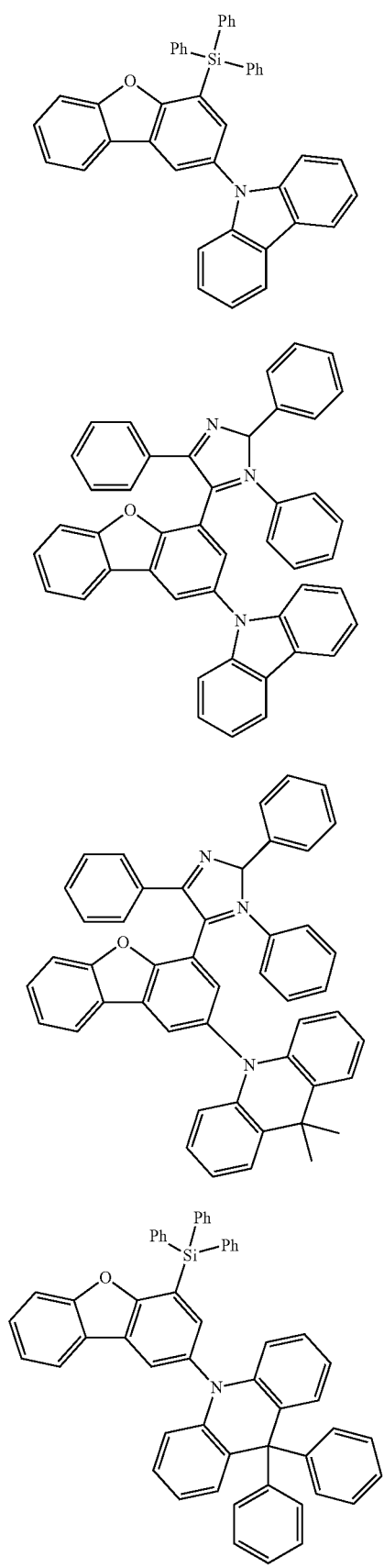
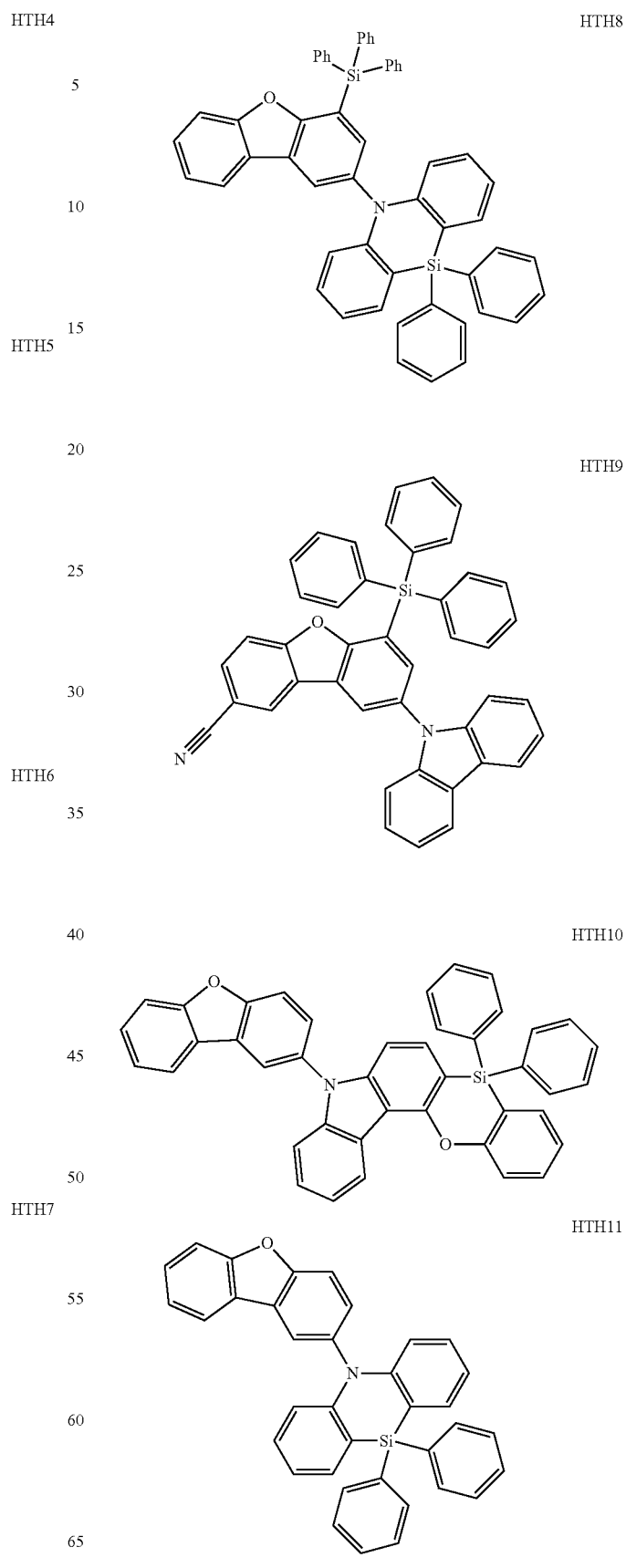

HTH12
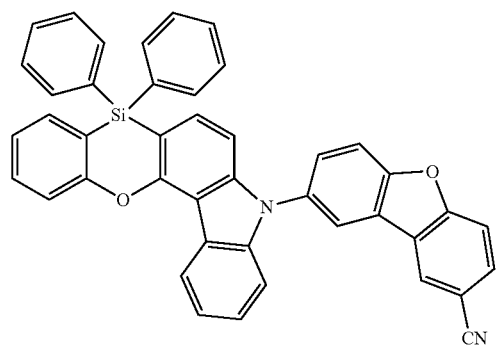
HTH13
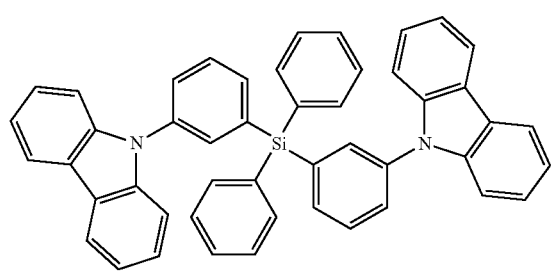
HTH14
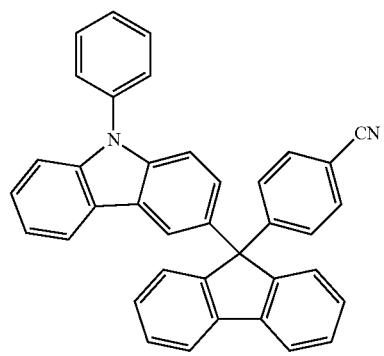
HTH15
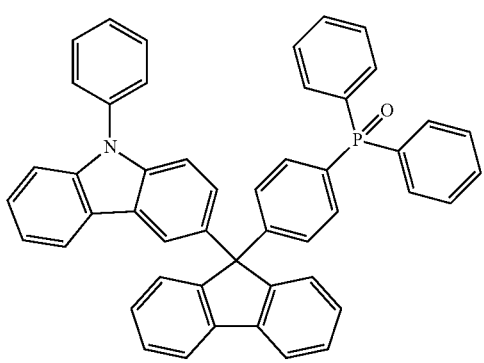
HTH16
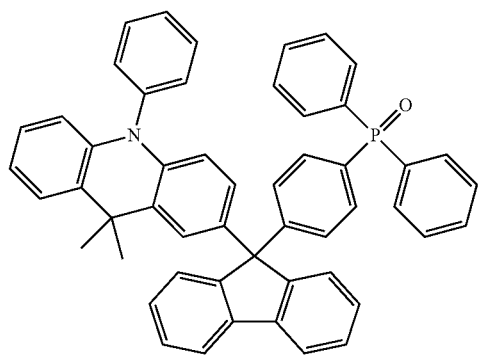
HTH17
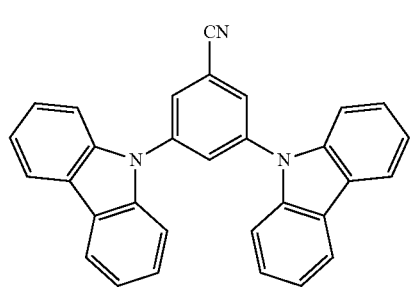
HTH18
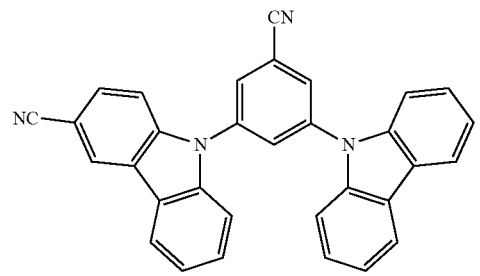
HTH19
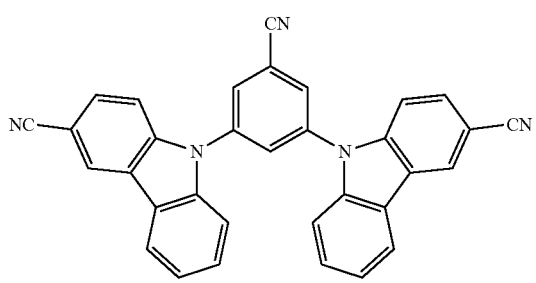
HTH20
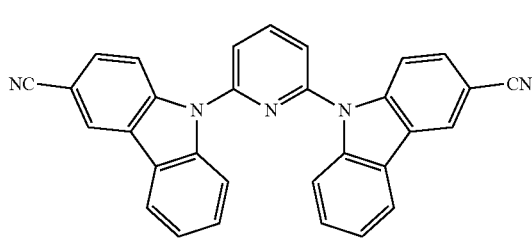

HTH21
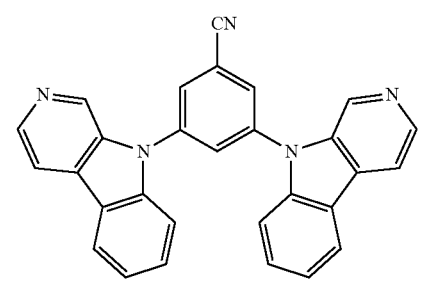
HTH22
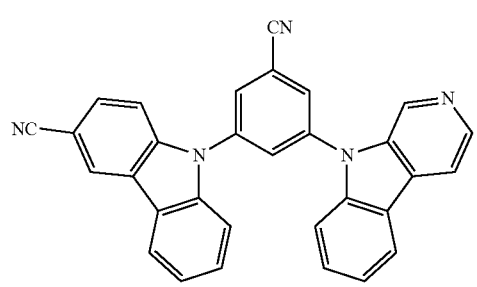
HTH23
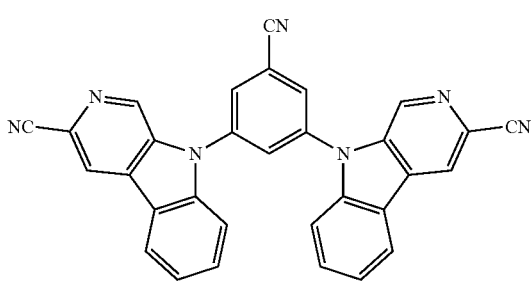
HTH24
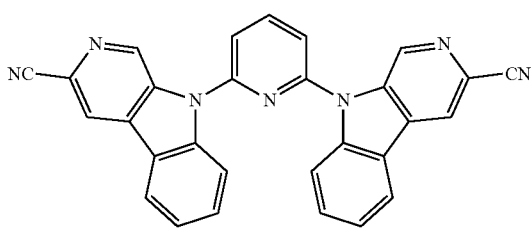
HTH25
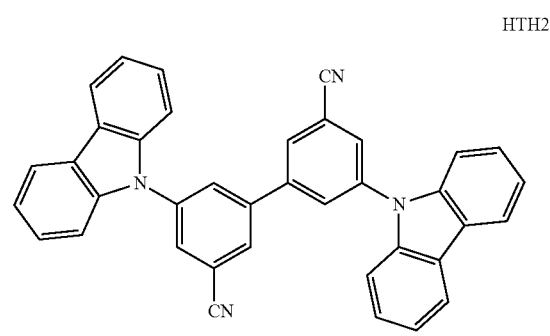
HTH26
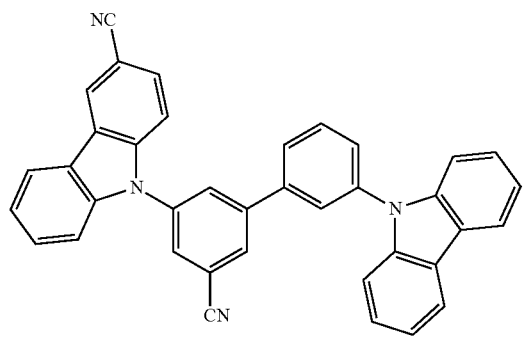
HTH27
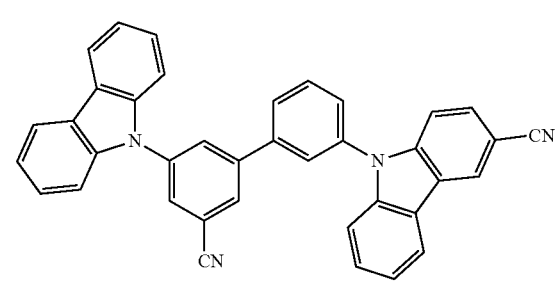
HTH28
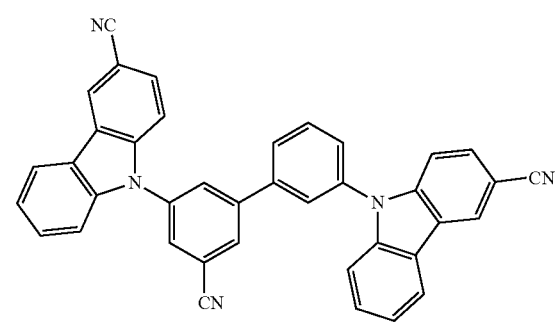
HTH29
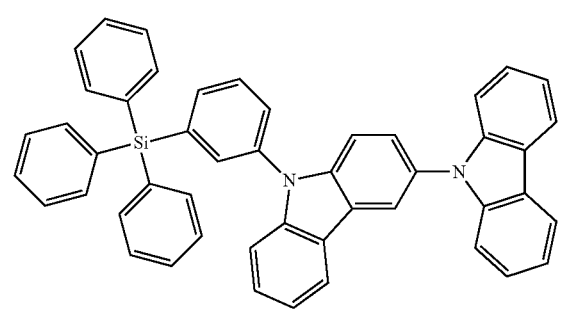

HTH30
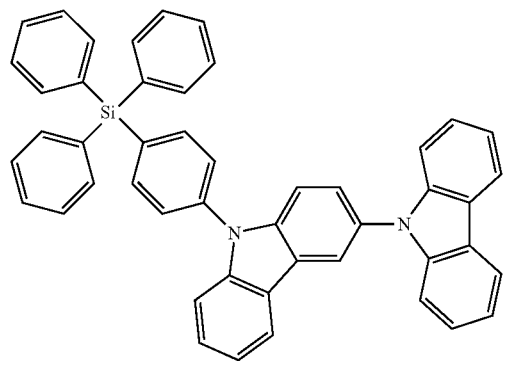
HTH31
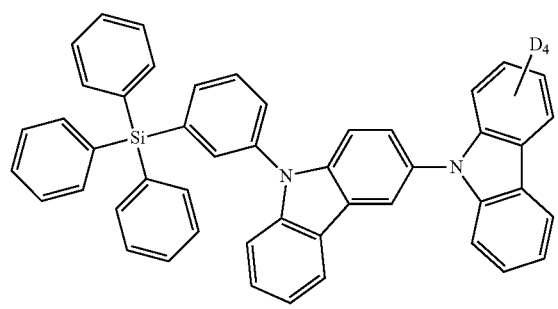
HTH32
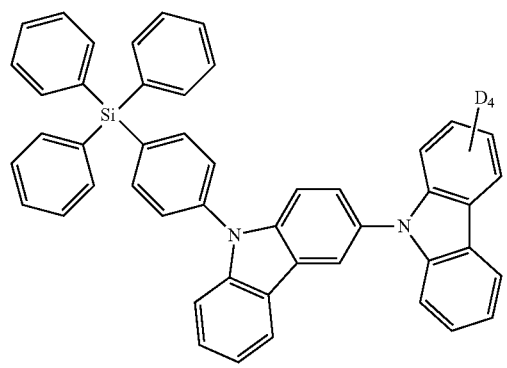
HTH33
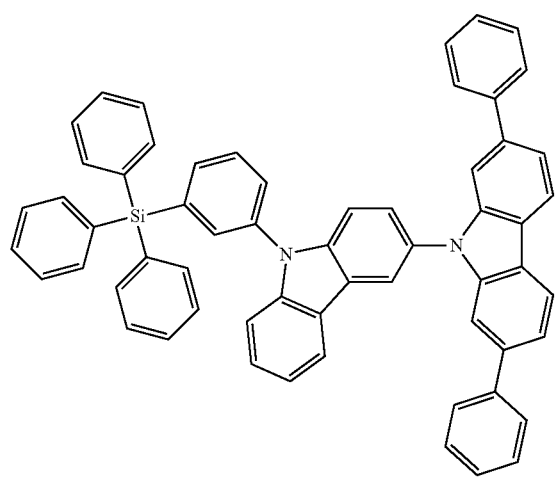
HTH34
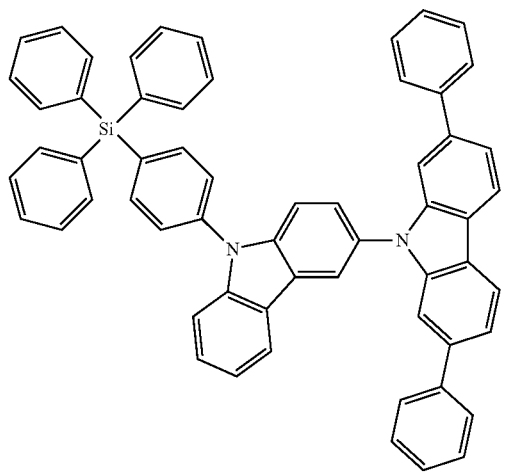
HTH35
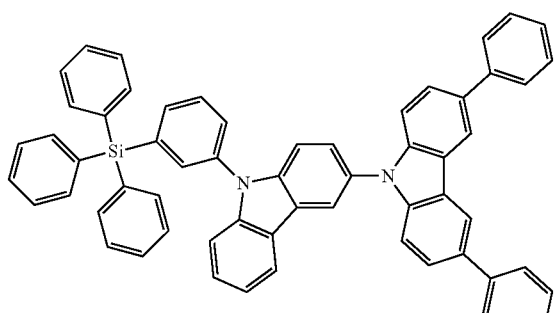
HTH36
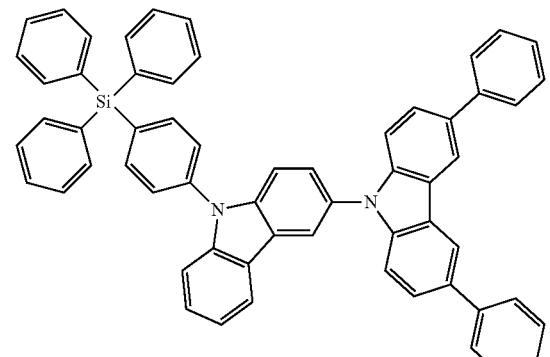
HTH37
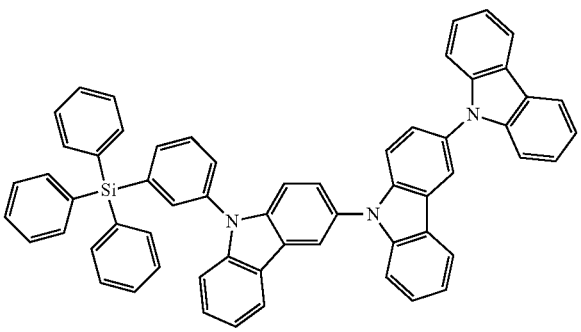

-continued

HTH38

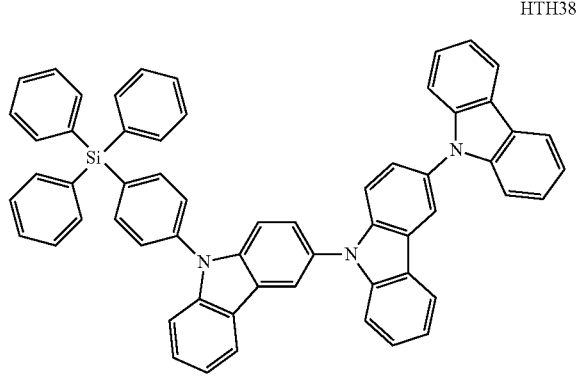

HTH39

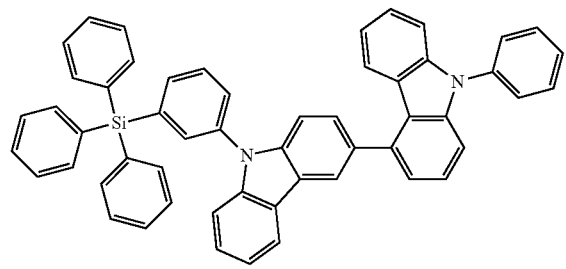

HTH40

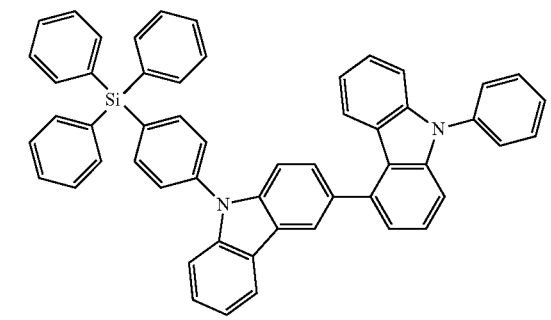

Phosphorescent Dopant

The phosphorescent dopant may include at least one transition metal as a center metal.

The phosphorescent dopant may include a monodentate ligand, a bidentate ligand, a tridentate ligand, a tetradentate ligand, a pentadentate ligand, a hexadentate ligand, or any combination thereof.

The phosphorescent dopant may be electrically neutral.

In some embodiments, the phosphorescent dopant may include an organometallic complex represented by Formula 401:

$$M(L_{401})_{xc1}(L_{402})_{xc2}$$ Formula 401

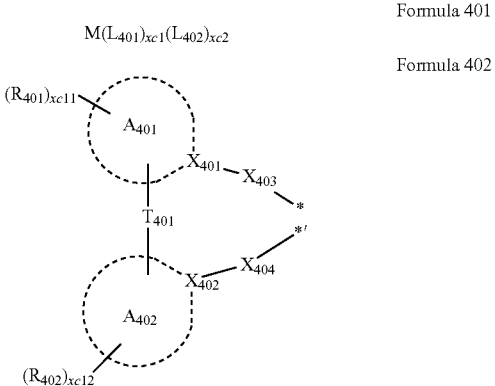

Formula 402 wherein, in Formulae 401 and 402,

M may be transition metal (e.g., iridium (Ir), platinum (Pt), palladium (Pd), osmium (Os), titanium (Ti), gold (Au), hafnium (Hf), europium (Eu), terbium (Tb), rhodium (Rh), rhenium (Re), or thulium (Tm)), $L_{401}$ may be a ligand represented by Formula 402, and xc1 may be 1, 2, or 3, and when xc1 is 2 or greater, at least two $L_{401}$(s) may be identical to or different from each other, $L_{402}$ may be an organic ligand, and xc2 may be an integer from 0 to 4, and when xc2 is 2 or greater, at least two $L_{402}$(s) may be identical to or different from each other, $X_{401}$ and $X_{402}$ may each independently be nitrogen or carbon, ring $A_{401}$ and ring $A_{402}$ may each independently be a $C_3$-$C_{60}$ carbocyclic group or a $C_1$-$C_{60}$ heterocyclic group, $T_{401}$ may be a single bond, —O—, —S—, —C(=O)—, —N($Q_{411}$)-, —C($Q_{411}$)($Q_{412}$)-, —C($Q_{411}$)=C($Q_{412}$)-, —C($Q_{411}$)=, or =C($Q_{411}$)=, $X_{403}$ and $X_{404}$ may each independently be a chemical bond (e.g., a covalent bond or a coordinate bond), O, S, N($Q_{413}$), B($Q_{413}$), P($Q_{413}$), C($Q_{413}$)($Q_{414}$), or Si($Q_{413}$)($Q_{414}$), $Q_{411}$ to $Q_{414}$ may each be understood by referring to the description of $Q_1$ provided herein, $R_{401}$ and $R_{402}$ may each independently be hydrogen, deuterium, —F, —Cl, —Br, —I, a hydroxyl group, a cyano group, a nitro group, a $C_1$-$C_{20}$ alkyl group unsubstituted or substituted with at least one $R_{10a}$, a $C_1$-$C_{20}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{401}$)($Q_{402}$)($Q_{403}$), —N($Q_{401}$)($Q_{402}$), —B($Q_{401}$)($Q_{402}$), —C(=O)($Q_{401}$), —S(=O)$_2$($Q_{401}$), or —P(=O)($Q_{401}$)($Q_{402}$), $Q_{401}$ to $Q_{403}$ may each be understood by referring to the description of $Q_1$ provided herein, xc11 and xc12 may each independently be an integer from 0 to 10, and

* and *' in Formula 402 each indicate a binding site to M in Formula 401.

In one or more embodiments, in Formula 402, i) $X_{401}$ may be nitrogen, and $X_{402}$ may be carbon, or ii) $X_{401}$ and $X_{402}$ may both be nitrogen.

In one or more embodiments, when xc1 in Formula 402 is 2 or greater, two ring $A_{401}$(s) of at least two $L_{401}$(s) may optionally be bound via $T_{402}$ as a linking group, or two ring $A_{402}$(s) may optionally be bound via $T_{403}$ as a linking group (see Compounds PD1 to PD4 and PD7). $T_{402}$ and $T_{403}$ may each be understood by referring to the description of $T_{401}$ provided herein.

$L_{402}$ in Formula 401 may be any suitable organic ligand. For example, $L_{402}$ may be a halogen group, a diketone group (e.g., an acetylacetonate group), a carboxylic acid group (e.g., a picolinate group), —C(═O), an isonitrile group, —CN, or a phosphorus group (e.g., a phosphine group or a phosphite group).

Formula 401 may be represented by Formula 403:

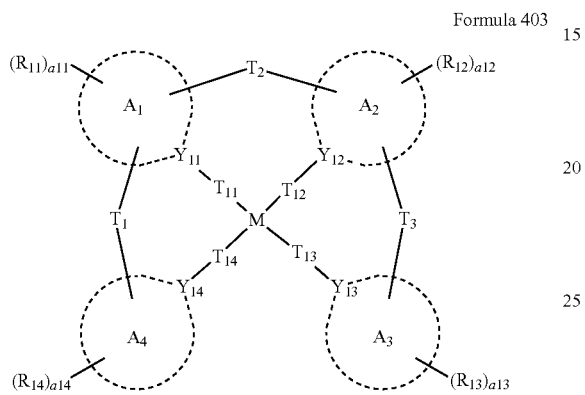

Formula 403 wherein, in Formula 403, M may be understood by referring to the description of M in Formula 401, $Y_{11}$ to $Y_{14}$ may each independently be N or C, $T_{11}$ to $T_{14}$ may each independently be a chemical bond, O, S, B(R'), N(R'), P(R'), C(R')(R''), Si(R')(R''), Ge(R')(R''), C(═O), B(R')(R''), N(R')(R''), or P(R')(R''), $T_1$ may be a single bond, a double bond, *—N($R_{15}$)—*', *—B($R_{15}$)—*', *—P($R_{15}$)—*', *—C($R_{15a}$)($R_{15b}$)—*', *—Si($R_{15a}$)($R_{15b}$)—*', *—Ge($R_{15a}$)($R_{15b}$)—*', *—S—*', *—Se—*', *—O—*', *—C(═O)—*', *—S(═O)—*', *—S(═O)$_2$—*', *—C($R_{15}$)═*', *═C($R_{15}$)—*', *—C($R_{15a}$)═C($R_{15b}$)—*', *—C(═S)—*', or *—C≡C—*', $T_2$ may be a single bond, a double bond, *—N($R_{16}$)—*', *—B($R_{16}$)—*', *—P($R_{16}$)—*', *—C($R_{16a}$)($R_{16b}$)—*', *—Si($R_{16a}$)($R_{16b}$)—*', *—Ge($R_{16a}$)($R_{16b}$)—*', *—Se—*', *—C(═O)—*', *—S(═O)—*', *—S(═O)$_2$—*', *—C($R_{16}$)═*', *═C($R_{16}$)—*', *—C($R_{16a}$)═C($R_{16b}$)—*', *—C(═S)—*', or *—C≡C—*', and $R_{16a}$ and $R_{16b}$ may be bound to each other to form a ring, $T_3$ may be a single bond, a double bond, *—N($R_{17}$)—*', *—B($R_{17}$)—*', *—P($R_{17}$)—*', *—C($R_{17a}$)($R_{17b}$)—*', *—Si($R_{17a}$)($R_{17b}$)—*', *—Ge($R_{17a}$)($R_{17b}$)—*', *—S—*', *—Se—*', *—O—*', *—C(═O)—*', *—S(═O)—*', *—S(═O)$_2$—*', *—C($R_{17}$)═*', *═C($R_{17}$)—*', *—C($R_{17a}$)═C($R_{17b}$)—*', *—C(═S)—*', or *—C≡C—*', rings $A_1$ to $A_4$ may each independently be a $C_5$-$C_{30}$ carbocyclic group or a $C_1$-$C_{30}$ heterocyclic group, a11 to a15 may each independently be an integer from 0 to 20, $R_{11}$ to $R_{17}$, $R_{15a}$, $R_{15b}$, $R_{16a}$, $R_{16b}$, $R_{17a}$, $R_{17b}$, R', and R'' may each independently be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{10}$ cycloalkyl group unsubstituted or substituted with at least one $R_{10a}$, a $C_1$-$C_{10}$ heterocycloalkyl group unsubstituted or substituted with at least one $R_{10a}$, a $C_3$-$C_{10}$ cycloalkenyl group unsubstituted or substituted with at least one $R_{10a}$, a $C_1$-$C_{10}$ heterocycloalkenyl group unsubstituted or substituted with at least one $R_{10a}$, a $C_6$-$C_{60}$ aryl group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, a $C_1$-$C_{60}$ heteroaryl group unsubstituted or substituted with at least one $R_{10a}$, a monovalent non-aromatic condensed polycyclic group unsubstituted or substituted with at least one $R_{10a}$, a monovalent non-aromatic condensed heteropolycyclic group unsubstituted or substituted with at least one $R_{10a}$, —Si($Q_1$)($Q_2$)($Q_3$), —N($Q_1$)($Q_2$), —B($Q_1$)($Q_2$), —P($Q_1$)($Q_2$), —C(═O)($Q_1$), —S(═O)$_2$($Q_1$), or —P(═O)($Q_1$)($Q_2$), wherein $Q_1$ to $Q_3$ may be understood by referring to the descriptions of $Q_i$ to $Q_3$ provided herein, and and *' each indicate a binding site to an adjacent atom.

The phosphorescent dopant may be, for example, one of Compounds PD1 to PD28 or any combination thereof:

PD1

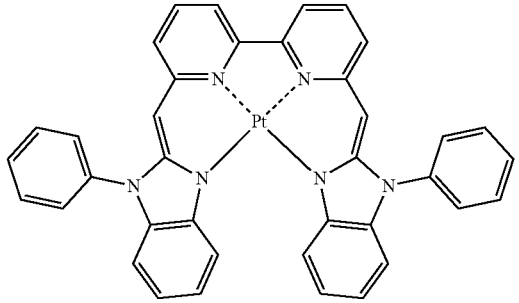

PD2

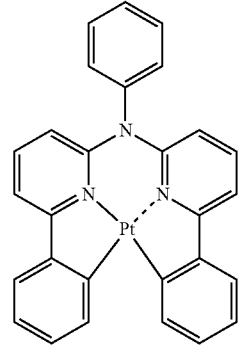

PD3

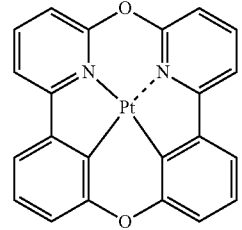

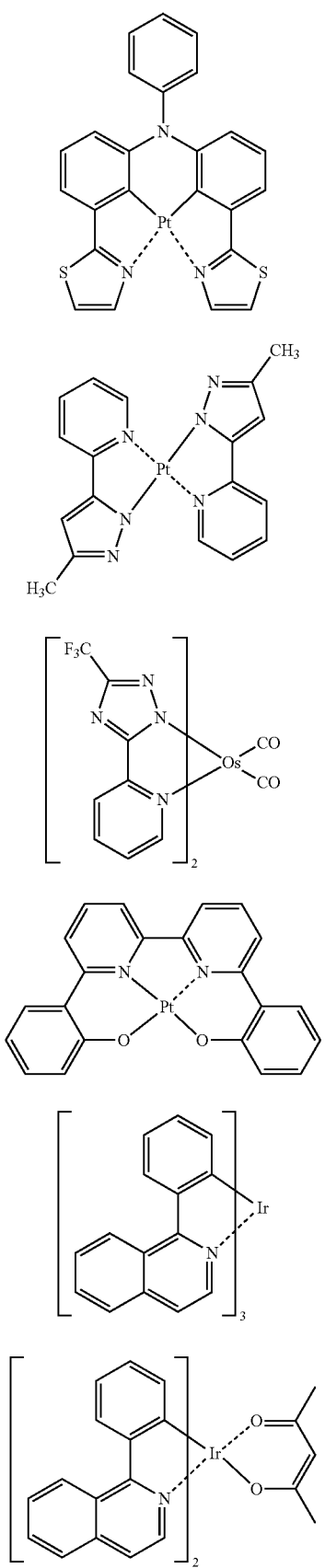
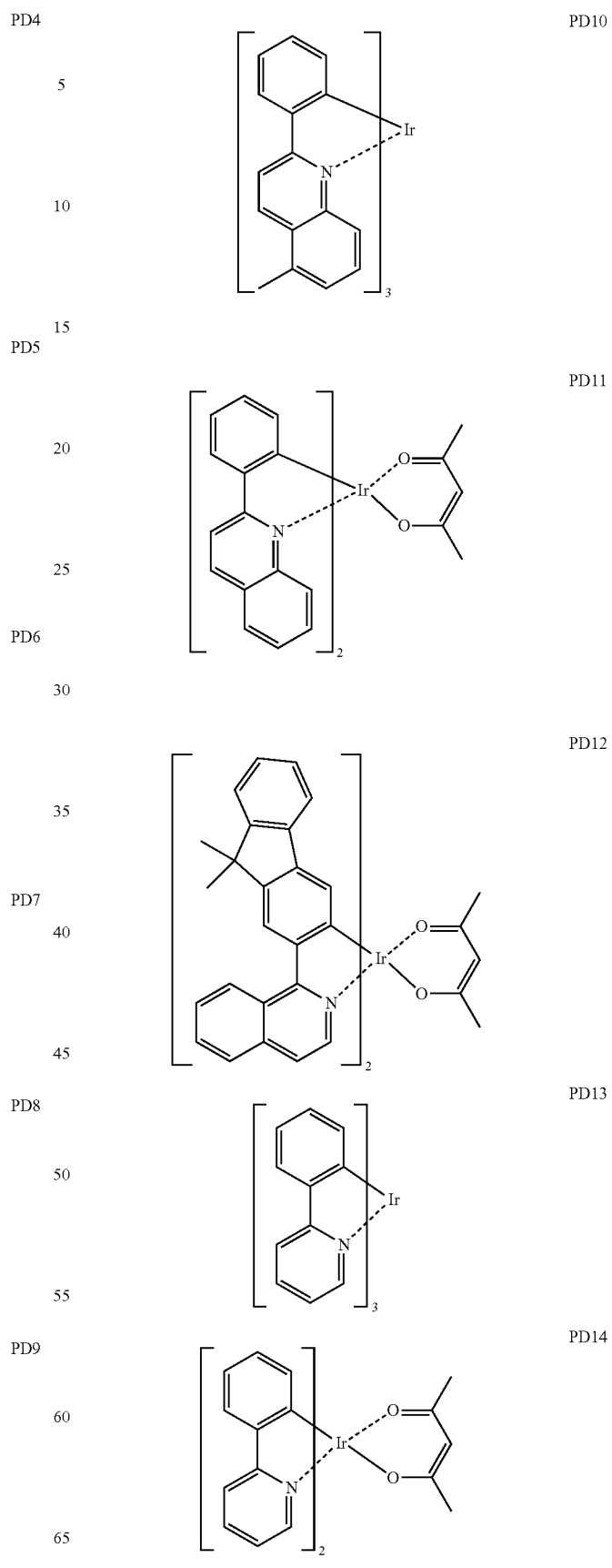

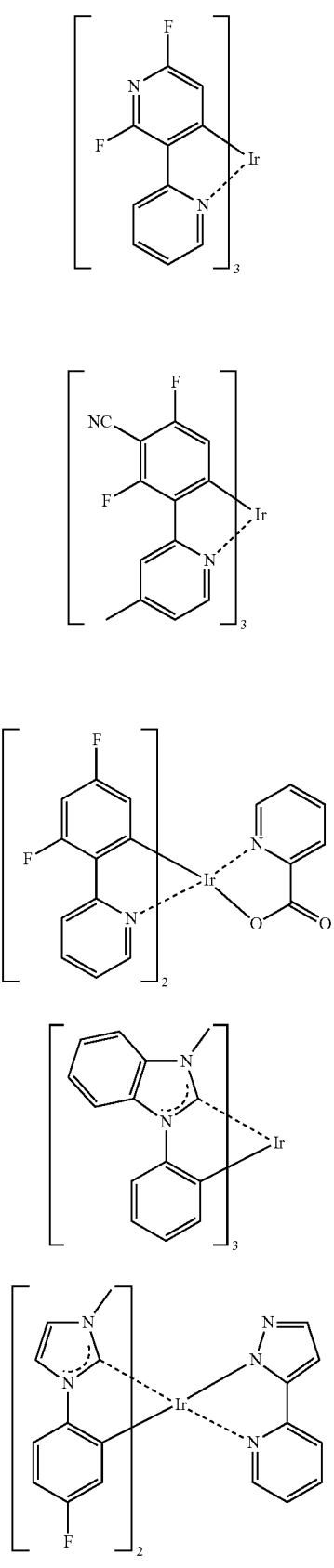
PD15
PD16
PD17
PD18
PD19
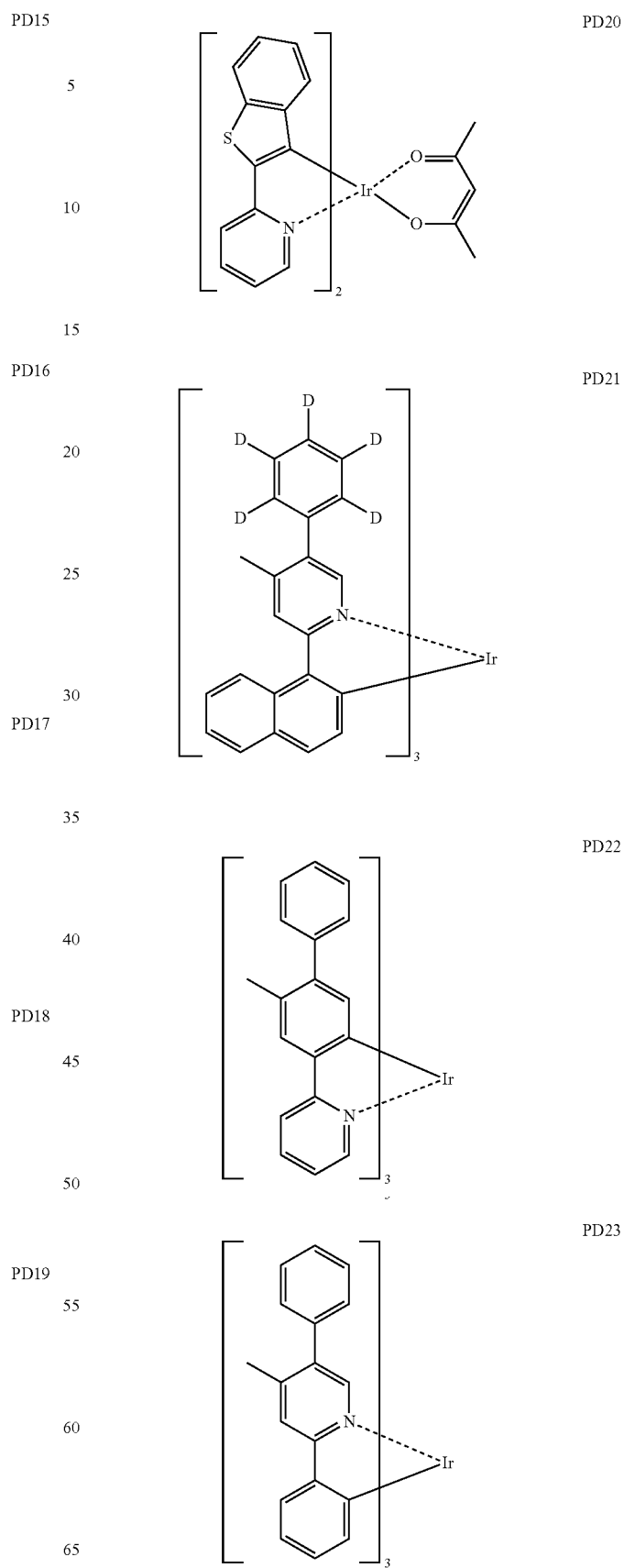
PD20
PD21
PD22
PD23

PD24
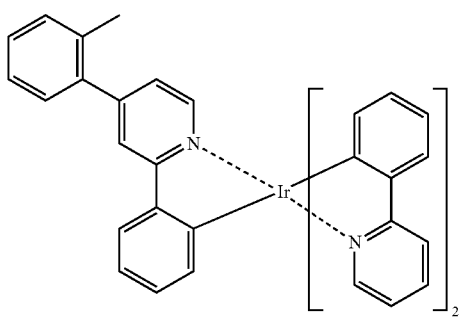

PD25
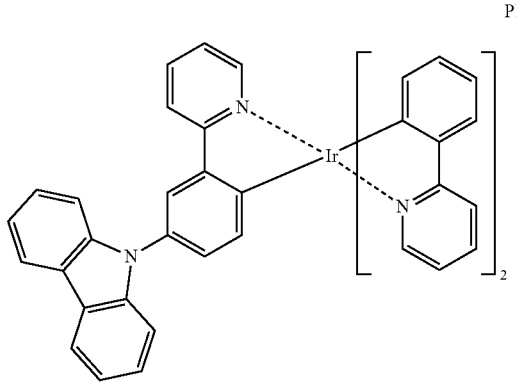

PD26
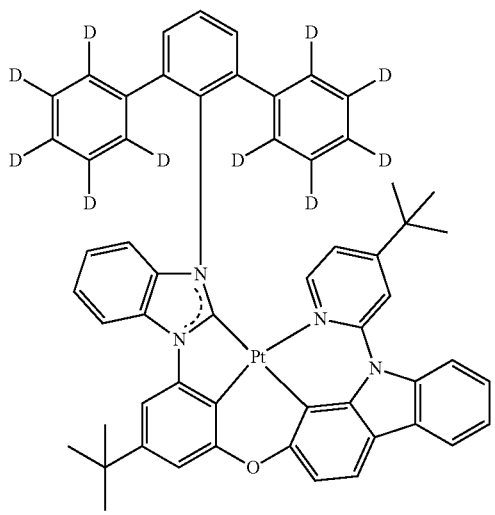

PD27
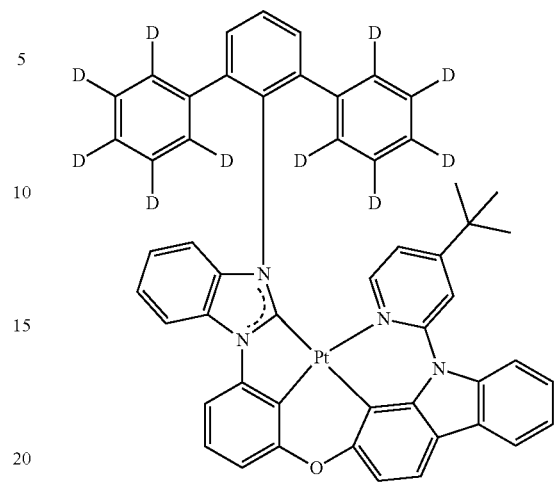

PD28
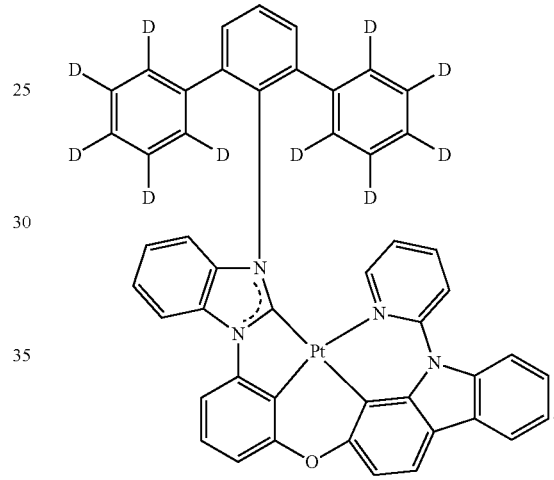

Fluorescent Dopant

The fluorescent dopant may include an amine group-containing compound, a styryl group-containing compound, or any combination thereof.

In some embodiments, the fluorescent dopant may include a compound represented by Formula 501:

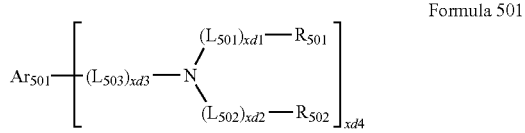

Formula 501 wherein, in Formula 501,
$Ar_{501}$, $L_{501}$ to $L_{503}$, $R_{501}$, and $R_{502}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$,
xd1 to xd3 may each independently be 0, 1, 2, or 3, and
xd4 may be 1, 2, 3, 4, 5, or 6.

In some embodiments, in Formula 501, $Ar_{501}$ may include a condensed ring group (e.g., an anthracene group, a chrysene group, or a pyrene group) in which at least three monocyclic groups are condensed.

In some embodiments, xd4 in Formula 501 may be 2.
In some embodiments, the fluorescent dopant may include one of Compounds FD1 to FD36, DPVBi, DPAVBi, or any combination thereof:
FD1
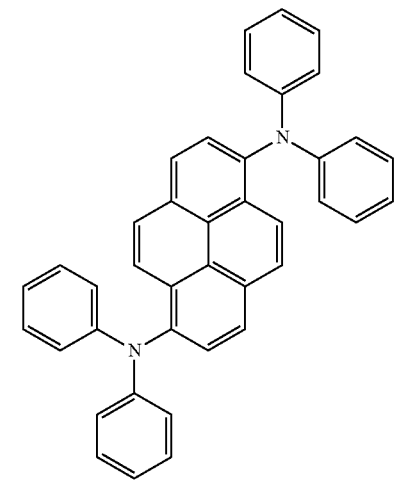
FD2
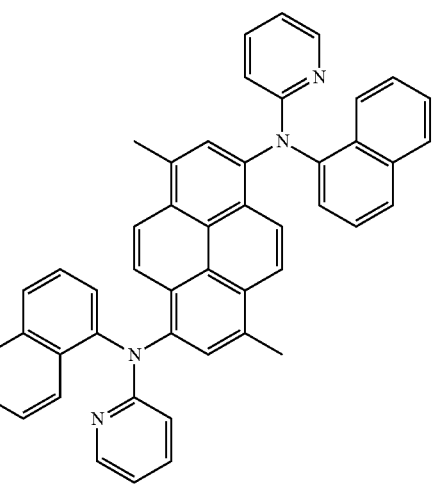
FD3
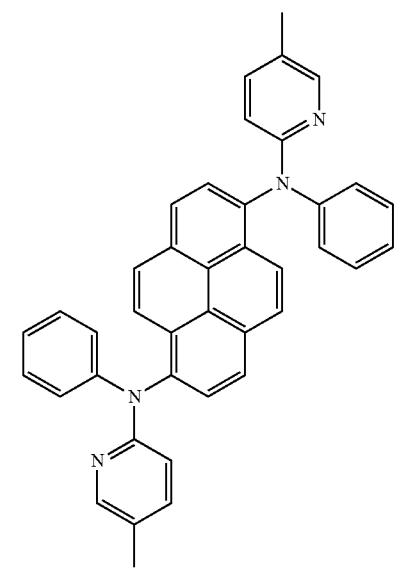
FD4
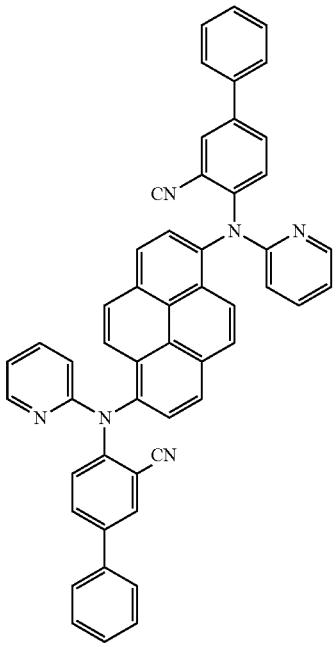
FD5
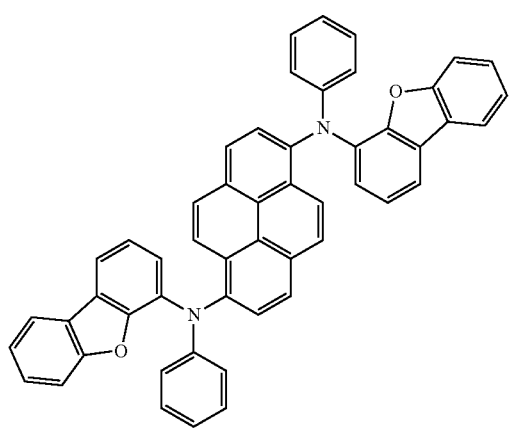
FD6
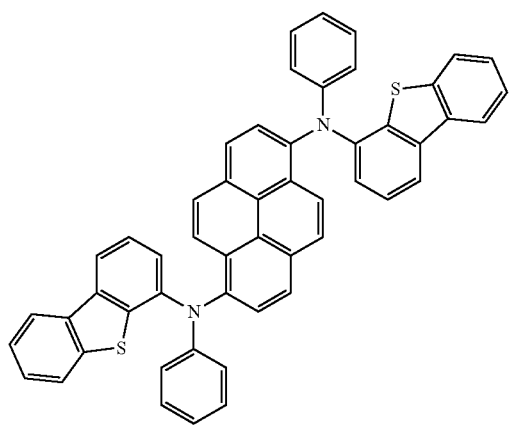

FD7
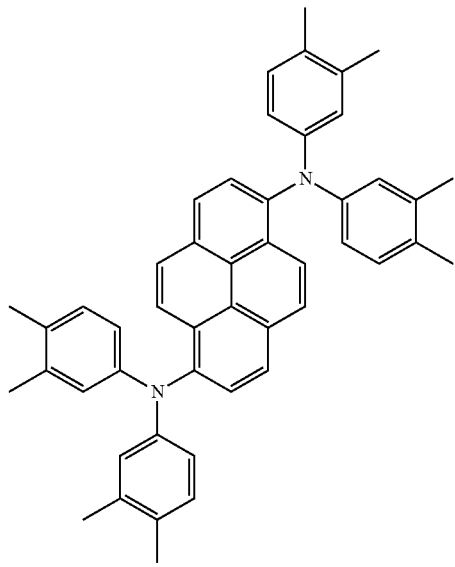
FD8
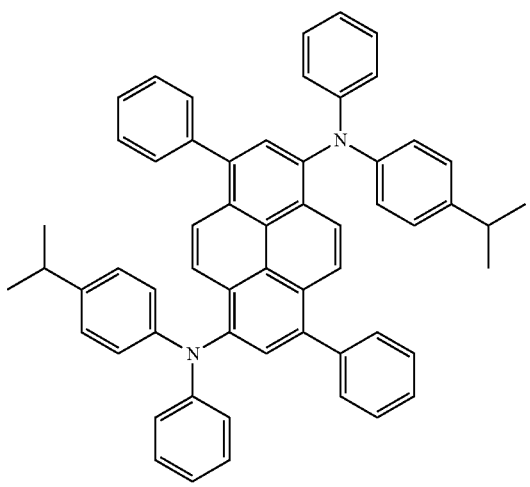
FD9
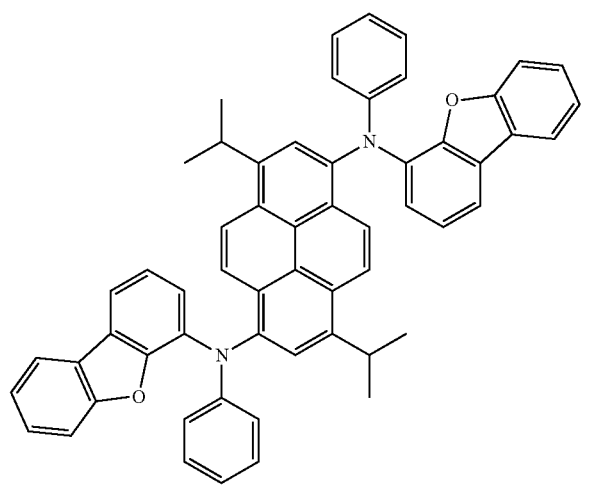
FD10
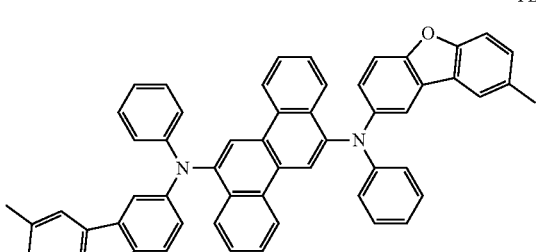
FD11
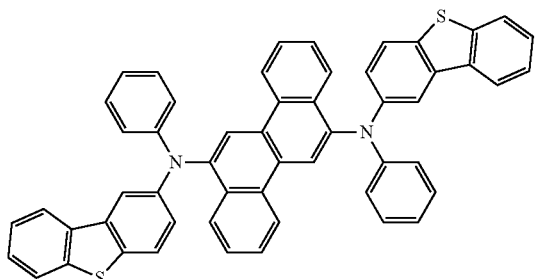
FD12
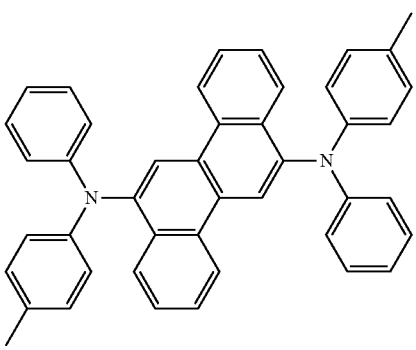
FD13
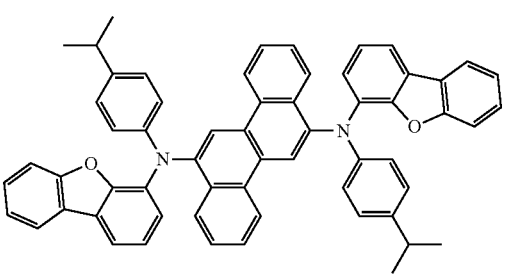
FD14
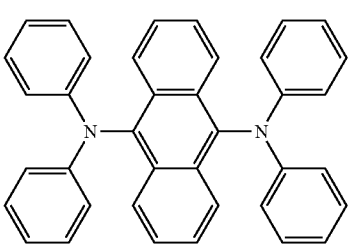

FD15
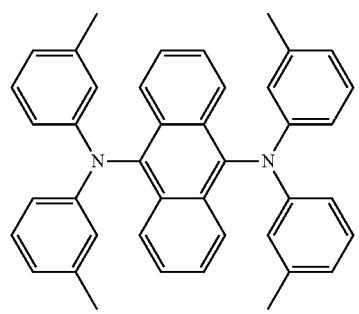
FD16
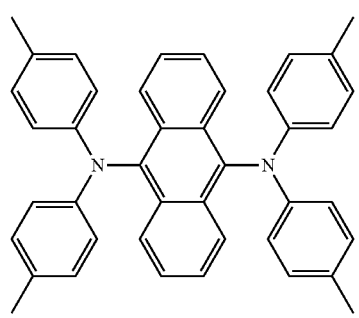
FD17
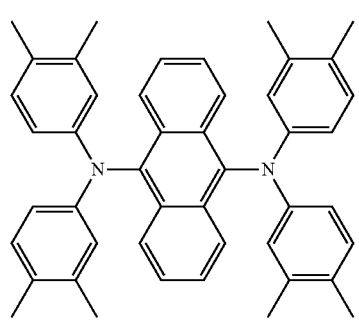
FD18
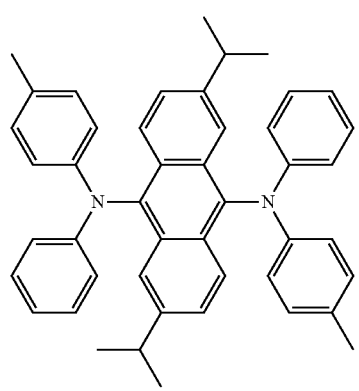
FD19
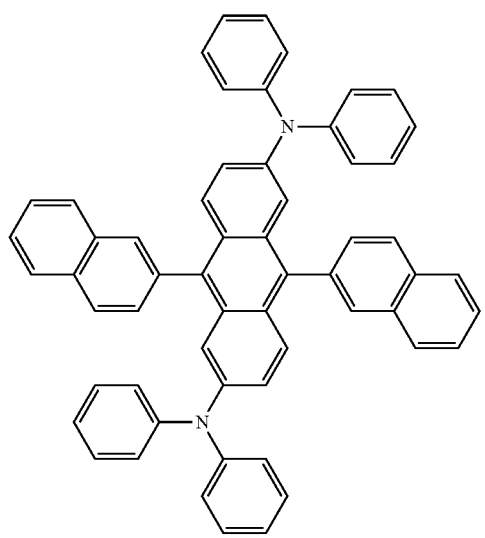
FD20
FD21
FD22
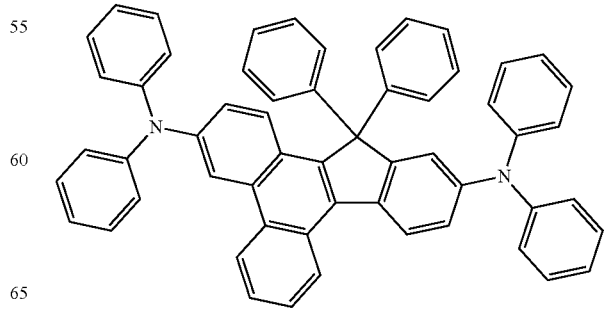

FD23
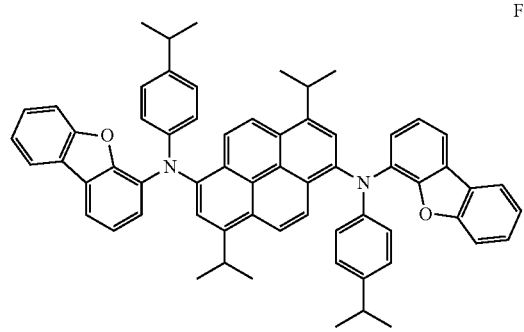
FD27
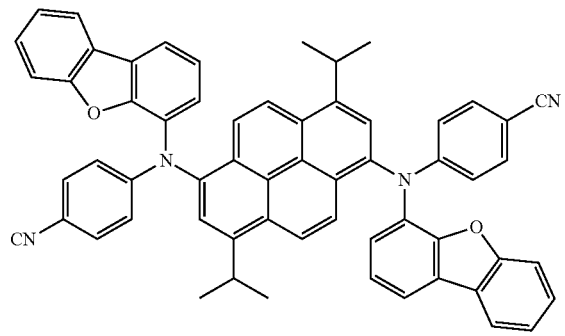
FD24
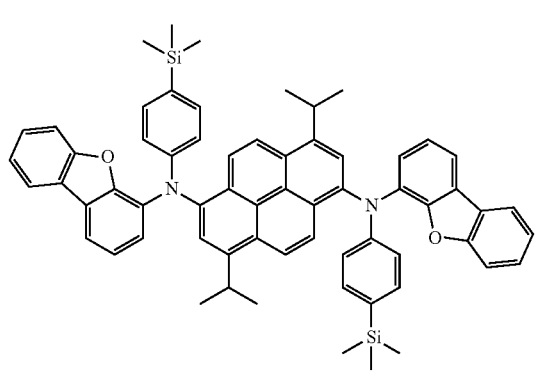
FD28
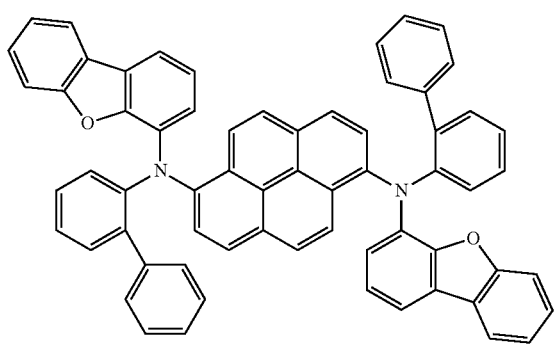
FD25
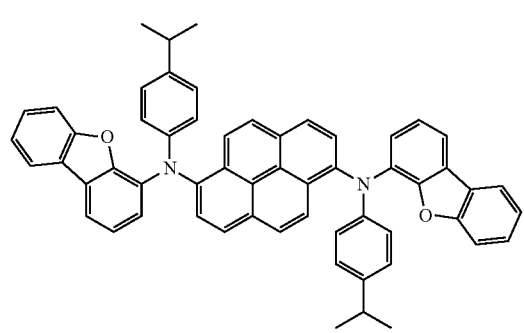
FD29
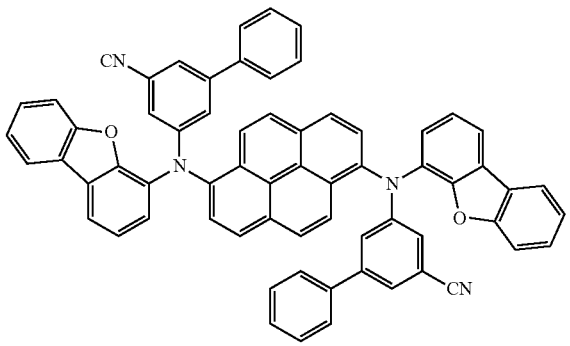
FD26
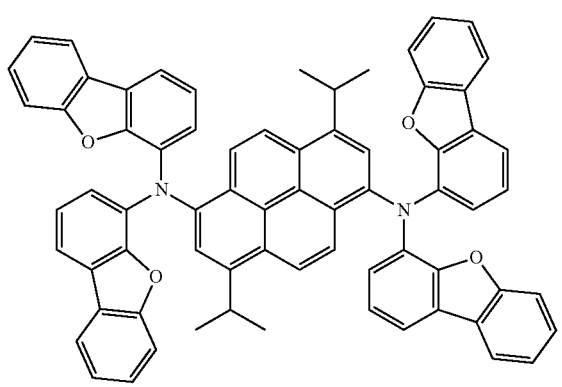
FD30
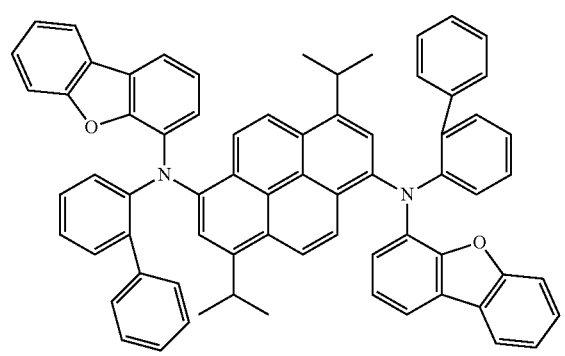

FD31
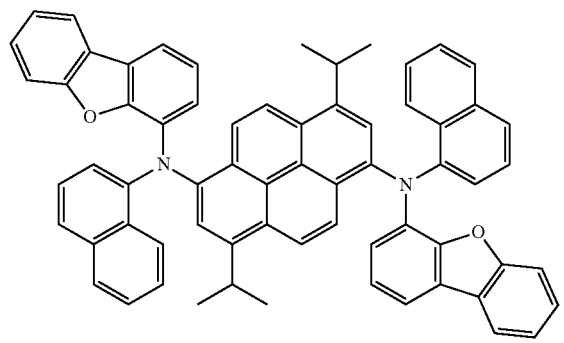

FD35
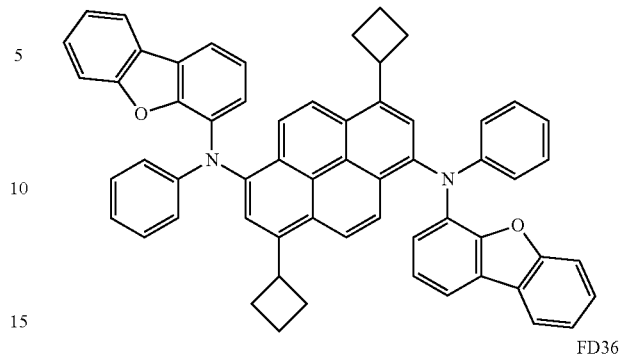

FD32
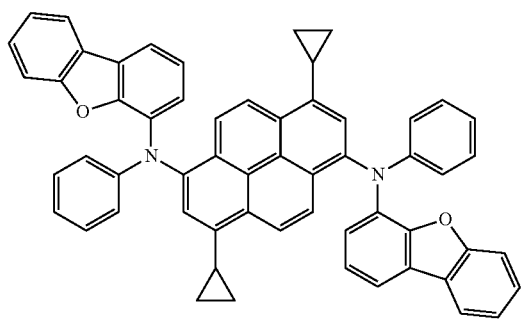

FD36
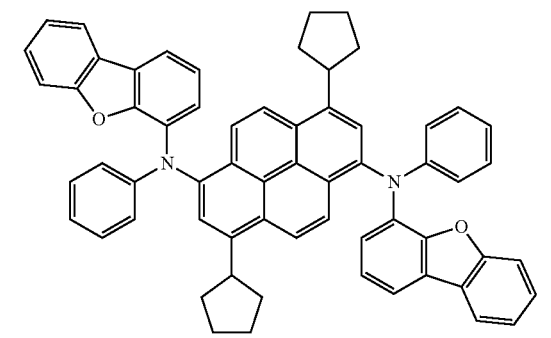

FD33

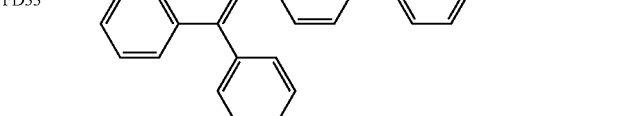

DPVBi

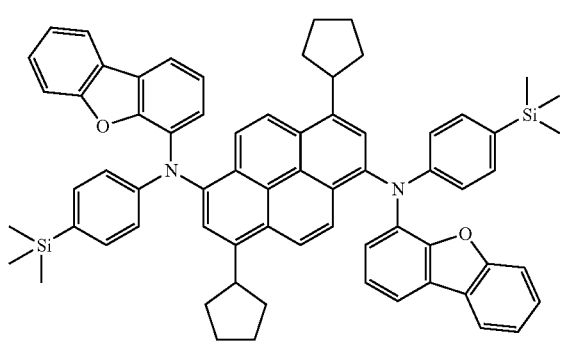

DPAVBi

FD34

Delayed Fluorescence Material

The emission layer may include a delayed fluorescence material.

The delayed fluorescence material described herein may be any suitable compound that may emit delayed fluorescence according to a delayed fluorescence emission mechanism.

The delayed fluorescence material included in the emission layer may serve as a host or a dopant, depending on types of other materials included in the emission layer.

In some embodiments, a difference between a triplet energy level (eV) of the delayed fluorescence material and a singlet energy level (eV) of the delayed fluorescence material may be about 0 eV or greater and about 0.5 eV or smaller. When the difference between a triplet energy level (eV) of the delayed fluorescence material and a singlet energy level (eV) of the delayed fluorescence material is within this range, up-conversion from a triplet state to a singlet state in the delayed fluorescence material may occur, thus improving luminescence efficiency and the like of the light-emitting device 10.

In some embodiments, the delayed fluorescence material may include: i) a material including at least one electron donor (e.g., a π electron-rich $C_3$-$C_{60}$ cyclic group such as a carbazole group and the like) and at least one electron acceptor (e.g., a sulfoxide group, a cyano group, a π electron-deficient nitrogen-containing $C_1$-$C_{60}$ cyclic group, and the like), ii) a material including a $C_8$-$C_{60}$ polycyclic group including at least two cyclic groups condensed to each other and sharing boron (B), and the like.

Examples of the delayed fluorescence material may include at least one of Compounds DF1 to DF9:

DF1

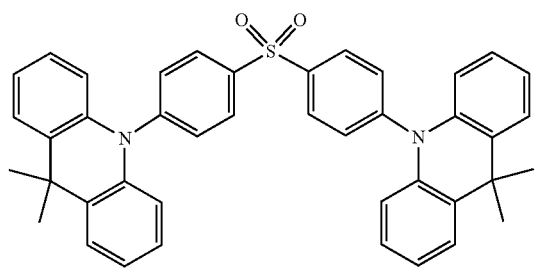

(DMAC-DPS)

DF2

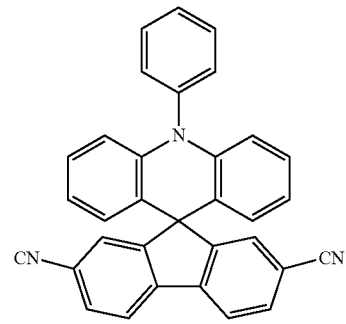

(ACRFLCN)

DF3

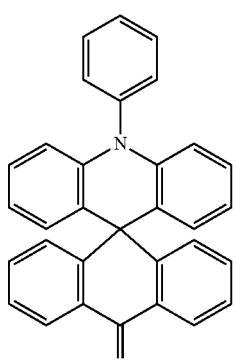

(ACRSA)

DF4

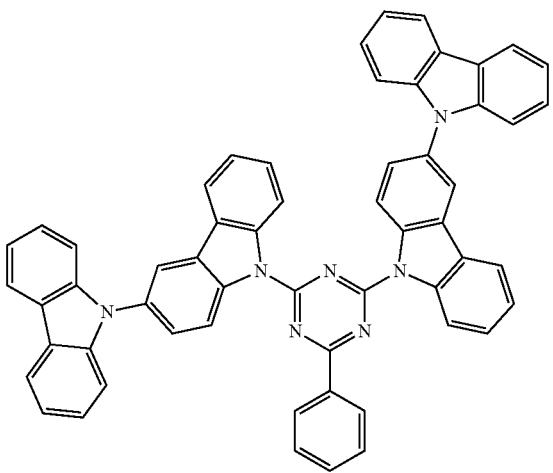

(CC2TA)

DF5

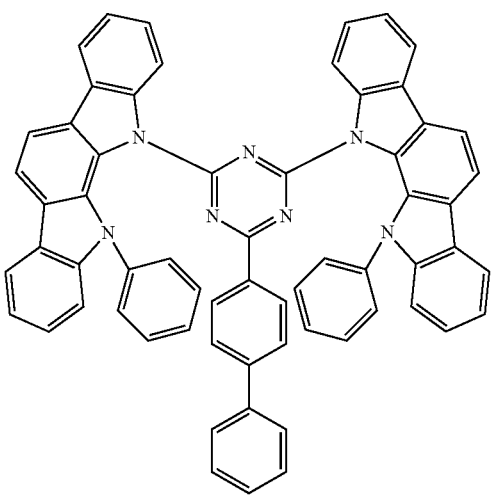

(PIC-TRZ)

DF6

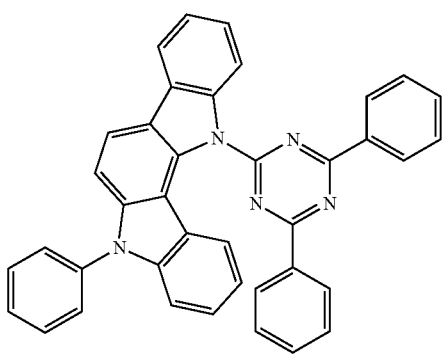

(PIC-TRZ2)

-continued

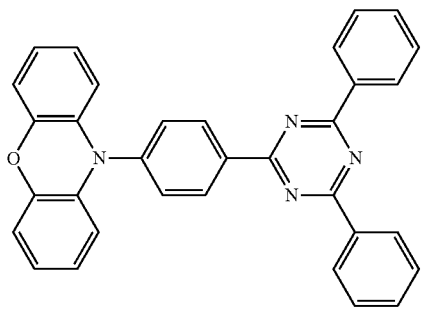

(PXZ-TRZ)

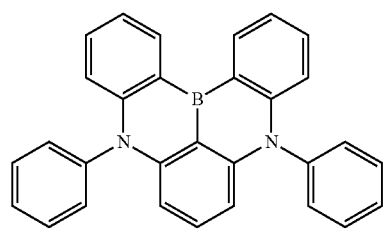

(DABNA-1)

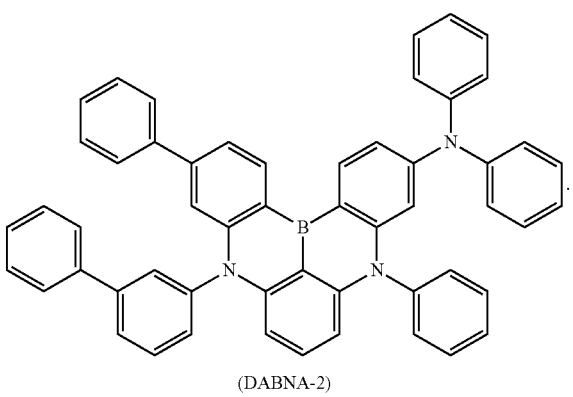

(DABNA-2)

Quantum Dot

The term "quantum dot" as used herein refers to a crystal of a semiconductor compound and may include any suitable material capable of emitting emission wavelengths of various lengths according to the size of the crystal.

The diameter of the quantum dot may be, for example, in a range of about 1 nm to about 10 nm.

Quantum dots may be synthesized by a wet chemical process, an organic metal chemical vapor deposition process, a molecular beam epitaxy process, or any similar process.

The wet chemical process is a method of growing a quantum dot particle crystal by mixing a precursor material with an organic solvent. When the crystal grows, the organic solvent may naturally serve as a dispersant coordinated on the surface of the quantum dot crystal and control the growth of the crystal. Thus, the wet chemical method may be easier than the vapor deposition process such as the metal organic chemical vapor deposition (MOCVD) or the molecular beam epitaxy (MBE) process. Further, the growth of quantum dot particles may be controlled with a lower manufacturing cost.

The quantum dot may include a III-VI group semiconductor compound; a II-VI group semiconductor compound; a III-V group semiconductor compound; a III-VI group semiconductor compound; a group semiconductor compound; a IV-VI group semiconductor compound; a IV group element or compound; or any combination thereof.

Examples of the III-VI group semiconductor compound may include a binary compound such as $In_2S_3$; a ternary compound such as AgInS, $AgInS_2$, CuInS, or $CuInS_2$; or any combination thereof.

Examples of the II-VI group semiconductor compound may include a binary compound such as CdS, CdSe, CdTe, ZnS, ZnSe, ZnTe, ZnO, HgS, HgSe, HgTe, MgSe, or MgS; a ternary compound such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, or MgZnS; a quaternary compound such as CdZnSeS, CdZnSeTe, CdZnSTe, CdHgSeS, CdHgSeTe, CdHgSTe, HgZnSeS, HgZnSeTe, or HgZnSTe; or any combination thereof.

Examples of the III-V group semiconductor compound may include a binary compound such as GaN, GaP, GaAs, GaSb, AlN, AkP, AlAs, AlSb, InN, InP, InAs, or InSb, a ternary compound such as GaNP, GaNAs, GaNSb, GaPAs, GaPSb, AlNP, AlNAs, AlNSb, AlPAs, AlPSb, InGaP, InNP, InAlP, InNAs, InNSb, InPAs, InPSb, or GaAlNP; a quaternary compound such as GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, or InAlPSb, or any combination thereof. In some embodiments, the III-V group semiconductor compound may further include a II group element. Examples of the III-V group semiconductor compound further including the II group element may include InZnP, InGaZnP, InAlZnP, and the like.

Examples of the III-VI group semiconductor compound may include a binary compound such as GaS, GaSe, $Ga_2Se_3$, GaTe, InS, InSe, $In_2Se_3$, InTe, and the like; a ternary compound such as $InGaS_3$, $InGaSe_3$, and the like; or any combination thereof.

Examples of the I-III-VI semiconductor compound may include a ternary compound such as AgInS, $AgInS_2$, CuInS, $CuInS_2$, $CuGaO_2$, $AgGaO_2$, $AgAlO_2$, or any combination thereof.

Examples of the IV-VI group semiconductor compound may include a binary compound such as SnS, SnSe, SnTe, PbS, PbSe, or PbTe; a ternary compound such as SnSeS, SnSeTe, SnSTe, PbSeS, PbSeTe, PbSTe, SnPbS, SnPbSe, or SnPbTe; a quaternary compound such as SnPbSSe, SnPbSeTe, or SnPbSTe; or any combination thereof.

The IV group element or compound may be a single element compound such as Si or Ge; a binary compound such as SiC or SiGe; or any combination thereof.

Individual elements included in the multi-element compound, such as a binary compound, a ternary compound, and a quaternary compound, may be present in a particle thereof at a uniform or non-uniform concentration.

The quantum dot may have a single structure in which the concentration of each element included in the quantum dot is uniform or a core-shell double structure. In some embodiments, materials included in the core may be different from materials included in the shell.

The shell of the quantum dot may serve as a protective layer for preventing chemical denaturation of the core to maintain semiconductor characteristics and/or as a charging layer for imparting electrophoretic characteristics to the quantum dot. The shell may be monolayer or multilayer. An interface between a core and a shell may have a concentration gradient where a concentration of elements present in the shell decreases toward the core.

Examples of the shell of the quantum dot include metal or nonmetal oxide, a semiconductor compound, or a combination thereof. Examples of the metal oxide or the nonmetal oxide may include: a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, or NiO; a ternary compound such as $MgAl_2O_4$, $CoFe_2O_4$, $NiFe_2O_4$, or $CoMn_2O_4$; and any combination thereof. Example of the semiconductor compound may include a III-VI group semiconductor compound; a II-VI group semiconductor compound; a III-V group semiconductor compound; a III-VI group semiconductor compound; a I-III-VI group semiconductor compound; a IV-VI group semiconductor compound; or any combination thereof. In some embodiments, the semiconductor compound may be CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or any combination thereof.

The quantum dot may have a full width of half maximum (FWHM) of a spectrum of an emission wavelength of about 45 nm or less, about 40 nm or less, or about 30 nm or less. When the FWHM of the quantum dot is within this range, color purity or color reproducibility may be improved. In addition, since light emitted through the quantum dot is emitted in all directions, an optical viewing angle may be improved.

In addition, the quantum dot may be specifically, a spherical, pyramidal, multi-arm, or cubic nanoparticle, nanotube, nanowire, nanofiber, or nanoplate particle.

By adjusting the size of the quantum dot, the energy band gap may also be adjusted, thereby obtaining light of various wavelengths in the quantum dot emission layer. By using quantum dots of various sizes, a light-emitting device that may emit light of various wavelengths may be realized. In some embodiments, the size of the quantum dot may be selected such that the quantum dot may emit red, green, and/or blue light. In addition, the size of the quantum dot may be selected such that the quantum dot may emit white light by combining various light of colors.

Electron Transport Region in Interlayer 130

The electron transport region may have i) a single-layered structure consisting of a single layer consisting of a single material, ii) a single-layered structure consisting of a single layer including a plurality of different materials, or iii) a multi-layered structure having a plurality of layers including a plurality of different materials.

The electron transport region may include a hole blocking layer, an electron transport layer, an electron injection layer, or a combination thereof.

In some embodiments, the electron transport region may have a structure of electron transport layer/electron injection layer or a structure of hole blocking layer/electron transport layer/electron injection layer, wherein layers of each structure are sequentially stacked over the emission layer in the stated order.

The electron transport region (e.g., a hole blocking layer or an electron transport layer in the electron transport region) may include a metal-free compound including at least one π electron-deficient nitrogen-containing $C_1$-$C_{60}$ cyclic group.

In some embodiments, the electron transport region may include a compound represented by Formula 601:

$$[Ar_{601}]_{xe11}\text{-}[(L_{601})_{xe1}\text{-}R_{601}]_{xe21} \quad \text{Formula 601}$$

wherein, in Formula 601, $Ar_{601}$ and $L_{601}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xe11 may be 1, 2, or 3, xe1 may be 0, 1, 2, 3, 4, or 5, $R_{601}$ may be a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{601}$)($Q_{602}$)($Q_{603}$), —C(=O)($Q_{601}$), —S(=O)$_2$($Q_{601}$), or —P(=O)($Q_{601}$)($Q_{602}$), $Q_{601}$ to $Q_{603}$ may each be understood by referring to the description of Qi provided herein, xe21 may be 1, 2, 3, 4, or 5, and at least one of $Ar_{601}$, $L_{601}$, and $R_{601}$ may independently be a π electron-deficient nitrogen-containing $C_1$-$C_{60}$ cyclic group unsubstituted or substituted with at least one $R_{10a}$.

In some embodiments, when xe11 in Formula 601 is 2 or greater, at least two $Ar_{601}$(s) may be bound via a single bond.

In some embodiments, in Formula 601, $Ar_{601}$ may be a substituted or unsubstituted anthracene group.

In some embodiments, the electron transport region may include a compound represented by Formula 601-1:

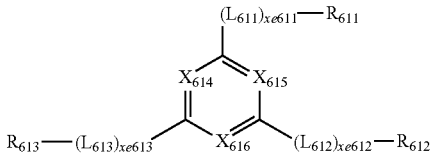

Formula 601-1 wherein, in Formula 601-1, $X_{614}$ may be N or C($R_{614}$), $X_{615}$ may be N or C($R_{615}$), $X_{616}$ may be N or C($R_{616}$), at least one of $X_{614}$ to $X_{616}$ may be N, $L_{611}$ to $L_{613}$ may each be understood by referring to the description of $L_{601}$ provided herein, xe611 to xe613 may each be understood by referring to the description of xe1 provided herein, $R_{611}$ to $R_{613}$ may each be understood by referring to the description of $R_{601}$ provided herein, and $R_{614}$ to $R_{616}$ may each independently be hydrogen, deuterium, —F, —Cl, —Br, —I, a hydroxyl group, a cyano group, a nitro group, a $C_1$-$C_{20}$ alkyl group, a $C_1$-$C_{20}$ alkoxy group, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$.

In some embodiments, in Formulae 601 and 601-1, xe1 and xe611 to xe613 may each independently be 0, 1, or 2.

The electron transport region may include one of Compounds ET1 to ET45, 2,9-dimethyl-4,7-diphenyl-1,10-phenanthroline (BCP), 4,7-diphenyl-1,10-phenanthroline (Bphen), Alq3, BAlq, TAZ, NTAZ, or any combination thereof:

ET1
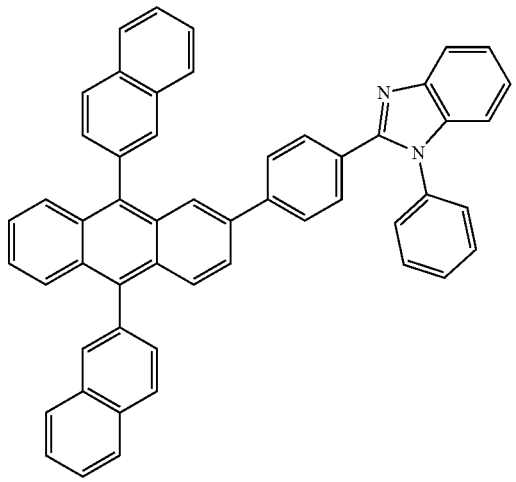
ET2
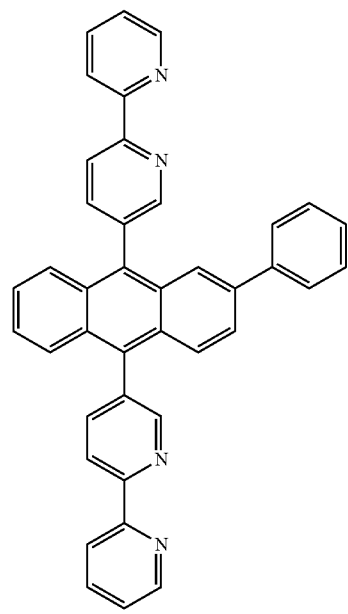
ET3
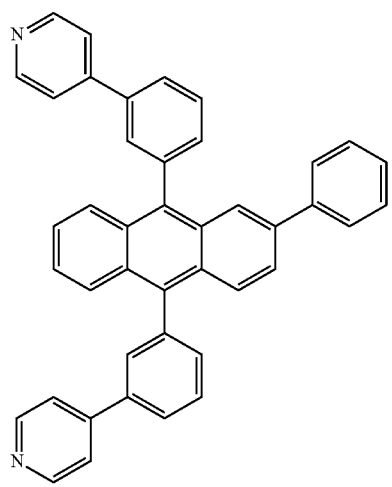
ET4
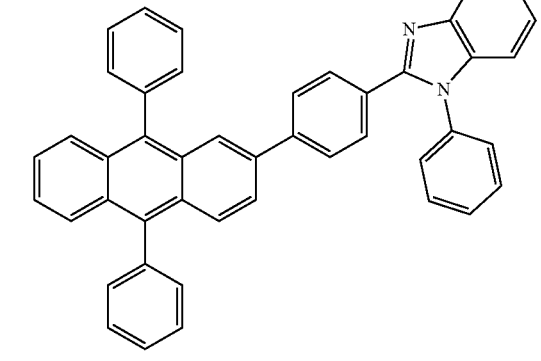
ET5
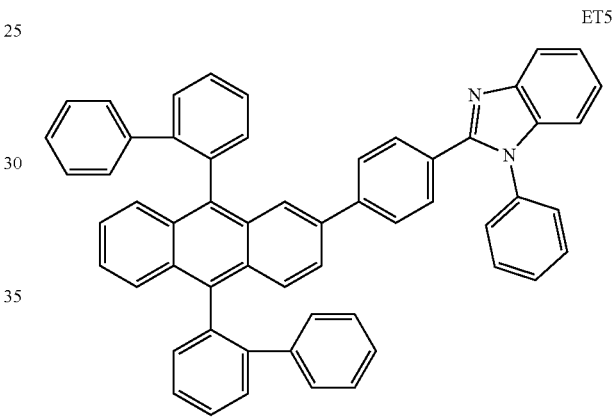
ET6
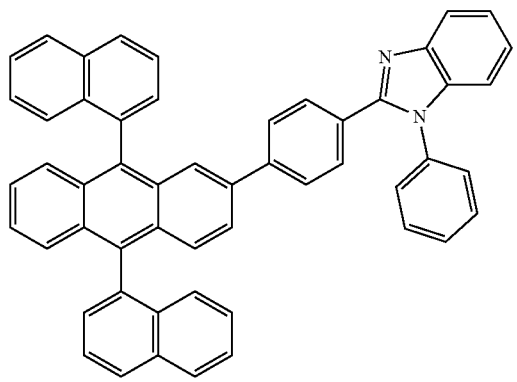

ET7
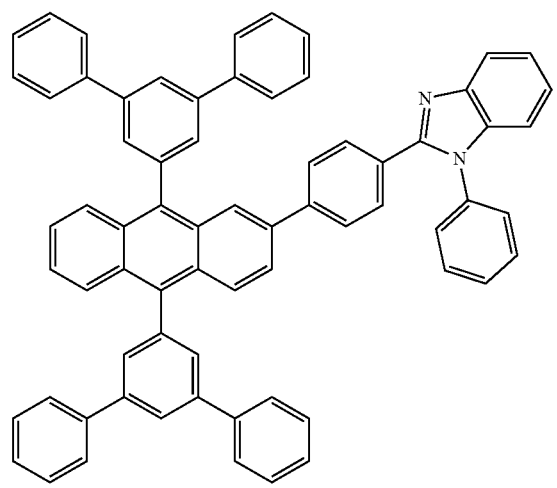
ET8
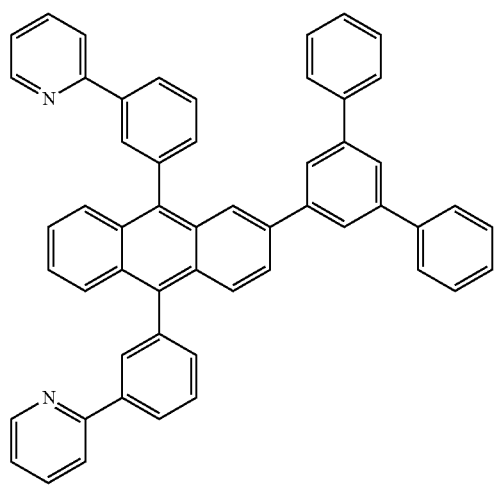
ET9
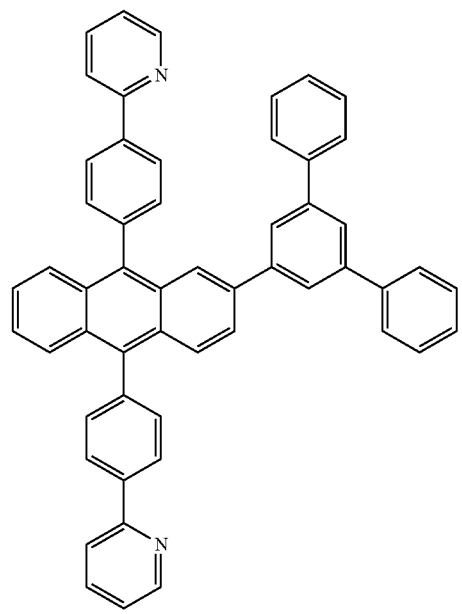
ET10
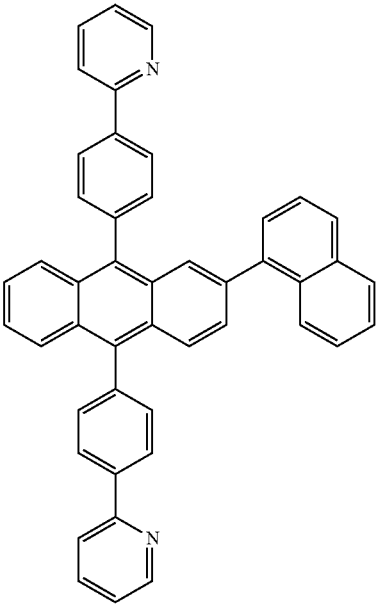
ET11
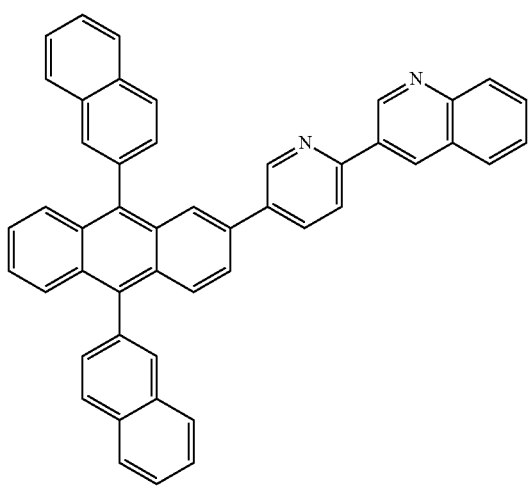
ET12
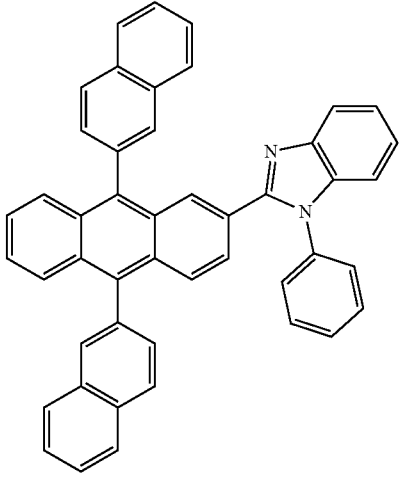

ET13
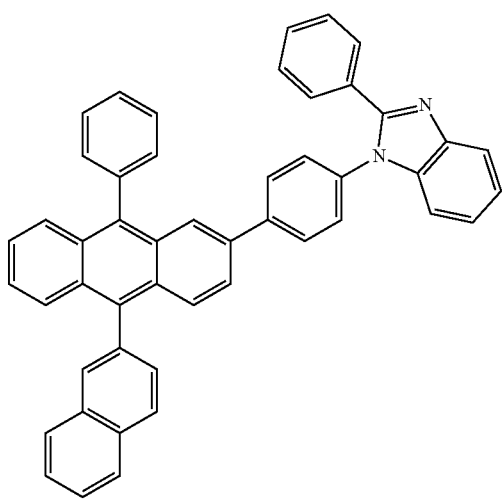
ET14
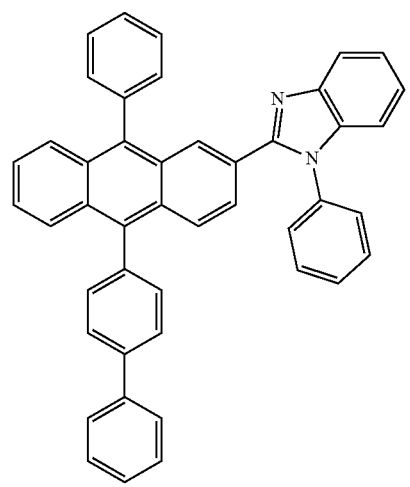
ET15
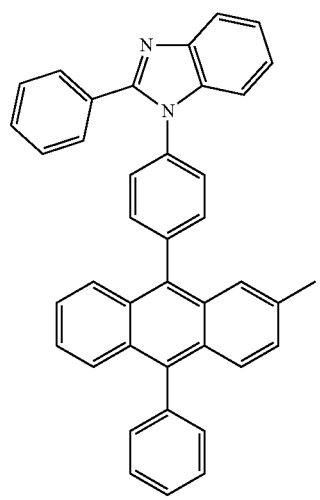
ET16
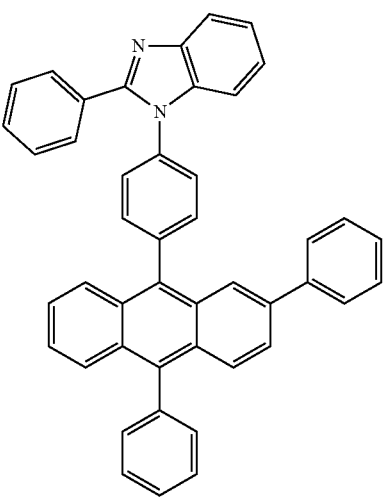
ET17
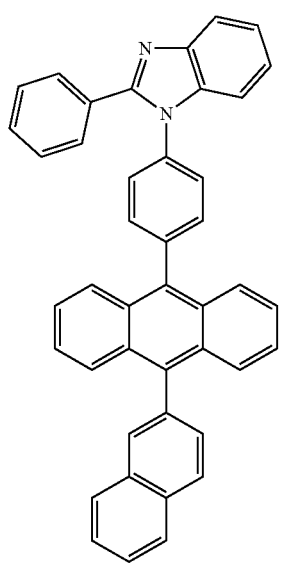
ET18
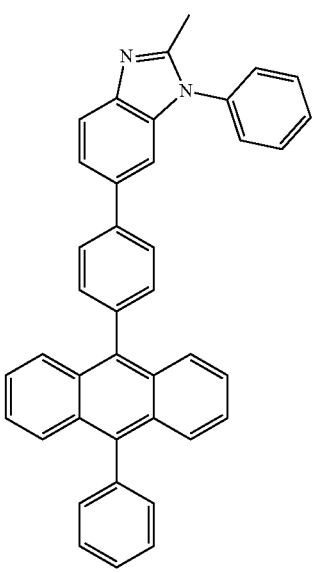

ET19
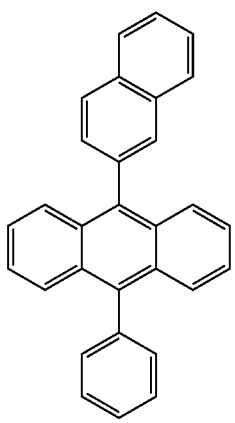
ET22
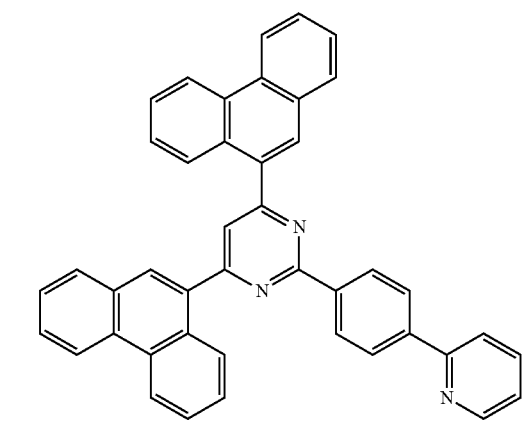
ET20
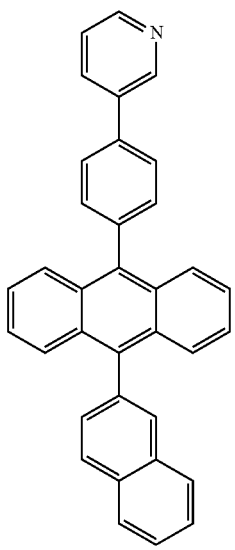
ET23
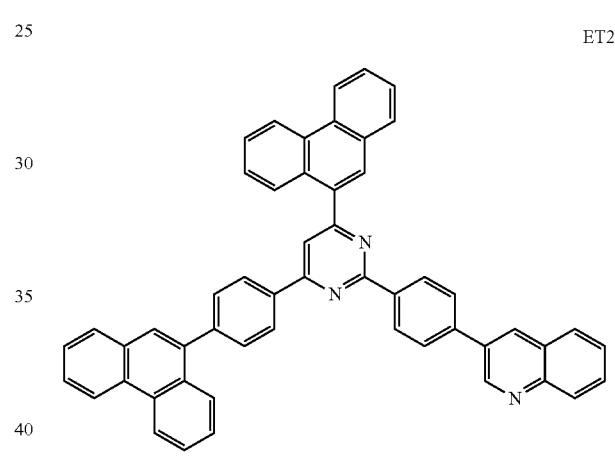
ET21
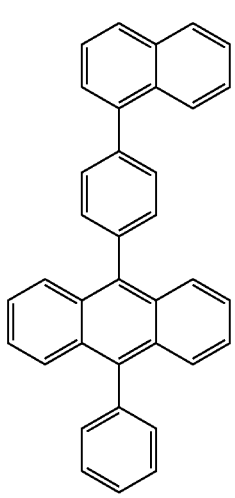
ET24
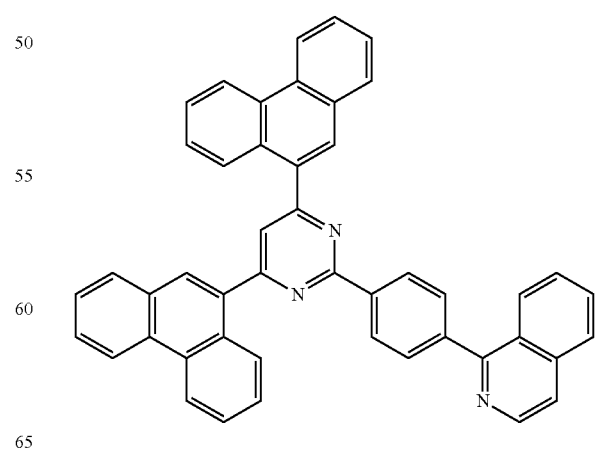

ET25
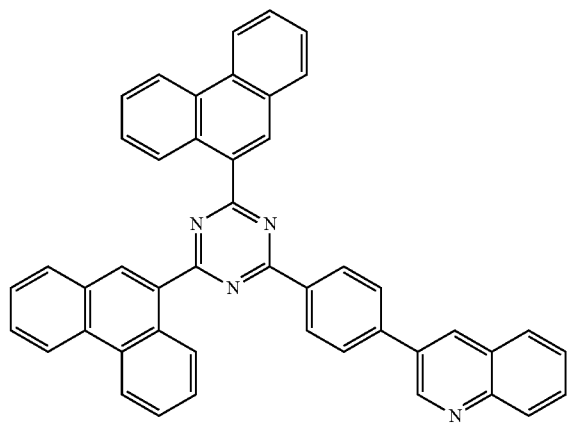
ET28
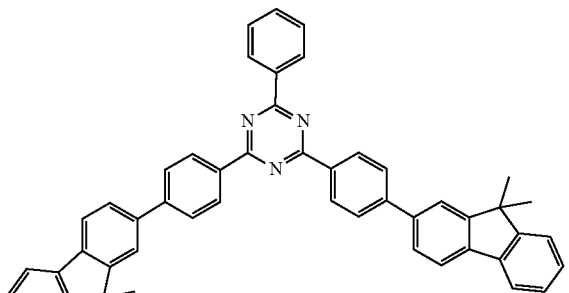
ET26
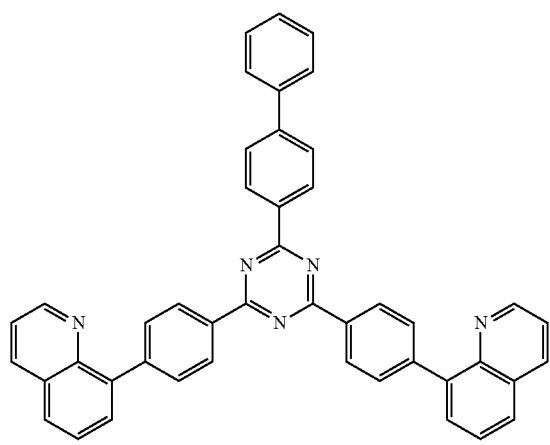
ET29
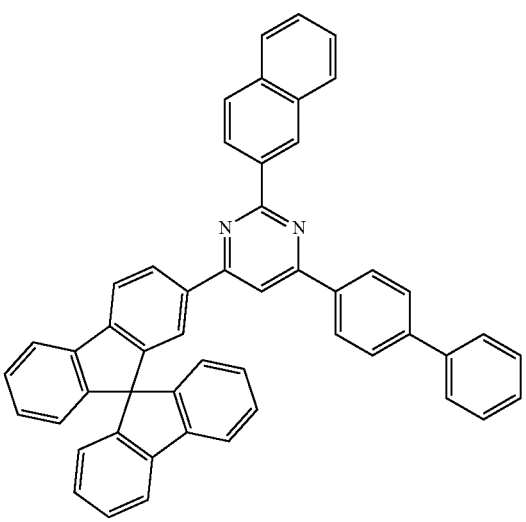
ET27
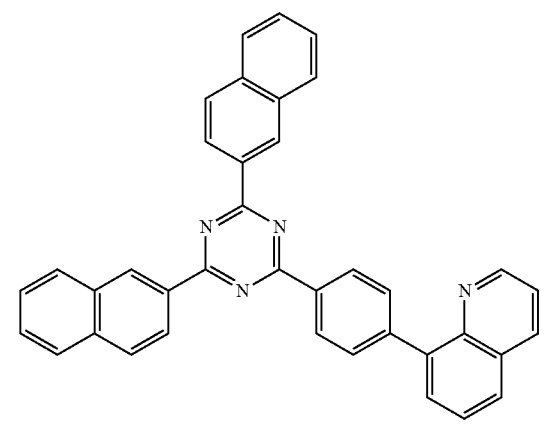
ET30
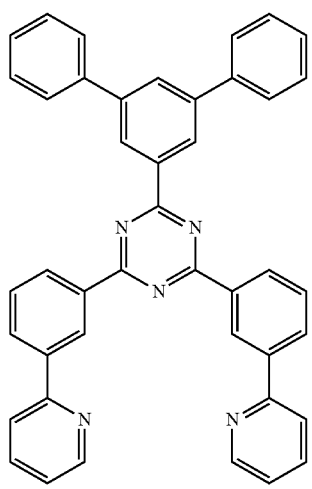

ET31
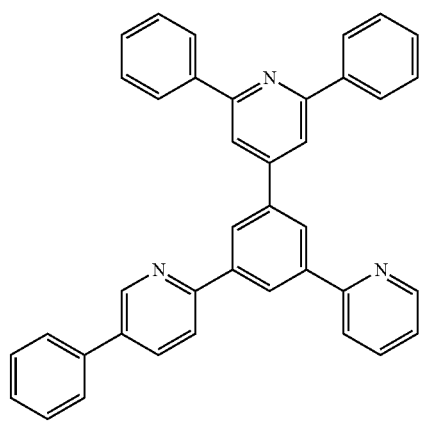
ET34
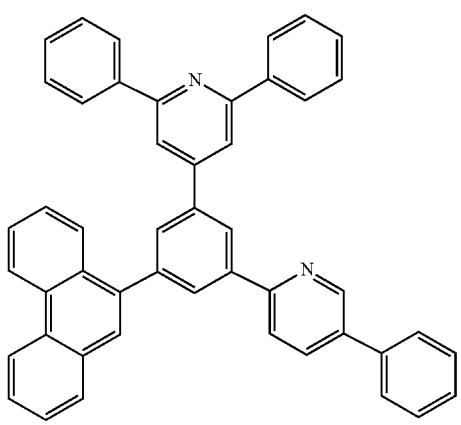
ET32
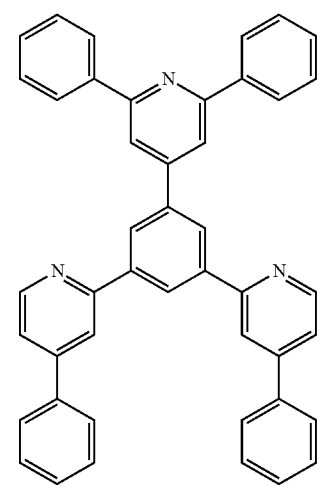
ET35
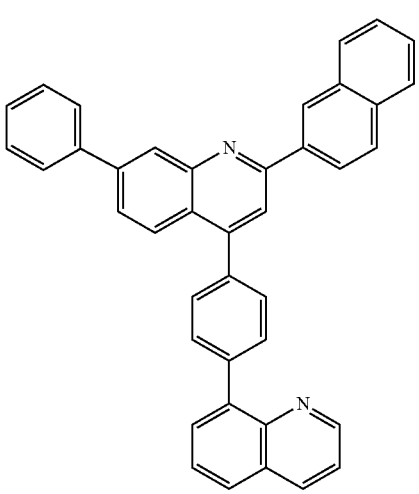
ET36
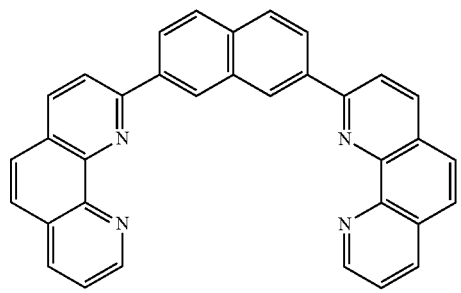
ET33
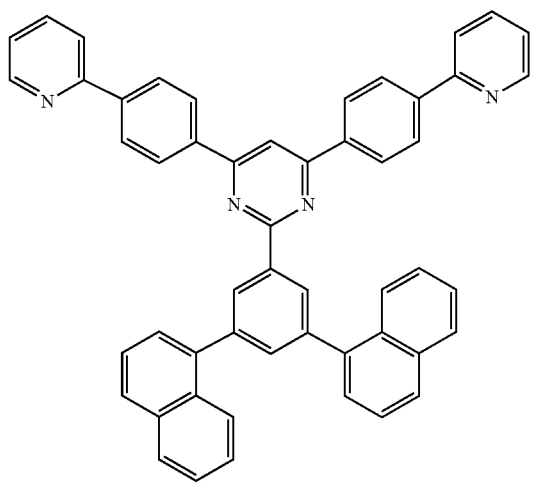
ET37
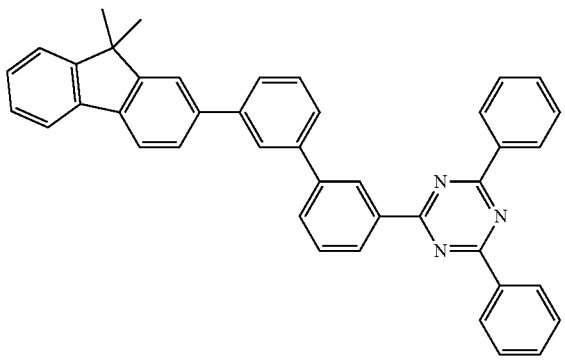

ET38
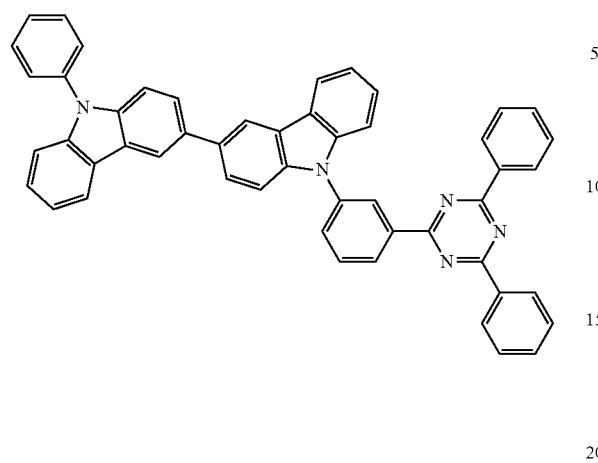
ET41
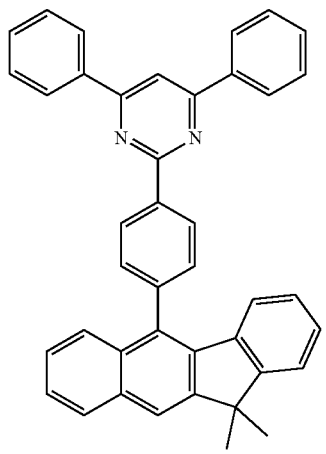
ET39
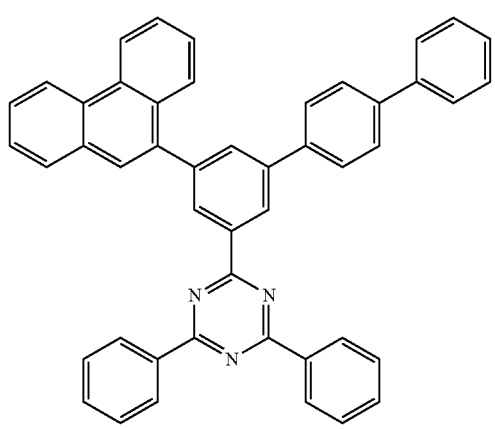
ET42
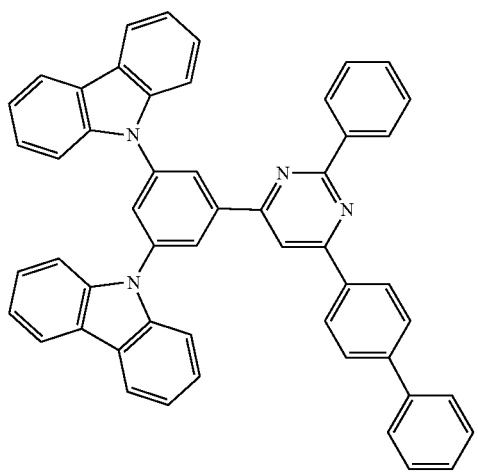
ET40
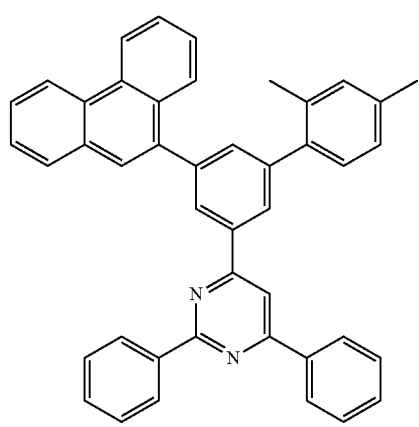
ET43
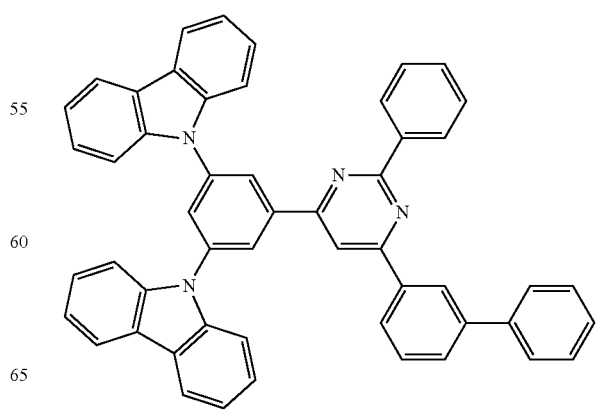

ET44

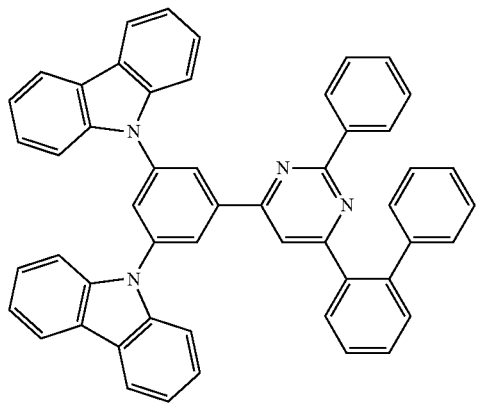

ET45

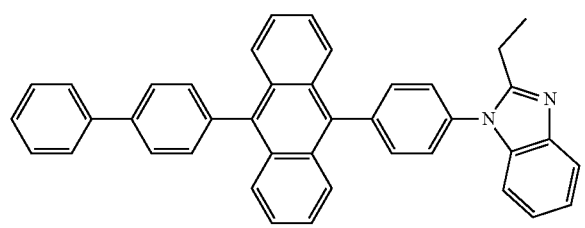

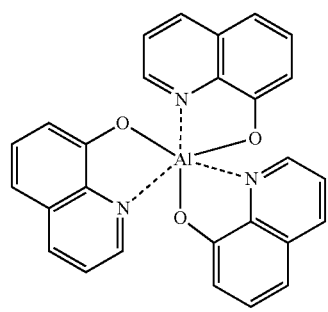
Alq₃

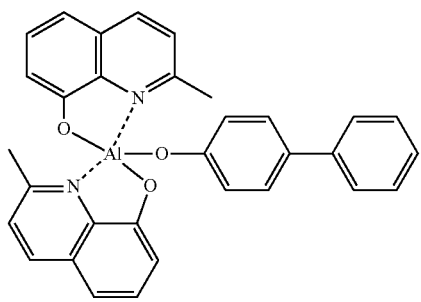
BAlq

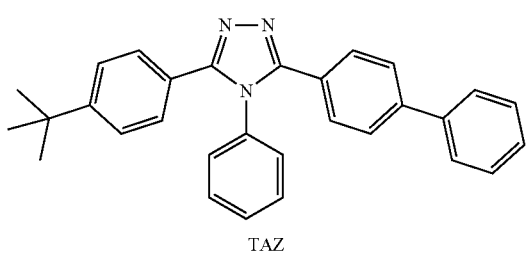
TAZ

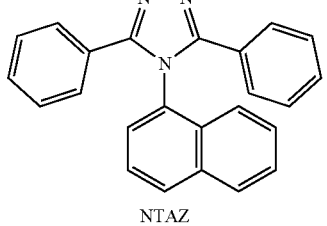
NTAZ

The thickness of the electron transport region may be in a range of about 160 Å to about 5,000 Å, and in some embodiments, about 100 Å to about 4,000 Å. When the electron transport region includes a hole blocking layer, an electron transport layer, or any combination thereof, the thicknesses of the hole blocking layer and the electron transport layer may each independently be in a range of about 20 Å to about 1,000 Å, for example, about 30 Å to about 300 Å, and the thickness of the electron transport layer may be in a range of about 100 Å to about 1,000 Å, for example, about 150 Å to about 500 Å. When the thickness of the hole blocking layer and/or the electron transport layer is within any of these ranges, excellent electron transport characteristics may be obtained without a substantial increase in driving voltage.

The electron transport region (for example, the electron transport layer in the electron transport region) may further include, in addition to the materials described above, a metal-containing material.

The metal-containing material may include an alkali metal complex, an alkaline earth metal complex, or any combination thereof. A metal ion of the alkali metal complex may be a lithium (Li) ion, a sodium (Na) ion, a potassium (K) ion, a rubidium (Rb) ion, or a cesium (Cs) ion. A metal ion of the alkaline earth metal complex may be a beryllium (Be) ion, a magnesium (Mg) ion, a calcium (Ca) ion, a strontium (Sr) ion, or a barium (Ba) ion. Each ligand coordinated with the metal ion of the alkali metal complex and the alkaline earth metal complex may independently be hydroxyquinoline, hydroxyisoquinoline, hydroxybenzoquinoline, hydroxyacridine, hydroxyphenanthridine, hydroxyphenyloxazole, hydroxyphenylthiazole, hydroxyphenyloxadiazole, hydroxyphenylthiadiazole, hydroxyphenylpyridine, hydroxyphenylbenzimidazole, hydroxyphenylbenzothiazole, bipyridine, phenanthroline, cyclopentadiene, or any combination thereof.

For example, the metal-containing material may include a Li complex. The Li complex may include, e.g., Compound ET-D1 (LiQ) or Compound ET-D2:

ET-D1

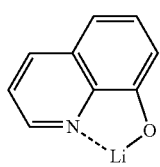

-continued

ET-D2

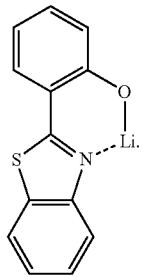

The electron transport region may include an electron injection layer that facilitates injection of electrons from the second electrode 150. The electron injection layer may be in direct contact with the second electrode 150.

The electron injection layer may have i) a single-layered structure consisting of a single layer consisting of a single material, ii) a single-layered structure consisting of a single layer including a plurality of different materials, or iii) a multi-layered structure having a plurality of layers including a plurality of different materials.

The electron injection layer may include an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof.

The alkali metal may be Li, Na, K, Rb, Cs or any combination thereof. The alkaline earth metal may be Mg, Ca, Sr, Ba, or any combination thereof. The rare earth metal may be Sc, Y, Ce, Tb, Yb, Gd, or any combination thereof.

The alkali metal-containing compound, the alkaline earth metal-containing compound, and the rare earth metal-containing compound may respectively be oxides, halides (e.g., fluorides, chlorides, bromides, or iodides), tellurides, or any combination thereof of each of the alkali metal, the alkaline earth metal, and the rare earth metal.

The alkali metal-containing compound may be alkali metal oxides such as $Li_2O$, $Cs_2O$, or $K_2O$, alkali metal halides such as LiF, NaF, CsF, KF, LiI, NaI, CsI, or KI, or any combination thereof. The alkaline earth-metal-containing compound may include alkaline earth-metal compounds, such as BaO, SrO, CaO, $Ba_xSr_{1-x}O$ (wherein x is a real number that satisfying 0<x<1), or $Ba_xCa_{1-x}O$ (wherein x is a real number that satisfying 0<x<1). The rare earth metal-containing compound may include $YbF_3$, $ScF_3$, $Sc_2O_3$, $Y_2O_3$, $Ce_2O_3$, $GdF_3$, $TbF_3$, $YbI_3$, $ScI_3$, $TbI_3$, or any combination thereof. In some embodiments, the rare earth metal-containing compound may include a lanthanide metal telluride. Examples of the lanthanide metal telluride may include LaTe, CeTe, PrTe, NdTe, PmTe, SmTe, EuTe, GdTe, TbTe, DyTe, HoTe, ErTe, TmTe, YbTe, LuTe, $La_2Te_3$, $Ce_2Te_3$, $Pr_2Te_3$, $Nd_2Te_3$, $Pm_2Te_3$, $Sm_2Te_3$, $Eu_2Te_3$, $Gd_2Te_3$, $Tb_2Te_3$, $Dy_2Te_3$, $Ho_2Te_3$, $Er_2Te_3$, $Tm_2Te_3$, $Yb_2Te_3$, $Lu_2Te_3$, and the like.

The alkali metal complex, the alkaline earth metal complex, and the rare earth metal complex may include: i) one of ions of the alkali metal, alkaline earth metal, and rare earth metal described above and ii) a ligand bound to the metal ion, e.g., hydroxyquinoline, hydroxyisoquinoline, hydroxybenzoquinoline, hydroxyacridine, hydroxyphenanthridine, hydroxyphenyloxazole, hydroxyphenylthiazole, hydroxydiphenyloxadiazole, hydroxydiphenylthiadiazole, hydroxyphenylpyridine, hydroxyphenylbenzimidazole, hydroxyphenylbenzothiazole, bipyridine, phenanthroline, cyclopentadiene, or any combination thereof.

The electron injection layer may consist of an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof, as described above. In some embodiments, the electron injection layer may further include an organic material (e.g., a compound represented by Formula 601).

In some embodiments, the electron injection layer may consist of i) an alkali metal-containing compound (e.g., alkali metal halide), or ii) a) an alkali metal-containing compound (e.g., alkali metal halide); and b) an alkali metal, an alkaline earth metal, a rare earth metal, or any combination thereof. In some embodiments, the electron injection layer may be a KI:Yb co-deposition layer, a RbI:Yb co-deposition layer, and the like.

When the electron injection layer further includes an organic material, the alkali metal, the alkaline earth metal, the rare earth metal, the alkali metal-containing compound, the alkaline earth metal-containing compound, the rare earth metal-containing compound, the alkali metal complex, the alkaline earth metal complex, the rare earth metal complex, or any combination thereof may be homogeneously or non-homogeneously dispersed in a matrix including the organic material.

The thickness of the electron injection layer may be in a range of about 1 Å to about 100 Å, and in some embodiments, about 3 Å to about 90 Å. When the thickness of the electron injection layer is within any of these ranges, excellent electron injection characteristics may be obtained without a substantial increase in driving voltage.

Second Electrode 150

The second electrode 150 may be on the interlayer 130. In an embodiment, the second electrode 150 may be a cathode that is an electron injection electrode. In this embodiment, a material for forming the second electrode 150 may be a material having a low work function, for example, a metal, an alloy, an electrically conductive compound, or any combination thereof.

The second electrode 150 may include lithium (Li), silver (Ag), magnesium (Mg), aluminum (Al), aluminum-lithium (Al—Li), calcium (Ca), magnesium-indium (Mg—In), magnesium-silver (Mg—Ag), ytterbium (Yb), silver-ytterbium (Ag—Yb), ITO, IZO, or any combination thereof. The second electrode 150 may be a transmissive electrode, a semi-transmissive electrode, or a reflective electrode.

The second electrode 150 may have a single-layered structure, or a multi-layered structure including two or more layers.

Capping Layer

A first capping layer may be located on an exterior surface of the first electrode 110, and/or a second capping layer may be located on an exterior surface of the second electrode 150. In some embodiments, the light-emitting device 10 may have a structure in which the first capping layer, the first electrode 110, the interlayer 130, and the second electrode 150 are sequentially stacked in this stated order, a structure in which the first electrode 110, the interlayer 130, the second electrode 150, and the second capping layer are sequentially stacked in this stated order, or a structure in which the first capping layer, the first electrode 110, the interlayer 130, the second electrode 150, and the second capping layer are sequentially stacked in this stated order.

In the light-emitting device 10, light emitted from the emission layer in the interlayer 130 may pass through the first electrode 110 (which may be a semi-transmissive electrode or a transmissive electrode) and through the first capping layer to the outside. In the light-emitting device 10, light emitted from the emission layer in the interlayer 130 may pass through the second electrode 150 (which may be a semi-transmissive electrode or a transmissive electrode) and through the second capping layer to the outside.

The first capping layer and the second capping layer may improve the external luminescence efficiency based on the principle of constructive interference. Accordingly, the optical extraction efficiency of the light-emitting device 10 may be increased, thus improving luminescence efficiency of the light-emitting device 10.

The first capping layer and the second capping layer may each include a material having a refractive index of 1.6 or higher (at 589 nm).

The first capping layer and the second capping layer may each independently be a capping layer including an organic material, an inorganic capping layer including an inorganic material, or a composite capping layer including an organic material and an inorganic material.

At least one of the first capping layer and the second capping layer may each independently include carbocyclic compounds, heterocyclic compounds, amine group-containing compounds, porphyrin derivatives, phthalocyanine derivatives, naphthalocyanine derivatives, alkali metal complexes, alkaline earth metal complexes, or any combination thereof. The carbocyclic compound, the heterocyclic compound, and the amine group-containing compound may optionally be substituted with a substituent of O, N, S, Se, Si, F, Cl, Br, I, or any combination thereof. In some embodiments, at least one of the first capping layer and the second capping layer may each independently include an amine group-containing compound.

In some embodiments, at least one of the first capping layer and the second capping layer may each independently include the compound represented by Formula 201, the compound represented by Formula 202, or any combination thereof.

In one or more embodiments, at least one of the first capping layer and the second capping layer may each independently include one of Compounds HT28 to HT33, one of Compounds CP1 to CP6, β-NPB, or any combination thereof.

CP1

CP2

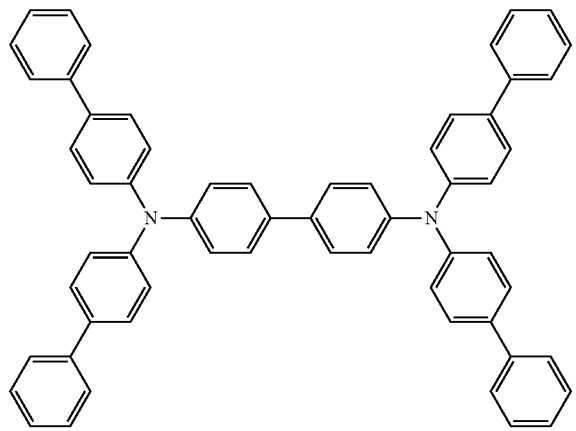

CP3

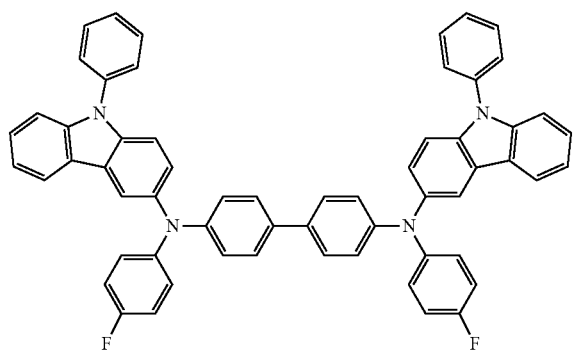

CP4

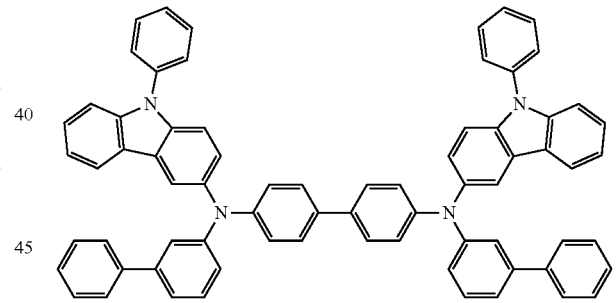

CP5

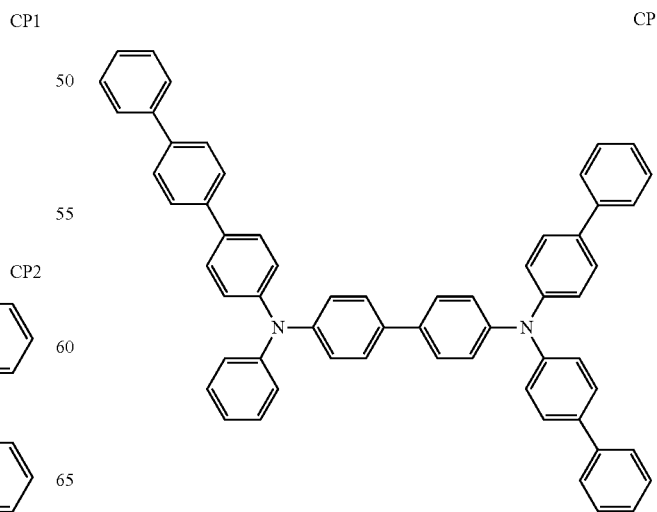

CP6

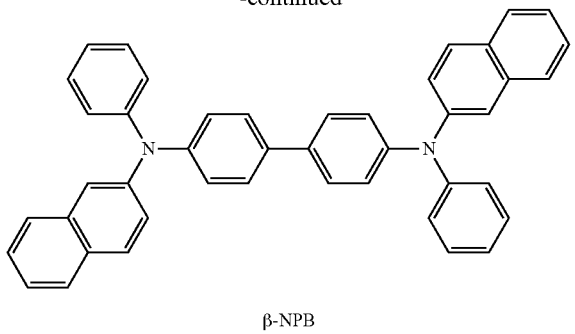

β-NPB

Electronic Apparatus

The light-emitting device may be included in various electronic apparatuses. In some embodiments, an electronic apparatus including the light-emitting device may be an emission apparatus or an authentication apparatus.

The electronic apparatus (e.g., an emission apparatus) may further include, in addition to the light-emitting device, i) a color filter, ii) a color-conversion layer, or iii) a color filter and a color-conversion layer. The color filter and/or the color-conversion layer may be disposed on at least one traveling direction of light emitted from the light-emitting device. For example, light emitted from the light-emitting device may be blue light or white light. The light-emitting device may be understood by referring to the descriptions provided herein. In some embodiments, the color-conversion layer may include quantum dots. The quantum dot may be, for example, the quantum dot described herein.

The electronic apparatus may include a first substrate. The first substrate may include a plurality of sub-pixel areas, the color filter may include a plurality of color filter areas respectively corresponding to the plurality of sub-pixel areas, and the color-conversion layer may include a plurality of color-conversion areas respectively corresponding to the plurality of sub-pixel areas.

A pixel defining film may be located between the plurality of sub-pixel areas to define each sub-pixel area.

The color filter may further include a plurality of color filter areas and light-blocking patterns between the plurality of color filter areas, and the color-conversion layer may further include a plurality of color-conversion areas and light-blocking patterns between the plurality of color-conversion areas.

The plurality of color filter areas (or a plurality of color-conversion areas) may include: a first area emitting first color light; a second area emitting second color light; and/or a third area emitting third color light, and the first color light, the second color light, and/or the third color light may have different maximum emission wavelengths. In some embodiments, the first color light may be red light, the second color light may be green light, and the third color light may be blue light. In some embodiments, the plurality of color filter areas (or the plurality of color-conversion areas) may each include quantum dots. In some embodiments, the first area may include red quantum dots, the second area may include green quantum dots, and the third area may not include a quantum dot. The quantum dot may be understood by referring to the description of the quantum dot provided herein. The first area, the second area, and/or the third area may each further include an emitter.

In some embodiments, the light-emitting device may emit first light, the first area may absorb the first light to emit 1-1 color light, the second area may absorb the first light to emit 2-1 color light, and the third area may absorb the first light to emit 3-1 color light. In this embodiment, the 1-1 color light, the 2-1 color light, and the 3-1 color light may each have a different maximum emission wavelength. In some embodiments, the first light may be blue light, the 1-1 color light may be red light, the 2-1 color light may be green light, and the 3-1 light may be blue light.

The electronic apparatus may further include a thin-film transistor, in addition to the light-emitting device. The thin-film transistor may include a source electrode, a drain electrode, and an activation layer, wherein one of the source electrode and the drain electrode may be electrically connected to one of the first electrode and the second electrode of the light-emitting device.

The thin-film transistor may further include a gate electrode, a gate insulating film, or the like.

The activation layer may include a crystalline silicon, an amorphous silicon, an organic semiconductor, and an oxide semiconductor.

The electronic apparatus may further include an encapsulation unit for sealing the light-emitting device. The encapsulation unit may be located between the color filter and/or the color-conversion layer and the light-emitting device. The encapsulation unit may allow light to pass to the outside from the light-emitting device and prevent the air and moisture from permeating the light-emitting device. The encapsulation unit may be a sealing substrate including a transparent glass or a plastic substrate. The encapsulation unit may be a thin-film encapsulating layer including at least one of an organic layer and/or an inorganic layer. When the encapsulation unit is a thin film encapsulating layer, the electronic apparatus may be flexible.

In addition to the color filter and/or the color-conversion layer, various functional layers may be disposed on the encapsulation unit depending on the use of an electronic apparatus. Examples of the functional layer may include a touch screen layer, a polarization layer, and the like. The touch screen layer may be a resistive touch screen layer, a capacitive touch screen layer, or an infrared beam touch screen layer. The authentication apparatus may be, for example, a biometric authentication apparatus that identifies an individual according biometric information (e.g., a fingertip, a pupil, or the like).

The authentication apparatus may further include a biometric information collecting unit, in addition to the light-emitting device described above.

The electronic apparatus may be applicable to various displays, an optical source, lighting, a personal computer (e.g., a mobile personal computer), a cellphone, a digital camera, an electronic note, an electronic dictionary, an electronic game console, a medical device (e.g., an electronic thermometer, a blood pressure meter, a glucometer, a pulse measuring device, a pulse wave measuring device, an electrocardiograph recorder, an ultrasonic diagnosis device, an endoscope display device), a fish finder, various measurement devices, a gauge (e.g., gauges of an automobile, an airplane, a ship), or a projector.

Figure 2:
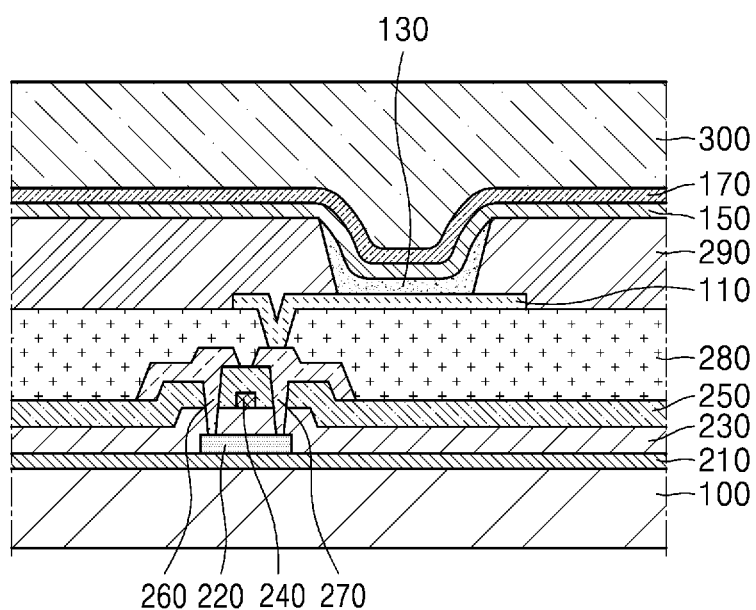
FIG. 2 is a schematic cross-sectional view of a light-emitting apparatus according to an exemplary embodiment.
Figure 3:
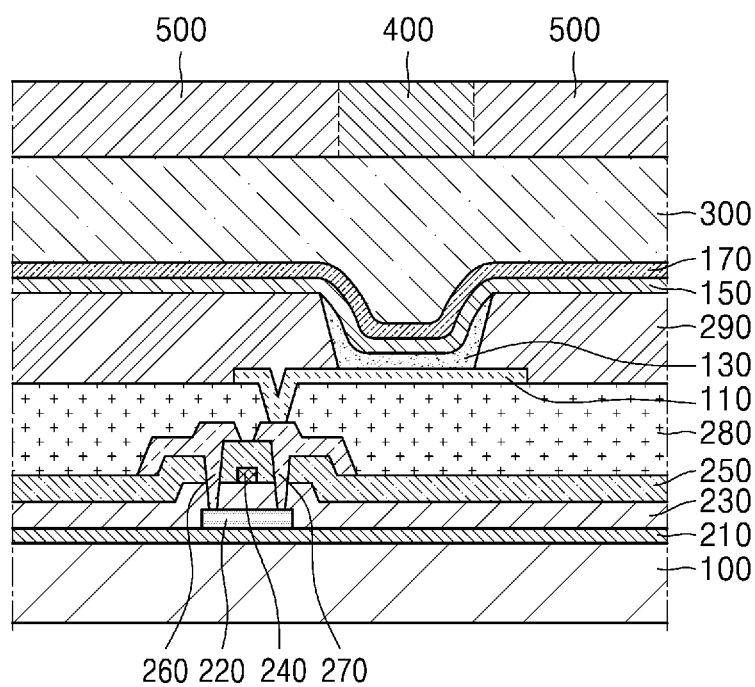
FIG. 3 is a schematic cross-sectional view of another light-emitting apparatus according to an exemplary embodiment.

Descriptions of FIGS. 2 and 3

FIG. 2 is a schematic cross-sectional view of a light-emitting apparatus according to an exemplary embodiment.

An emission apparatus in FIG. 2 may include a substrate 100, a thin-film transistor, a light-emitting device, and an encapsulation unit 300 sealing the light-emitting device.

The substrate 100 may be a flexible substrate, a glass substrate, or a metal substrate. A buffer layer 210 may be on the substrate 100. The buffer layer 210 may prevent penetration of impurities through the substrate 100 and provide a flat surface on the substrate 100.

A thin-film transistor may be on the buffer layer 210. The thin-film transistor may include an active layer 220, a gate electrode 240, a source electrode 260, and a drain electrode 270.

The active layer 220 may include an inorganic semiconductor such as silicon or silicon polymer, an organic semiconductor, or an oxide semiconductor and include a source area, a drain area and a channel area.

A gate insulating film 230 for insulating the active layer 220 and the gate electrode 240 may be on the active layer 220, and the gate electrode 240 may be on the gate insulating film 230.

An interlayer insulating film 250 may be on the gate electrode 240. The interlayer insulating film 250 may be between the gate electrode 240 and the source electrode 260 and between the gate electrode 240 and the drain electrode 270 to provide insulation therebetween.

The source electrode 260 and the drain electrode 270 may be on the interlayer insulating film 250. The interlayer insulating film 250 and the gate insulating film 230 may be formed to expose the source area and the drain area of the active layer 220, and the source electrode 260 and the drain electrode 270 may be adjacent to the exposed source area and the exposed drain area of the active layer 220.

Such a thin-film transistor may be electrically connected to a light-emitting device to drive the light-emitting device and may be protected by a passivation layer 280. The passivation layer 280 may include an inorganic insulating film, an organic insulating film, or a combination thereof. A light-emitting device may be on the passivation layer 280. The light-emitting device may include a first electrode 110, an interlayer 130, and a second electrode 150.

The first electrode 110 may be on the passivation layer 280. The passivation layer 280 may not fully cover the drain electrode 270 and expose a specific area of the drain electrode 270, and the first electrode 110 may be disposed to connect to the exposed drain electrode 270.

A pixel-defining film 290 may be on the first electrode 110. The pixel-defining film 290 may expose a specific area of the first electrode 110, and the interlayer 130 may be formed in the exposed area. The pixel-defining film 290 may be a polyimide or polyacryl organic film. Although it is not shown in FIG. 2, some higher layers of the interlayer 130 may extend to the upper portion of the pixel-defining film 290 and may be disposed in the form of a common layer.

The second electrode 150 may be on the interlayer 130, and a capping layer 170 may be additionally formed on the second electrode 150. The capping layer 170 may be formed to cover the second electrode 150.

The encapsulation unit 300 may be on the capping layer 170. The encapsulation unit 300 may be on the light-emitting device to protect a light-emitting device from moisture or oxygen. The encapsulation unit 300 may include: an inorganic film including silicon nitride (SiNx), silicon oxide (SiOx), indium tin oxide, indium zinc oxide, or any combination thereof; an organic film including polyethylene terephthalate, polyethylene naphthalate, polycarbonate, polyimide, polyethylene sulfonate, polyoxy methylene, poly acrylate, hexamethyl disiloxane, an acrylic resin (e.g., polymethyl methacrylate, polyacrylic acid, and the like), an epoxy resin (e.g., aliphatic glycidyl ether (AGE) and the like), or any combination thereof; or a combination of the inorganic film and the organic film.

FIG. 3 is a schematic cross-sectional view of another light-emitting apparatus according to an exemplary embodiment.

The emission apparatus shown in FIG. 3 may be substantially identical to the emission apparatus shown in FIG. 2, except that a light-shielding pattern 500 and a functional area 400 are additionally located on the encapsulation unit 300. The functional area 400 may be i) a color filter area, ii) a color-conversion area, or iii) a combination of a color filter area and a color-conversion area. In some embodiments, the light-emitting device shown in FIG. 3 included in the emission apparatus may be a tandem light-emitting device.

Manufacturing Method

The layers constituting the hole transport region, the emission layer, and the layers constituting the electron transport region may be formed in a specific region by using one or more suitable methods such as vacuum deposition, spin coating, casting, Langmuir-Blodgett (LB) deposition, ink-jet printing, laser printing, and laser-induced thermal imaging.

When the layers constituting the hole transport region, the emission layer, and the layers constituting the electron transport region are each formed by vacuum deposition, the vacuum deposition may be performed at a deposition temperature in a range of about 100° C. to about 500° C. at a vacuum pressure in a range of about $10^{-8}$ torr to about $10^{-3}$ torr, and at a deposition rate in a range of about 0.01 Angstroms per second (Å/sec) to about 100 Å/sec, depending on the material to be included in each layer and the structure of each layer to be formed.

When the layers constituting the hole transport region, the emission layer, and the layers constituting the electron transport region are each formed by spin coating, the spin coating may be performed at a coating rate of about 2,000 revolutions per minute (rpm) to about 5,000 rpm and at a heat treatment temperature of about 80° C. to about 200° C., depending on the material to be included in each layer and the structure of each layer to be formed.

General Definitions of Substituents

The term "$C_3$-$C_{60}$ carbocyclic group" as used herein refers to a cyclic group consisting of carbon atoms only and having 3 to 60 carbon atoms. The term "$C_1$-$C_{60}$ heterocyclic group" as used herein refers to a cyclic group having 1 to 60 carbon atoms in addition to a heteroatom other than carbon atoms. The $C_3$-$C_{60}$ carbocyclic group and the $C_1$-$C_{60}$ heterocyclic group may each be a monocyclic group consisting of one ring or a polycyclic group in which at least two rings are condensed. For example, the number of ring-forming atoms in the $C_1$-$C_{60}$ heterocyclic group may be in a range of 3 to 61.

The term "cyclic group" as used herein may include the $C_3$-$C_{60}$ carbocyclic group and the $C_1$-$C_{60}$ heterocyclic group.

The term "π electron-rich $C_3$-$C_{60}$ cyclic group" refers to a cyclic group having 3 to 60 carbon atoms and not including *—N=*' as a ring-forming moiety. The term "π electron-deficient nitrogen-containing $C_1$-$C_{60}$ cyclic group" as used herein refers to a heterocyclic group having 1 to 60 carbon atoms and *—N=*' as a ring-forming moiety.

In some embodiments,
the $C_3$-$C_{60}$ carbocyclic group may be i) a T1 group or ii) a group in which at least two T1 groups are condensed (for example, a cyclopentadiene group, an adamantane group, a norbornane group, a benzene group, a pentalene group, a naphthalene group, an azulene group, an indacene group, an acenaphthylene group, a phenalene group, a phenanthrene group, an anthracene group, a fluoranthene group, a triphenylene group, a pyrene group, a chrysene group, a perylene group, a pentaphene group, a heptalene group, a naphthacene group, a picene group, a hexacene group, a pentacene group, a rubicene group, a coronene group, an ovalene group, an indene group, a fluorene group, a spiro-bifluorene group, a benzofluorene group, an indenophenanthrene group, or an indenoanthracene group), the $C_1$-$C_{60}$ heterocyclic group may be i) a T2 group, ii) a group in which at least two T2 groups are condensed, or iii) a group in which at least one T2 group is condensed with at least one T1 group (for example, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonapthothiophene group, a benzonaphthosilole group, a benzofurodibenzofuran group, a benzofurodibenzothiophene group, a benzothienodibenzothiophene group, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, and the like), the π electron-rich $C_3$-$C_{60}$ cyclic group may be i) a T1 group, ii) a condensed group in which at least two T1 groups are condensed, iii) a T3 group, iv) a condensed group in which at least two T3 groups are condensed, or v) a condensed group in which at least one T3 group is condensed with at least one T1 group (for example, a $C_3$-$C_{60}$ carbocyclic group, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonapthothiophene group, a benzonaphthosilole group, a benzofurodibenzofuran group, a benzofurodibenzothiophene group, a benzothienodibenzothiophene group, and the like), and the π electron-deficient nitrogen-containing $C_1$-$C_{60}$ cyclic group may be i) a T4 group, ii) a group in which at least twos T4 groups are condensed, iii) a group in which at least one T4 group is condensed with at least one T1 group, iv) a group in which at least one T4 group is condensed with at least one T3 group, or v) a group in which at least one T4 group, at least one T1 group, and at least one T3 group are condensed (for example, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, and the like), wherein the T1 group may be a cyclopropane group, a cyclobutane group, a cyclopentane group, a cyclohexane group, a cycloheptane group, a cyclooctane group, a cyclobutene group, a cyclopentene group, a cyclopentadiene group, a cyclohexene group, a cyclohexadiene group, a cycloheptene group, an adamantane group, a norbornane (or bicyclo[2.2.1]heptane) group, a norbornene group, a bicyclo[1.1.1]pentane group, a bicyclo[2.1.1]hexane group, a bicyclo[2.2.2]octane group, or a benzene group, the T2 group may be a furan group, a thiophene group, a 1H-pyrrole group, a silole group, a borole group, a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group, the T3 group may be a furan group, a thiophene group, a 1H-pyrrole group, a silole group, or a borole group, and the T4 group may be a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group.

The term "cyclic group", "$C_3$-$C_{60}$ carbocyclic group", "$C_1$-$C_{60}$ heterocyclic group", "π electron-rich $C_3$-$C_{60}$ cyclic group", or "π electron-deficient nitrogen-containing $C_1$-$C_{60}$ cyclic group" as used herein may be a group condensed with any suitable cyclic group, a monovalent group, or a polyvalent group (e.g., a divalent group, a trivalent group, a quadvalent group, or the like), depending on the structure of the formula to which the term is applied. For example, a "benzene group" may be a benzo group, a phenyl group, a phenylene group, or the like, and this may be understood by one of ordinary skill in the art, depending on the structure of the formula including the "benzene group".

Examples of the monovalent $C_3$-$C_{60}$ carbocyclic group and the monovalent $C_1$-$C_{60}$ heterocyclic group may include a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group. Examples of the divalent $C_3$-$C_{60}$ carbocyclic group and the monovalent $C_1$-$C_{60}$ heterocyclic group may include a $C_3$-$C_{10}$ cycloalkylene group, a heterocycloalkylene group, a $C_3$-$C_{10}$ cycloalkenylene group, a $C_1$-$C_{10}$ heterocycloalkenylene group, a $C_6$-$C_{60}$ arylene group, a $C_1$-$C_{60}$ heteroarylene group, a divalent non-aromatic condensed polycyclic group, and a substituted or unsubstituted divalent non-aromatic condensed heteropolycyclic group.

The term "$C_1$-$C_{60}$ alkyl group" as used herein refers to a linear or branched aliphatic hydrocarbon monovalent group having 1 to 60 carbon atoms, and examples thereof include a methyl group, an ethyl group, an n-propyl group, an iso-propyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group, and a tert-decyl group. The term "$C_1$-$C_{60}$ alkylene group" as used herein refers to a divalent group having the same structure as the $C_1$-$C_{60}$ alkyl group.

The term "$C_2$-$C_{60}$ alkenyl group" as used herein refers to a hydrocarbon group having at least one carbon-carbon double bond in the middle or at the terminus of the $C_2$-$C_{60}$ alkyl group. Examples thereof include an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a monovalent hydrocarbon group having at least one carbon-carbon triple bond in the middle or at the terminus of the $C_2$-$C_{60}$ alkyl group. Examples thereof include an ethynyl group and a propynyl group. The term "$C_2$-$C_{60}$ alkynylene group" as used herein refers to a divalent group having the same structure as the $C_2$-$C_{60}$ alkynyl group.

The term "$C_1$-$C_{60}$ alkoxy group" as used herein refers to a monovalent group represented by —$OA_{101}$ (wherein $A_{101}$ is a $C_1$-$C_1$ alkyl group). Examples thereof include a methoxy group, an ethoxy group, and an isopropyloxy group.

The term "$C_3$-$C_{10}$ cycloalkyl group" as used herein refers to a monovalent saturated hydrocarbon monocyclic group including 3 to 10 carbon atoms. Examples of the $C_3$-$C_{10}$ cycloalkyl group as used herein include a cyclopropyl group, a cyclobutyl group, a cyclopentyl group, a cyclohexyl group, a cycloheptyl group, a cyclooctyl group, an adamantanyl group, a norbornanyl (bicyclo[2.2.1]heptyl) group, a bicyclo[1.1.1]pentyl group, a bicyclo[2.1.1]hexyl group, or a bicyclo[2.2.2]octyl group. The term "$C_3$-$C_{10}$ cycloalkylene group" as used herein refers to a divalent group having the same structure as the $C_3$-$C_{10}$ cycloalkyl group.

The term "$C_1$-$C_{10}$ heterocycloalkyl group" as used herein refers to a monovalent cyclic group including at least one heteroatom other than carbon atoms as a ring-forming atom and having 1 to 10 carbon atoms. Examples thereof include a 1,2,3,4-oxatriazolidinyl group, a tetrahydrofuranyl group, and a tetrahydrothiophenyl group. The term "$C_1$-$C_{10}$ heterocycloalkylene group" as used herein refers to a divalent group having the same structure as the $C_1$-$C_{10}$ heterocycloalkyl group.

The term "$C_3$-$C_{10}$ cycloalkenyl group" as used herein refers to a monovalent cyclic group that has 3 to 10 carbon atoms and at least one carbon-carbon double bond in its ring, and is not aromatic. Examples thereof include a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent cyclic group including at least one heteroatom other than carbon atoms as a ring-forming atom, 1 to 10 carbon atoms, and at least one double bond in its ring. Examples of the $C_1$-$C_{10}$ heterocycloalkenyl group include a 4,5-dihydro-1,2,3,4-oxatriazolyl group, a 2,3-dihydrofuranyl group, and a 2,3-dihydrothiophenyl group. The term "$C_1$-$C_{10}$ heterocycloalkylene group" as used herein refers to a divalent group having the same structure as the $C_1$-$C_{10}$ heterocycloalkyl group.

The term "$C_6$-$C_{60}$ aryl group" as used herein refers to a monovalent group having a carbocyclic aromatic system having 6 to 6 carbon atoms. The term "$C_6$-$C_{60}$ arylene group" as used herein refers to a divalent group having a carbocyclic aromatic system having 6 to 60 carbon atoms. Examples of the $C_6$-$C_{60}$ aryl group include a phenyl group, a pentalenyl group, a naphthyl group, an azulenyl group, an indacenyl group, an acenaphthyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a heptalenyl group, a naphthacenyl group, a picenyl group, a hexacenyl group, a pentacenyl group, a rubicenyl group, a coronenyl group, and an ovalenyl group. When the $C_6$-$C_{60}$ aryl group and the $C_6$-$C_{60}$ arylene group each independently include two or more rings, the respective rings may be fused.

The term "$C_1$-$C_{60}$ heteroaryl group" as used herein refers to a monovalent group having a heterocyclic aromatic system further including at least one heteroatom other than carbon atoms as a ring-forming atom and 1 to 60 carbon atoms. The term "$C_1$-$C_{60}$ heteroarylene group" as used herein refers to a divalent group having a heterocyclic aromatic system further including at least one heteroatom other than carbon atoms as a ring-forming atom and 1 to 60 carbon atoms. Examples of the $C_1$-$C_{60}$ heteroaryl group include a pyridinyl group, a pyrimidinyl group, a pyrazinyl group, a pyridazinyl group, a triazinyl group, a quinolinyl group, a benzoquinolinyl group, an isoquinolinyl group, a benzoisoquinolinyl group, a quinoxalinyl group, a benzoquinoxalinyl group, a quinazolinyl group, a benzoquinazolinyl group, a cinnolinyl group, a phenanthrolinyl group, a phthalazinyl group, and a naphthyridinyl group. When the $C_1$-$C_{60}$ heteroaryl group and the $C_1$-$C_{60}$ heteroarylene group each independently include two or more rings, the respective rings may be fused.

The term "monovalent non-aromatic condensed polycyclic group" as used herein refers to a monovalent group that has two or more rings condensed and only carbon atoms as ring forming atoms (e.g., 8 to 60 carbon atoms), wherein the entire molecular structure is non-aromatic. Examples of the monovalent non-aromatic condensed polycyclic group include an indenyl group, a fluorenyl group, a spiro-bifluorenyl group, a benzofluorenyl group, an indenophenanthrenyl group, and an indenoanthracenyl group. The term "divalent non-aromatic condensed polycyclic group" as used herein refers to a divalent group having substantially the same structure as the monovalent non-aromatic condensed polycyclic group.

The term "monovalent non-aromatic condensed heteropolycyclic group" as used herein refers to a monovalent group that has two or more condensed rings and at least one heteroatom other than carbon atoms (e.g., 1 to 60 carbon atoms), as a ring-forming atom, wherein the entire molecular structure is non-aromatic. Examples of the monovalent non-aromatic condensed heteropolycyclic group include a pyrrolyl group, a thiophenyl group, a furanyl group, an indolyl group, a benzoindolyl group, a naphthoindolyl group, an isoindolyl group, a benzoisoindolyl group, a naphthoisoindolyl group, a benzosilolyl group, a benzothiophenyl group, a benzofuranyl group, a carbazolyl group, a dibenzosilolyl group, a dibenzothiophenyl group, a dibenzofuranyl group, an azacarbazolyl group, an azafluorenyl group, an azadibenzosilolyl group, an azadibenzothiophenyl group, an azadibenzofuranyl group, a pyrazolyl group, an imidazolyl group, a triazolyl group, a tetrazolyl group, an oxazolyl group, an isoxazolyl group, a thiazolyl group, an isothiazolyl group, an oxadiazolyl group, a thiadiazolyl group, a benzopyrazolyl group, a benzimidazolyl group, a benzoxazolyl group, a benzothiazolyl group, a benzooxadiazolyl group, a benzothiadiazolyl group, an imidazopyridinyl group, an imidazopyrimidinyl group, an imidazotriazinyl group, an imidazopyrazinyl group, an imidazopyridazinyl group, an indenocarbazolyl group, an indolocarbazolyl group, a benzofurocarbazolyl group, a benzothienocarbazolyl group, a benzosilolocarbazolyl group, a benzoindolocarbazolyl group, a benzocarbazolyl group, a benzonaphthofuranyl group, a benzonaphthothiophenyl group, a benzonaphthosilolyl group, a benzofurodibenzofuranyl group, a benzofurodibenzothiophenyl group, and a benzothienodibenzothiophenyl group. The term "divalent non-aromatic condensed heteropolycyclic group" as used herein refers to a divalent group having substantially the same structure as the monovalent non-aromatic condensed heteropolycyclic group.

The term "$C_6$-$C_{60}$ aryloxy group" as used herein is represented by —$OA_{102}$ (wherein $A_{102}$ is the $C_6$-$C_{60}$ aryl group). The term "$C_6$-$C_{60}$ arylthio group" as used herein is represented by —$SA_{103}$ (wherein $A_{103}$ is the $C_6$-$C_{60}$ aryl group).

The term "$R_{10a}$" as used herein may be:
deuterium (-D), —F, —Cl, —Br, —I, a hydroxyl group, a cyano group, or a nitro group;
a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or any combination thereof;
a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or any combination thereof; or
—Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$).

$Q_1$ to $Q_3$, $Q_{11}$ to $Q_{13}$, $Q_{21}$ to $Q_{23}$, and $Q_{31}$ to $Q_{33}$ may each independently be hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, or a biphenyl group.

The term "heteroatom" as used herein refers to any atom other than a carbon atom. Examples of the heteroatom may include O, S, N, P, Si, B, Ge, Se, Te, or any combination thereof.

"Ph" used herein represents a phenyl group, "Me" used herein represents a methyl group, "Et" used herein represents an ethyl group, "ter-Bu" or "Bu$^t$" used herein represents a tert-butyl group, and "OMe" used herein represents a methoxy group.

The term "biphenyl group" as used herein refers to a phenyl group substituted with at least one phenyl group. The "biphenyl group" belongs to "a substituted phenyl group" having a "$C_6$-$C_{60}$ aryl group" as a substituent.

The term "terphenyl group" as used herein refers to a phenyl group substituted with at least one phenyl group. The "terphenyl group" belongs to "a substituted phenyl group" having a "$C_6$-$C_{60}$ aryl group substituted with a $C_6$-$C_{60}$ aryl group" as a substituent.

The symbols * and *' as used herein, unless defined otherwise, refer to a binding site to an adjacent atom in a corresponding formula.

Hereinafter, compounds and a light-emitting device according to one or more embodiments will be described in more detail with reference to Synthesis Examples and Examples. The wording "B was used instead of A" used in describing Synthesis Examples means that an amount of B used was identical to an amount of A used in terms of molar equivalents.

EXAMPLES (1) Synthesis of Phosphorescent Dopant P26

1) Synthesis Method 1

0.84 g (1.0 mmol) of L1 and 0.5 mmol of Ag$_2$O were suspended in 1,2-dichloroethane. After stirring the reaction mixture for 20 hours at room temperature, the solvent was removed therefrom, and 1.1 mmol of Pt(COD)Cl$_2$ and 1,2-dichlorobenzene were added thereto, followed by stirring at a temperature of 190° C. for 3 days. Once the reaction was complete, the mixture was allowed to cool to room temperature. Then, 100 mL of distilled water was added thereto, and an organic layer was extracted using ethyl acetate. The extracted organic layer was washed with saturated sodium chloride aqueous solution, followed by drying with sodium sulfate. The residue from which the solvent was removed was separated by column chromatography to thereby obtain Compound PD26. (yield: 12%)

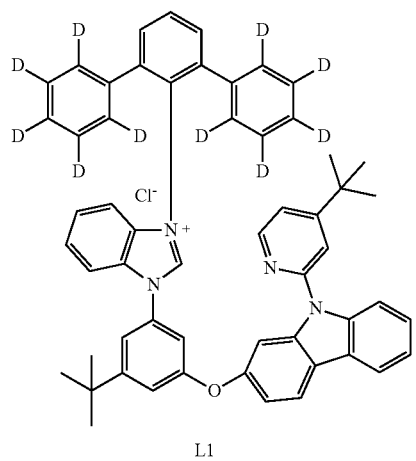

L1

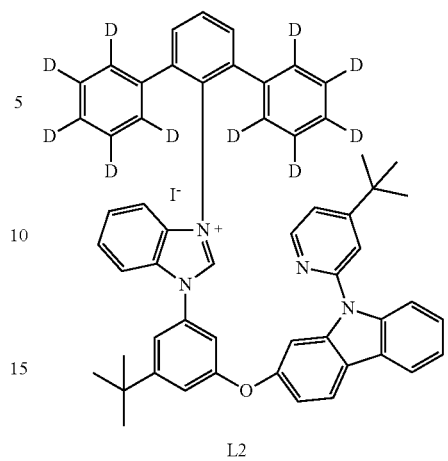

L2

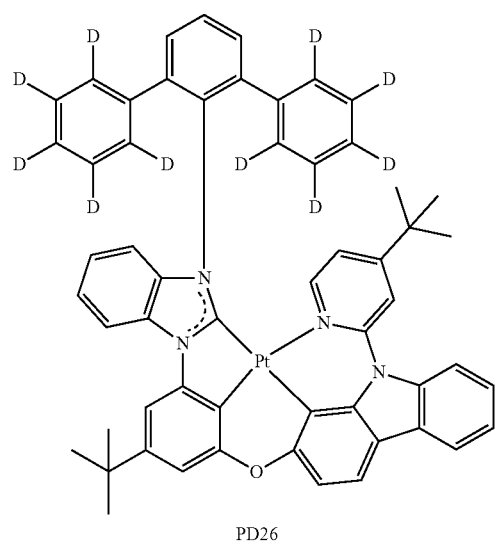

PD26

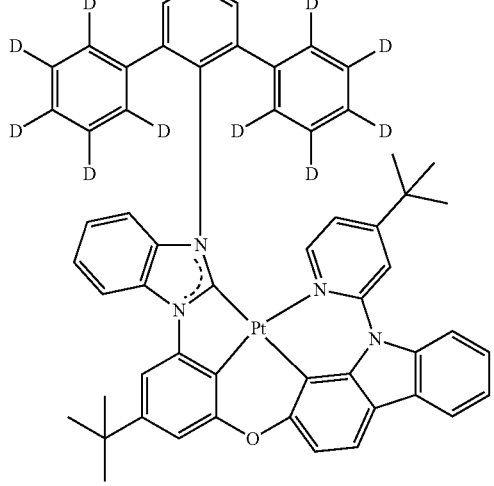

PD26

Purification of Phosphorescent Dopant

A) PD26 was purified by column chromatography and subjected to sublimation. Then, by inductively coupled plasma (ICP-MS) analysis, the results of 1.3 ppm of F, 42.9 ppm of Cl, and 0.0 ppm of Br were obtained. (PD26-A)

B) 1.0 mmol of PD26-A, 5.0 eq. of Ag$_2$O, 5.0 eq. of EtOH, and 10 mL of 1,2-dichloroethane were stirred together for 4 hours, and then, the amount of impurities included in the dopant was identified after purification by column chromatography and sublimation. As a result of ICP-MS analysis, the results of 0.8 ppm of F, 25.1 ppm of Cl, and 0.0 ppm of Br were obtained. (PD26-B)

2) Synthesis Method 2

The desired compound was obtained in substantially the same manner as in Synthesis Method 1, except that L2 was used instead of L1. (yield: 17%)

Purification of Phosphorescent Dopant

C) 1.0 mmol of PD26 was separated through column chromatography, 5.0 eq. of Ag$_2$O, 5.0 eq. of EtOH, and 10 mL of tetrahydrofuran (THF) were stirred together for 4 hours, and then, the amount of impurities included in the dopant was identified after purification by column chromatography and sublimation. As a result of ICP-MS analysis, the results of 0.9 ppm of F, 9.8 ppm of Cl, and 0.0 ppm of Br were obtained. (PD26-C)

3) Synthesis Method 3

0.84 g (1.0 mmol) of L3, 1.1 mmol of Pt(COD)Cl$_2$, 2.0 mmol of NaOAc, and 10 mL of 1,4-dioxane were added together, followed by stirring at a temperature of 120° C. for 4 days to thereby prepare Compound PD26. (yield: 60%)

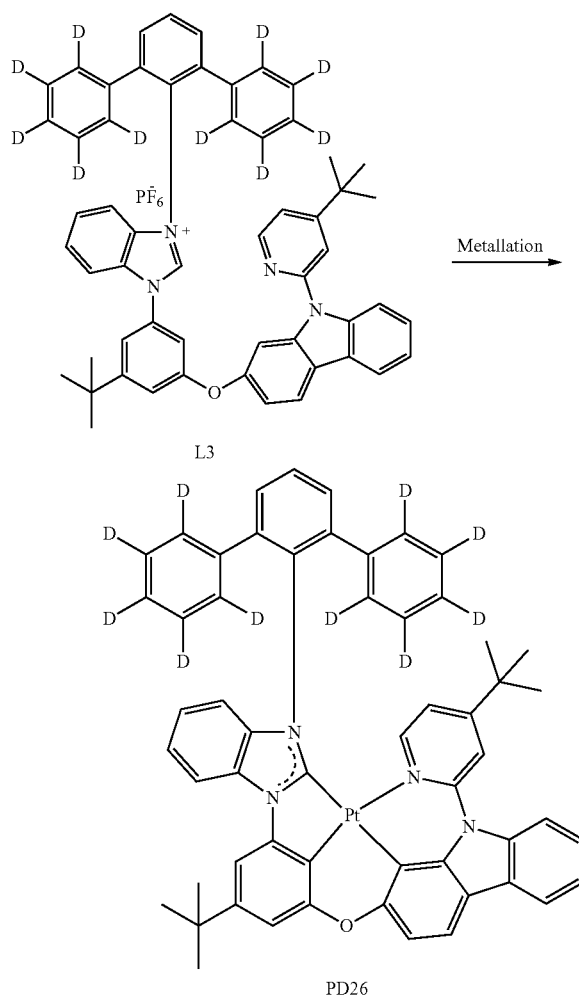

L3

PD26

Purification of Phosphorescent Dopant

PD26 was purified by column chromatography and sublimation, and as a result of ICP-MS analysis, 3.7 ppm of F, 15.7 ppm of Cl, and 0.0 ppm of Br were obtained. (PD26-D)

D) 1.0 mmol of PD26-D, 5.0 eq. of $Ag_2O$, 5.0 eq. of EtOH, and 20 mL of toluene were stirred together for 4 hours, and then, the amount of impurities included in the dopant was identified after purification by column chromatography and sublimation. As a result of ICP-MS analysis, the results of 1.1 ppm of F, 6.1 ppm of Cl, and 0.0 ppm of Br were obtained. (PD26-E)

4) Synthesis Method 4

The desired compound was obtained in substantially the same manner as in Synthesis Method 1, except that L3 was used instead of L1. (yield: 27%)

Purification of Phosphorescent Dopant

D) 1.0 mmol of PD26 that was purified by column chromatography, 5.0 eq. of $Ag_2O$, 5.0 eq. of EtOH, and 20 mL of toluene were stirred together for 4 hours, and then, the amount of impurities included in the dopant was identified after purification by column chromatography and sublimation. As a result of ICP-MS analysis, the results of 2.1 ppm of F, 7.7 ppm of Cl, and 0.0 ppm of Br were obtained. (PD26-F).

ICP analysis results on phosphorescent dopants PD26 purified using the purification method in the related art (A) and the method according to one or more embodiments (B to D) are shown in Table 1.

TABLE 1

| Preparation of phosphorescent dopant | Preparation method | Compound | ICP analysis results (ppm) | | |
|---|---|---|---|---|---|
| | | | F | Cl | Br |
| 1) X = Cl | A | PD26-A | 1.3 | 42.9 | 0.0 |
| | B | PD26-B | 0.8 | 25.1 | 0.0 |
| 2) X = I | C | PD26-C | 0.9 | 9.8 | 0.0 |
| 3) X = $PF_6$ | A | PD26-D | 3.7 | 15.7 | 0.0 |
| | D | PD26-E | 1.1 | 6.1 | 0.0 |
| 4) X = $PF_6$ | D | PD26-F | 2.1 | 7.7 | 0.0 |

Referring to the results shown in Table 1, the phosphorescent dopants purified according to the method according to one or more embodiments (B to D) were found to have low total halide amounts of less than about 40 ppm, as compared with the phosphorescent dopants purified according to the purification method (A) in the related art. In particular, in the case of the method (D), the total halide amount is less than 10 ppm, which is significantly improved.

(2) Synthesis of Phosphorescent Dopant PD27

The desired compound was obtained in substantially the same manner as in Synthesis Method 3, except that L4 was used instead of L3. (yield: 32%)

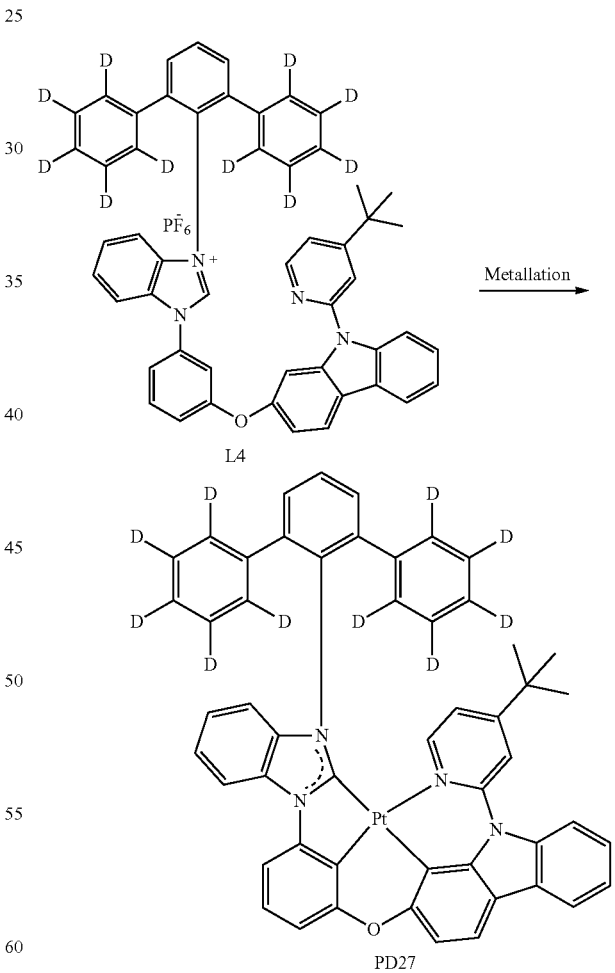

L4

PD27

Purification of Phosphorescent Dopant

A) PD27 was separated through column chromatography and sublimation, and as a result of ICP-MS analysis, 2.3 ppm of F, 20.1 ppm of Cl, and 0.0 ppm of Br were obtained. (PD27-A)

D) 1.0 mmol of PD27-A, 5.0 eq. of Ag$_2$O, 5.0 eq. of EtOH, and 20 mL of toluene were stirred together for 4 hours, and then, the amount of impurities included in the dopant was identified using purification by column chromatography and sublimation. As a result of ICP-MS analysis, the results of 1.3 ppm of F, 5.2 ppm of Cl, and 0.0 ppm of Br were obtained. (PD27-B)

(2) Synthesis of Phosphorescent Dopant PD28

The desired compound was obtained in substantially the same manner as in Synthesis Method 3, except that L5 was used instead of L3. (yield: 28%)

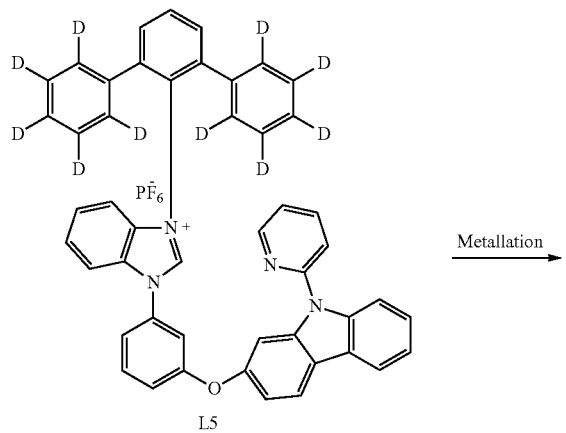

L5

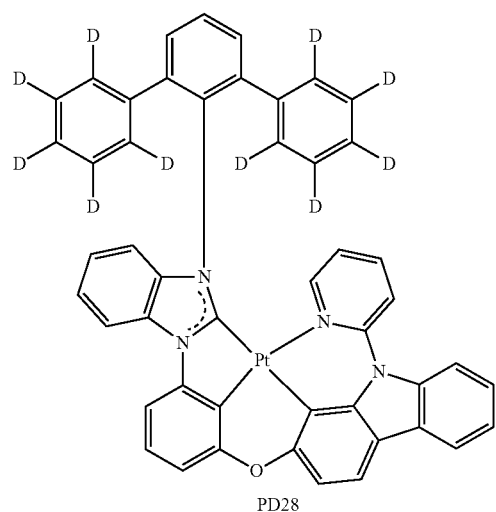

PD28

Purification of Phosphorescent Dopant

A) PD28 was separated through column chromatography and sublimation, and as a result of ICP-MS analysis, 2.7 ppm of F, 31.5 ppm of Cl, and 0.0 ppm of Br were obtained (PD28-A).

D) 1.0 mmol of PD28-A, 5.0 eq. of Ag$_2$O, 5.0 eq. of EtOH, and 20 mL of toluene were stirred together for 4 hours, and then, the amount of impurities included in the dopant was identified after purification by column chromatography and sublimation. As a result of ICP-MS analysis, the results of 1.9 ppm of F, 7.1 ppm of Cl, and 0.0 ppm of Br were obtained (PD28-B).

ICP analysis results on phosphorescent dopants PD27 and PD28 purified using the purification method in the related art (A) and the method according to one or more embodiments (D) are shown in Table 2.

TABLE 2

| Preparation of phosphorescent dopant | Preparation method | Compound | ICP analysis results (ppm) | | |
|---|---|---|---|---|---|
| | | | F | Cl | Br |
| 5) X = PF$_6$ | A | PD27-A | 2.3 | 20.1 | 0.0 |
| | D | PD27-B | 1.3 | 5.2 | 0.0 |
| 6) X = PF$_6$ | A | PD28-A | 2.7 | 31.5 | 0.0 |
| | D | PD28-B | 1.9 | 7.1 | 0.0 |

Referring to the results shown in Table 2, the phosphorescent dopant purified according to the method according to one or more embodiments (D) was found to have a significantly low total halide amount, as compared with the phosphorescent dopants purified according to the purification method (A) in the related art.

Manufacture of Light-Emitting Device

Comparative Example 1

A Corning 15 Ohms per square centimeter ($\Omega$/cm$^2$) (1,200 Å) ITO glass substrate was cut to a size of 50 millimeters (mm)×50 mm×0.7 mm, sonicated in isopropyl alcohol and pure water for 5 minutes in each solvent, and cleaned by exposure to ultraviolet rays with ozone to use the glass substrate as an anode. Then, the glass substrate was mounted to a vacuum-deposition apparatus.

2-TNATA was vacuum-deposited on the glass substrate to form a hole injection layer having a thickness of 600 Å. Then, 4,4'-bis[N-(1-naphthyl)-N-phenylamino]biphenyl (hereinafter referred to as "NPB") as a hole transporting compound was vacuum-deposited on the hole injection layer to form a hole transport layer having a thickness of 300 Å.

Compound PD26-A as a phosphorescent dopant 10% and ETH66:HTH29 at a weight ratio of 3:7 as a mixed host were on co-deposited on the hole transport layer to form a blue fluorescent emission layer having a thickness of 400 Å.

Subsequently, ETH2 was vacuum-deposited at a thickness of 50 Å to form a hole blocking layer. Subsequently, Alq3 was deposited on the emission layer to form an electron transport layer having a thickness of 300 Å. Subsequently, LiF, which is halogenated alkali metal, was deposited on the electron transport layer to form an electron injection layer having a thickness of 10 Å. Finally, Al was vacuum-deposited on the electron injection layer to form a cathode having a thickness of 3,000 Å to form a LiF/Al electrode, thereby completing the manufacture of an organic light-emitting device.

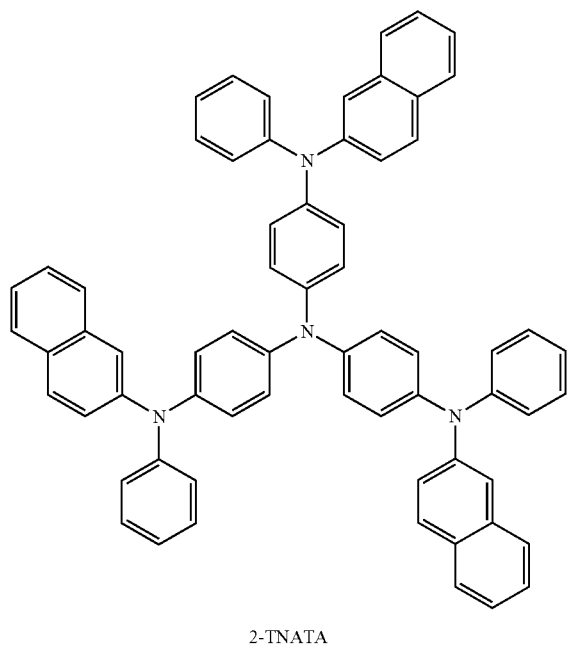

2-TNATA

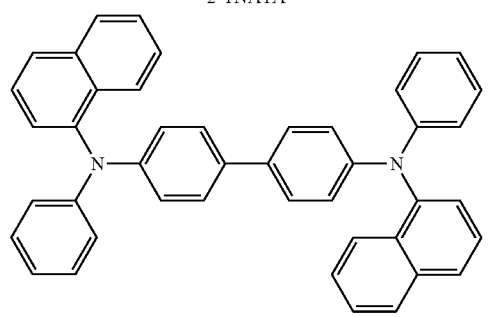

NPB

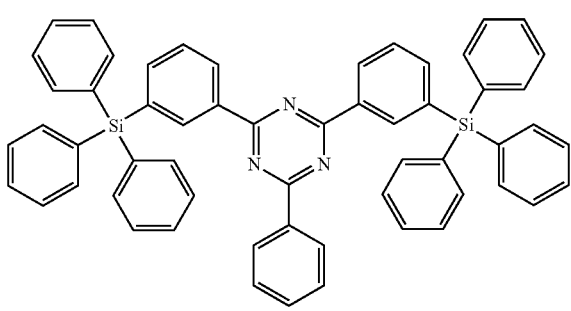

ETH2

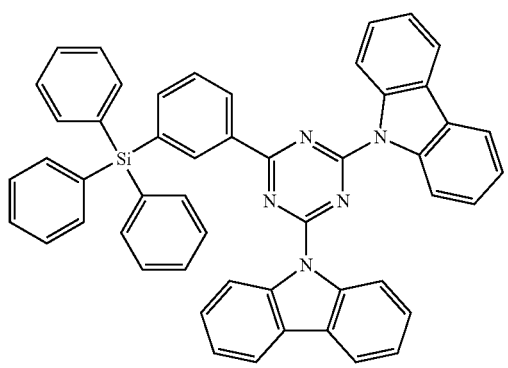

ETH66

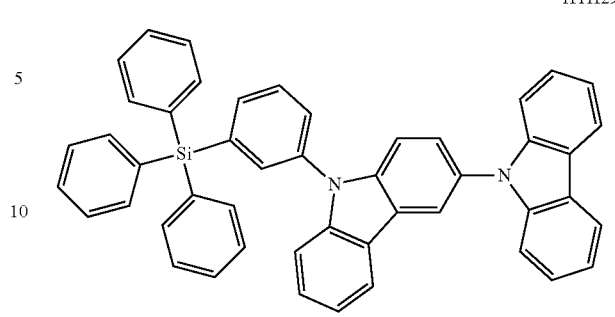

HTH29

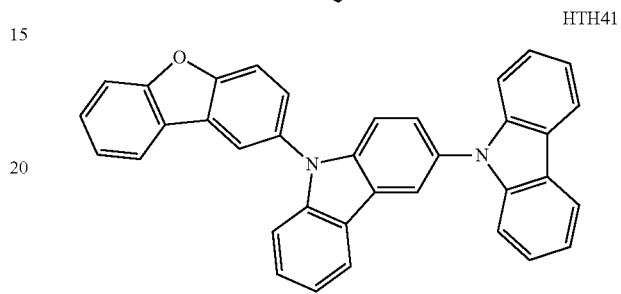

HTH41

Example 1

A light-emitting device was manufactured in substantially the same manner as in Comparative Example 1, except that PD26-B was used instead of PD26-A as a dopant in forming an emission layer.

Example 2

A light-emitting device was manufactured in substantially the same manner as in Comparative Example 1, except that PD26-C was used instead of PD26-A as a dopant in forming an emission layer.

Example 3

A light-emitting device was manufactured in substantially the same manner as in Comparative Example 1, except that PD26-E was used instead of PD26-A as a dopant in forming an emission layer.

Comparative Example 2

A light-emitting device was manufactured in substantially the same manner as in Comparative Example 1, except that PD27-A was used instead of PD26-A as a dopant in forming an emission layer.

Example 4

A light-emitting device was manufactured in substantially the same manner as in Comparative Example 2, except that PD27-B was used instead of PD27-A as a dopant in forming an emission layer.

Comparative Example 3

A light-emitting device was manufactured in substantially the same manner as in Comparative Example 1, except that PD28-A was used instead of PD26-A as a dopant in forming an emission layer.

Example 5

A light-emitting device was manufactured in substantially the same manner as in Comparative Example 3, except that PD28-B was used instead of PD28-A as a dopant in forming an emission layer.

To evaluate characteristics of the light-emitting devices manufactured in Comparative Examples 1, 2, and 3 and Examples 1 to 5, the driving voltage, efficiency, and lifespan of the light-emitting devices were measured at a current density of 10 mA/cm$^2$.

The driving voltage and the current density of the light-emitting devices were measured using a source meter (Keithley Instrument, 2400 series). The efficiency of the light-emitting devices were measured using Hammamastu Absolute PL Measurement System C9920-2-12.

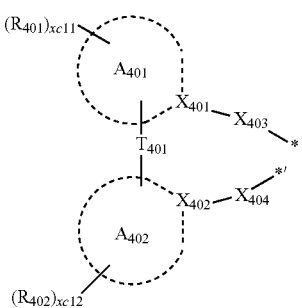

Formula 402

TABLE 3

|  | Dopant | Luminance (cd/m$^2$) | Driving voltage (V) | CIE$_{(x, y)}$ | Efficiency (cd/A) | Maximum emission wavelength (nm) | Lifespan (T95, hr) |
| --- | --- | --- | --- | --- | --- | --- | --- |
| Comparative Example 1 | PD26-A | 1000 | 5.7 | (0.14, 0.23) | 25.5 | 468 | 57 |
| Example 1 | PD26-B | 1000 | 5.7 | (0.14, 0.23) | 25.5 | 468 | 78 |
| Example 2 | PD26-C | 1000 | 5.6 | (0.14, 0.23) | 25.3 | 468 | 150 |
| Example 3 | PD26-E | 1000 | 5.6 | (0.14, 0.22) | 25.9 | 467 | 192 |
| Comparative Example 2 | PD27-A | 1000 | 5.3 | (0.13, 0.16) | 21.7 | 462 | 65 |
| Example 4 | PD27-B | 1000 | 5.3 | (0.13, 0.16) | 21.6 | 462 | 175 |
| Comparative Example 3 | PD28-A | 1000 | 5.5 | (0.13, 0.19) | 23.6 | 465 | 54 |
| Example 5 | PD28-B | 1000 | 5.5 | (0.13, 0.19) | 23.8 | 465 | 122 |

As shown in Table 3, the light-emitting devices of Examples 1 to 5 were found to have significantly improved lifespan, as compared with the light-emitting devices of Comparative Examples 1 to 3.

As apparent from the foregoing description, a halide remaining in a phosphorescent dopant as impurities may be reduced to less than about 40 ppm, for example, less than about 10 ppm, by the method of purifying the phosphorescent dopant, and a light-emitting device including such a purified phosphorescent dopant may have significantly improved lifespan.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A method of purifying a phosphorescent dopant, the method comprising reacting the phosphorescent dopant with Ag2O, wherein the phosphorescent dopant comprises an organometallic complex represented by Formula 401:

$$M(L_{401})_{xc1}(L_{402})_{xc2}$$ Formula 401 wherein, in Formulae 401 and 402,

M is a transition metal (e.g., iridium (Ir), platinum (Pt), palladium (Pd), osmium (Os), titanium (Ti), gold (Au), hafnium (Hf), europium (Eu), terbium (Tb), rhodium (Rh), rhenium (Re), or thulium (Tm)), $L_{401}$ is a ligand represented by Formula 402, and xc1 is 1, 2, or 3, and when xc1 is 2 or greater, at least two $L_{401}$(s) are identical to or different from each other, $L_{402}$ is an organic ligand, and xc2 is an integer from 0 to 4, and when xc2 is 2 or greater, at least two $L_{402}$(s) are identical to or different from each other, $X_{401}$ and $X_{402}$ are each independently nitrogen or carbon, ring $A_{401}$ and ring $A_{402}$ are each independently a $C_3$-$C_{60}$ carbocyclic group or a $C_1$-$C_{60}$ heterocyclic group, $T_{401}$ is a single bond, —O—, —S—, —C(=O)—, —N($Q_{411}$)-, —C($Q_{411}$) ($Q_{412}$)-, —C($Q_{411}$)=C($Q_{412}$)-, C($Q_{411}$)=, or =C($Q_{411}$)=, $X_{403}$ and $X_{404}$ are each independently a chemical bond (e.g., a covalent bond or a coordinate bond), O, S, N($Q_{413}$), B($Q_{413}$), P($Q_{413}$), C($Q_{413}$)($Q_{414}$), or Si($Q_{413}$) ($Q_{414}$), $Q_{411}$ to $Q_{414}$ are each understood by referring to the description of $Q_1$ provided herein, $R_{401}$ and $R_{402}$ are each independently hydrogen, deuterium, —F, —Cl, —Br, —I, a hydroxyl group, a cyano group, a nitro group, a $C_1$-$C_{20}$ alkyl group unsubstituted or substituted with at least one $R_{10a}$, a $C_1$-$C_{20}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{401}$) ($Q_{402}$) ($Q_{403}$), —N($Q_{401}$) ($Q_{402}$), —B($Q_{401}$) ($Q_{402}$), —C(=O)($Q_{401}$), —S(=O)$_2$($Q_{401}$), or —P(=O)($Q_{401}$) ($Q_{402}$), $Q_{401}$ to $Q_{403}$ are each understood by referring to the description of $Q_1$ provided herein, xc11 and xc12 are each independently an integer from 0 to 10, and

** and *' in Formula 402 each indicate a binding site to M in Formula 401.

2. The method of claim 1, further comprising purifying the phosphorescent dopant by column chromatography, prior to the reacting.

3. The method of claim 1, further comprising purifying the phosphorescent dopant by column chromatography, recrystallization, sublimation, or a combination thereof after the reacting.

4. The method of claim 1, wherein the phosphorescent dopant is a compound comprising a transition metal and a ligand, and the ligand is an organic ligand.

5. The method of claim 4, wherein the ligand is a monodentate ligand, a bidentate ligand, or a tetradentate ligand.

6. The method of claim 4, wherein the transition metal is iridium (Ir), platinum (Pt), palladium (Pd), osmium (Os), titanium (Ti), gold (Au), hafnium (Hf), europium (Eu), terbium (Tb), rhodium (Rh), rhenium (Re), or thulium (Tm).

7. The method of claim 1, wherein the phosphorescent dopant comprises having 40 parts per million (ppm) or greater of halide impurities.

8. The method of claim 7, wherein the halide is F—, Cl—, Br—, and/or I—.

9. The method of claim 1, wherein the phosphorescent dopant comprises a halide as an impurity, wherein the halide is reduced to less than about 40 ppm by the reacting of the phosphorescent dopant with Ag2O.

10. The method of claim 1, wherein the reacting of the phosphorescent dopant with Ag2O is performed in a solvent.

11. The method of claim 10, wherein the solvent comprises an alcohol.

12. The method of claim 11, wherein the solvent further comprises an aromatic hydrocarbon derivative, ether, a halogenated alkane, or any combination thereof.

13. The method of claim 10, wherein the solvent comprises: a mixed solvent of an alcohol and an aromatic hydrocarbon derivative; a mixed solvent of an alcohol and ether; a mixed solvent of an alcohol and a halogenated alkane; or any combination thereof.

14. The method of claim 1, wherein the reacting of the phosphorescent dopant with Ag2O is performed at a temperature in a range of about 0° C. to about 90° C.

15. The method of claim 1, wherein the reacting of the phosphorescent dopant with Ag2O is performed for about 10 minutes to about 48 hours.

16. The method of claim 1, further comprising preparation of the phosphorescent dopant by using a transition metal compound comprising at least one halide ligand prior to reacting the phosphorescent dopant with Ag2O.

17. The method of claim 1, wherein a molar ratio of the phosphorescent dopant to Ag2O is in a range of about 1:9 to about 9:1.

18. A light-emitting device comprising the phosphorescent dopant purified according to the method of claim 1.

19. The light-emitting device of claim 18, further comprising an emission layer, wherein the emission layer comprises the phosphorescent dopant, and the total content of a halides as an impurity in the phosphorescent dopant in the emission layer is about 40 ppm or less.

20. An electronic apparatus comprising the light-emitting device of claim 18.

* * * * *